(12) United States Patent
Ishiduki et al.

(10) Patent No.: US 12,389,637 B2
(45) Date of Patent: *Aug. 12, 2025

(54) NONVOLATILE SEMICONDUCTOR MEMORY DEVICE INCLUDING A MEMORY CELL

(71) Applicant: KIOXIA CORPORATION, Tokyo (JP)

(72) Inventors: Megumi Ishiduki, Yokkaichi Mie (JP); Hiroshi Nakaki, Yokkaichi Mie (JP); Takamasa Ito, Nagoya Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/537,954

(22) Filed: Dec. 13, 2023

(65) Prior Publication Data

US 2024/0120395 A1    Apr. 11, 2024

Related U.S. Application Data

(63) Continuation of application No. 17/825,542, filed on May 26, 2022, now Pat. No. 11,888,041, which is a
(Continued)

(30) Foreign Application Priority Data

Mar. 22, 2018 (JP) .................................. 2018-055371

(51) Int. Cl.
*H01L 29/423*    (2006.01)
*H01L 29/66*    (2006.01)
(Continued)

(52) U.S. Cl.
CPC ............ *H10D 30/696* (2025.01); *H10B 43/10* (2023.02); *H10B 43/27* (2023.02); *H10B 43/50* (2023.02);
(Continued)

(58) Field of Classification Search
CPC ......... H01L 29/42344; H01L 29/66833; H01L 29/7926; H01L 21/76895; H01L 23/528;
(Continued)

(56) References Cited

U.S. PATENT DOCUMENTS 9,520,407 B2    12/2016  Fukuzumi et al.
10,797,144 B2 *  10/2020  Ishiduki .............. H01L 29/7926
(Continued)

FOREIGN PATENT DOCUMENTS

JP    2013-120845    6/2013
JP    2015-149413    8/2015

*Primary Examiner* — Patricia D Valenzuela
(74) *Attorney, Agent, or Firm* — Oblon, McClelland, Maier & Neustadt, L.L.P.

(57) ABSTRACT

A semiconductor device includes a base body, a stacked body on the base body and a first columnar part. The base body includes a substrate, a first insulating film on the substrate, a first conductive film on the first insulating film, and a first semiconductor part on the first conductive film. The stacked body includes conductive layers and insulating layers stacked alternately in a stacking direction. The first columnar part is provided inside the stacked body and the first semiconductor part. The first columnar part includes a semiconductor body and a memory film between the semiconductor body and conductive layers. The semiconductor body extends in the stacking direction. The first columnar part has a first diameter and a second diameter in a first direction crossing the stacking direction. The first diameter inside the first semiconductor part is larger than the second diameter inside the stacked body.

20 Claims, 60 Drawing Sheets

Related U.S. Application Data continuation of application No. 17/009,373, filed on Sep. 1, 2020, now Pat. No. 11,380,770, which is a continuation of application No. 16/130,432, filed on Sep. 13, 2018, now Pat. No. 10,797,144.

(51) Int. Cl.
| | |
|---|---|
| *H10B 43/10* | (2023.01) |
| *H10B 43/27* | (2023.01) |
| *H10B 43/50* | (2023.01) |
| *H10D 30/01* | (2025.01) |
| *H10D 30/69* | (2025.01) |
| *H01L 21/768* | (2006.01) |
| *H01L 23/528* | (2006.01) |
| *H10B 41/20* | (2023.01) |
| *H10B 41/27* | (2023.01) |
| *H10B 43/30* | (2023.01) |
| *H10B 43/35* | (2023.01) |
| *H10B 43/40* | (2023.01) |
| *H10B 99/00* | (2023.01) |
| *H10D 84/00* | (2025.01) |

(52) U.S. Cl.
CPC ....... H10D 30/0413 (2025.01); H10D 30/693 (2025.01); *H01L 21/76895* (2013.01); *H01L 23/528* (2013.01); *H10B 41/20* (2023.02); *H10B 41/27* (2023.02); *H10B 43/30* (2023.02); *H10B 43/35* (2023.02); *H10B 43/40* (2023.02); *H10B 99/00* (2023.02); *H10D 84/00* (2025.01)

(58) Field of Classification Search
CPC ......... H01L 27/10; H10B 43/10; H10B 43/27; H10B 43/50; H10B 41/20; H10B 43/30; H10B 43/35; H10B 43/40; H10B 99/00; H10B 41/27

See application file for complete search history.

(56) References Cited

U.S. PATENT DOCUMENTS

| | | | |
|---|---|---|---|
| 2010/0144133 A1 | 6/2010 | Nomura | |
| 2012/0156848 A1* | 6/2012 | Yang | ...................... H10B 43/40 257/E21.597 |
| 2012/0244673 A1* | 9/2012 | Shinohara | ........... H01L 29/7926 257/E21.423 |
| 2013/0003433 A1 | 1/2013 | Hishida | |
| 2013/0126961 A1 | 5/2013 | Fukuzumi | |
| 2016/0260736 A1 | 9/2016 | Fujii | |
| 2016/0365249 A1 | 12/2016 | Nakao | |
| 2017/0077131 A1 | 3/2017 | Konagai et al. | |

* cited by examiner

100aa

FIG. 21A
FIG. 21B
FIG. 21C
FIG. 21D
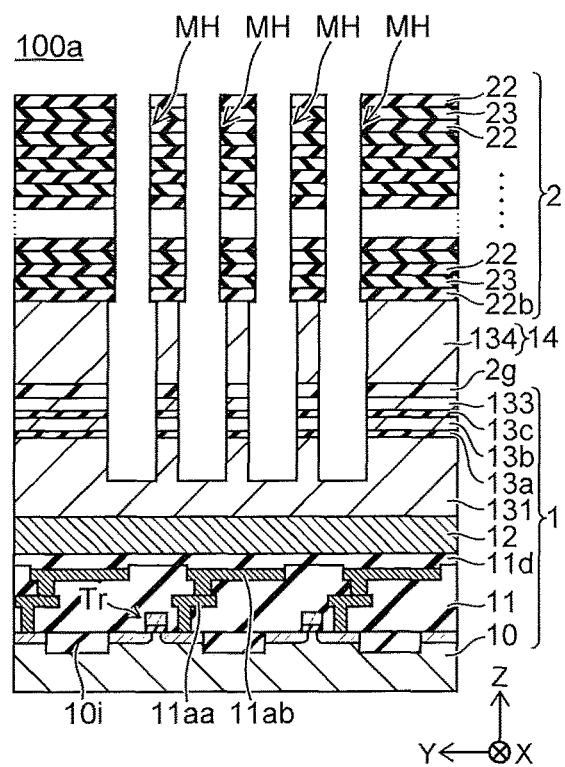
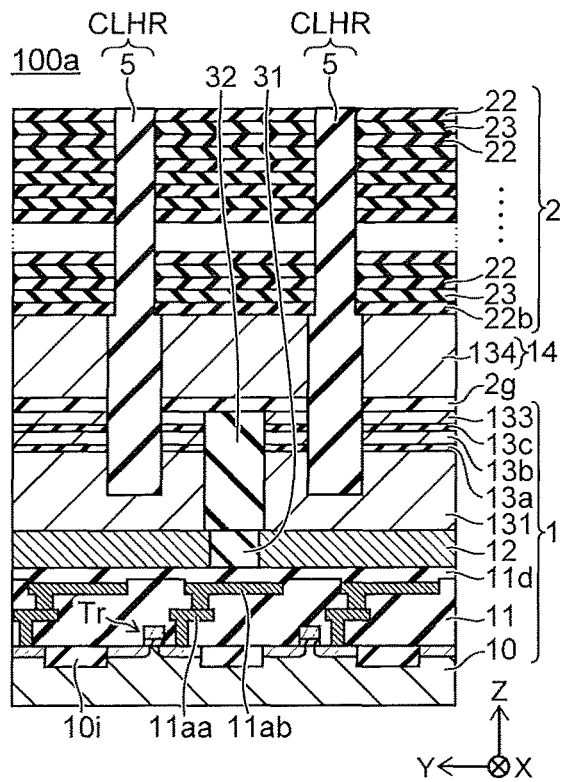
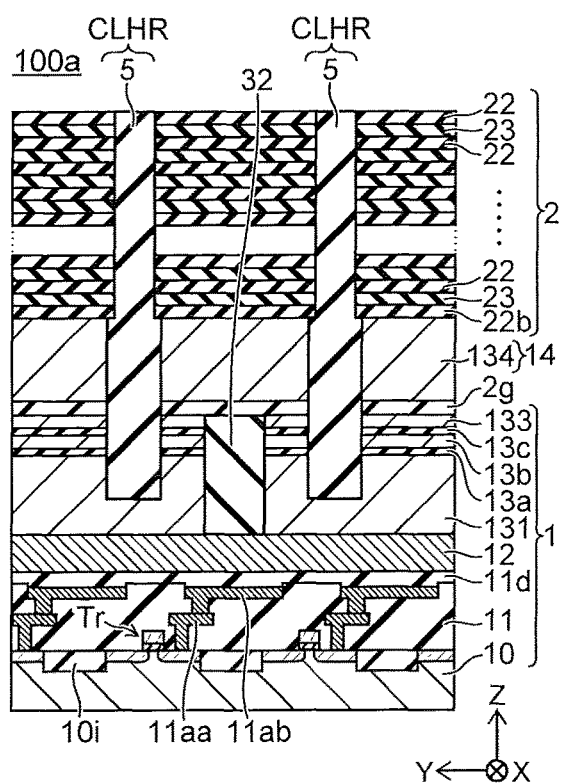
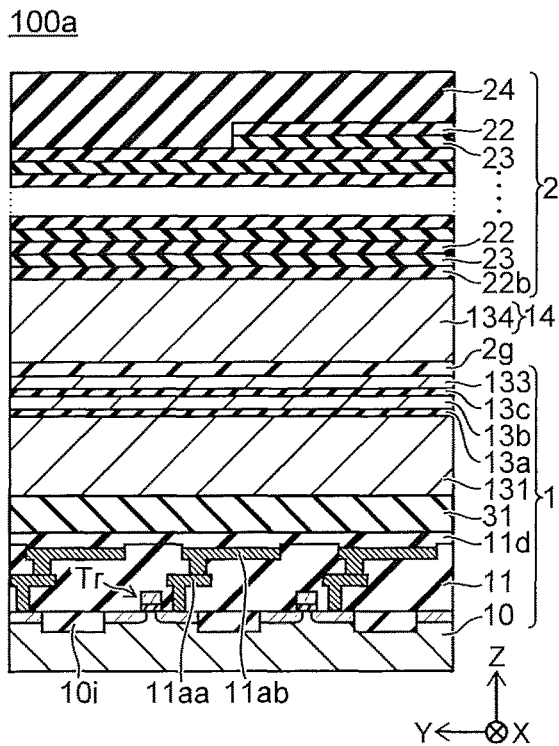

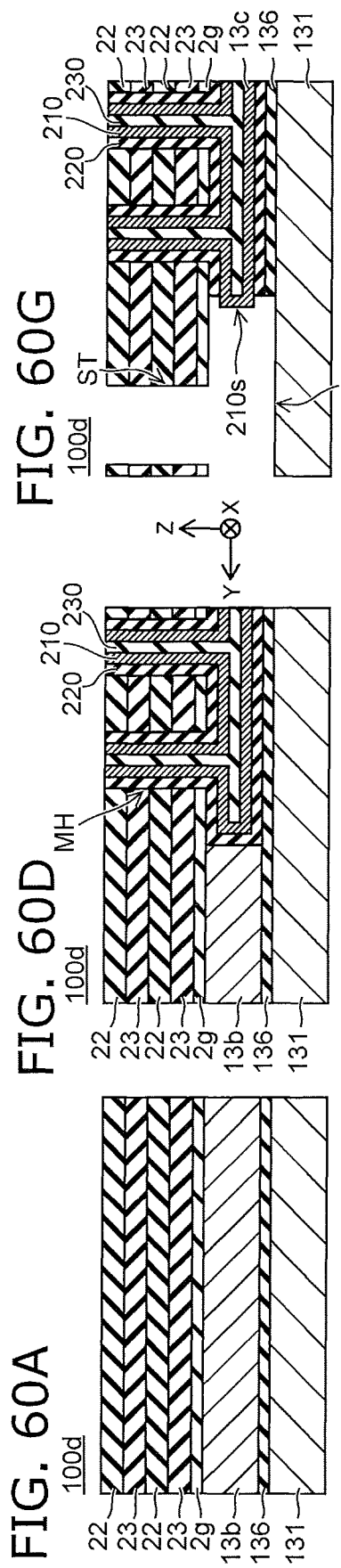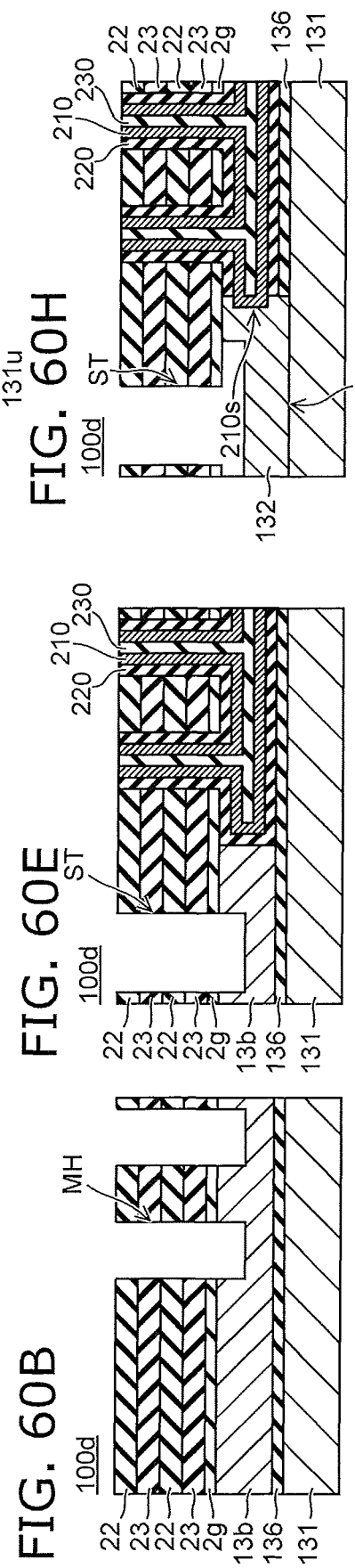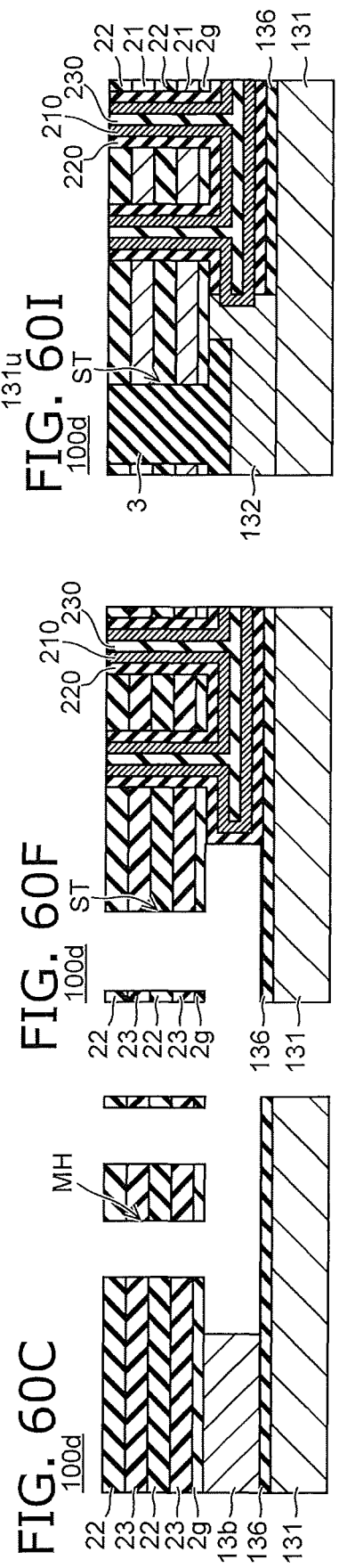

NONVOLATILE SEMICONDUCTOR MEMORY DEVICE INCLUDING A MEMORY CELL

CROSS-REFERENCE TO RELATED APPLICATIONS

This application is a continuation of and claims benefit under 35 U.S.C. § 120 to U.S. application Ser. No. 17/825,542 filed May 26, 2022, which is a continuation of and claims benefit under 35 U.S.C. § 120 to U.S. application Ser. No. 17/009,373 filed Sep. 1, 2020 (now U.S. Pat. No. 11,380,770), which is a continuation of and claims benefit under 35 U.S.C. § 120 to U.S. application Ser. No. 16/130,432 filed Sep. 13, 2018 (now U.S. Pat. No. 10,797,144), and claims the benefit of priority under 35 U.S.C. § 119 from Japanese Patent Application No. 2018-055371, filed Mar. 22, 2018, the entire contents of each of which are incorporated herein by reference.

FIELD

Embodiments relate to a semiconductor device.

BACKGROUND

Nonvolatile memory is known in which insulating films and conductive films are stacked alternately in a stacked body, and multiple memory cells are stacked in a three-dimensional structure in the height direction of the stacked body. The memory cells are provided between the stacked body and a columnar part including a semiconductor layer along the height direction of the stacked body. The memory cells are connected electrically in series between, for example, a drain-side select transistor provided in the upper region of the stacked body and, for example, a source-side select transistor provided in the lower region of the stacked body. This is called a NAND string (or a memory string). The conductive films that are stacked in the height direction of the stacked body are used as a gate (a drain-side select gate) of the drain-side select transistor, control gates (word lines) of the memory cells, and a gate (a source-side select gate) of the source-side select transistor. There are cases where transistors that are included in a memory peripheral circuit are provided under the stacked body. Recently, to form the source region of the NAND string, for example, a method has been attempted in which a sacrificial film is formed in a portion of the lower region of the stacked body; and the sacrificial film is replaced with a semiconductor layer used to form the source region. It is desirable to suppress the collapse of the stacked body when replacing the sacrificial film with the semiconductor layer.

BRIEF DESCRIPTION OF THE DRAWINGS

FIGS. 11A to 32D are schematic cross-sectional views illustrating sequential processes, which show a method for manufacturing the semiconductor device according to the first embodiment;

FIG. 60A to FIG. 60I are schematic cross-sectional views illustrating sequential processes, which show a method for manufacturing the semiconductor device according to the fourth embodiment.

DETAILED DESCRIPTION

Figure 1A:
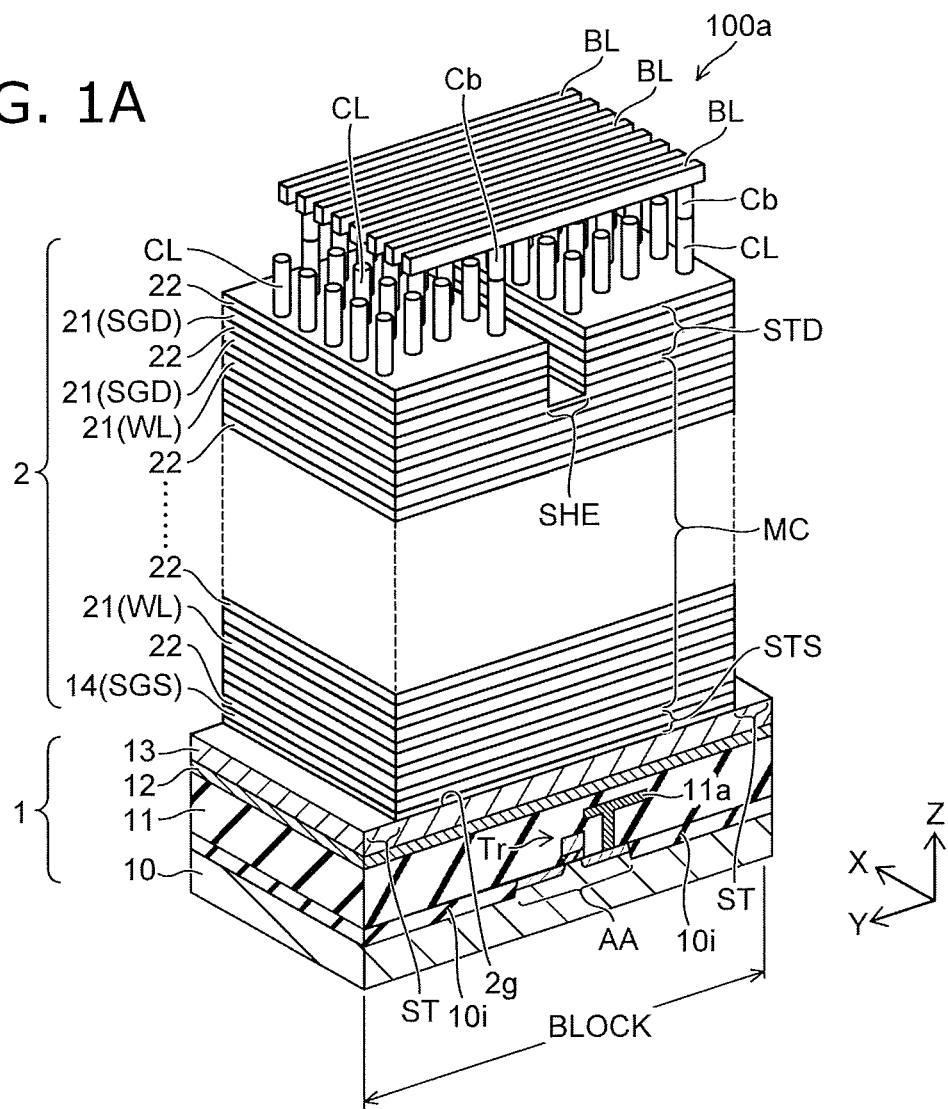
FIG. 1A is a schematic perspective view illustrating a semiconductor device according to a first embodiment.

According to one embodiment, a semiconductor device includes a base body, a stacked body and a first columnar part. The base body includes a substrate, a first insulating film provided on the substrate, a first conductive film provided on the first insulating film, and a first semiconductor part provided on the first conductive film. The stacked body is provided above the base body. The stacked body includes a plurality of conductive layers and a plurality of insulating layers. The conductive layers and the insulating layers are stacked alternately. The first columnar part is provided inside the stacked body and inside the first semiconductor part. The first columnar part includes a semiconductor body and a memory film. The semiconductor body extends in a stacking direction of the stacked body, and is electrically connected to the first semiconductor part. The memory film includes a charge trapping portion between the semiconductor body and one of conductive layers. The first columnar part has a first diameter in a first direction crossing the stacking direction inside the first semiconductor part and a second diameter in the first direction inside the stacked body. The first diameter is larger than the second diameter.

Hereinbelow, the embodiments are described with reference to the drawings.

The drawings are illustrated schematically or conceptually, and the relationship between a thickness and a width of each element illustrated, and the size ratio between the elements are not necessarily same as the actual ones. The same element may be illustrated in the drawings so as to have the size and ratio different from each other. In the specification and the drawings, the same element is denoted with the same symbol as the one described in the previous drawing, and is not precisely described or omitted appropriately.

First Embodiment (Semiconductor Device)

Figure 1B:
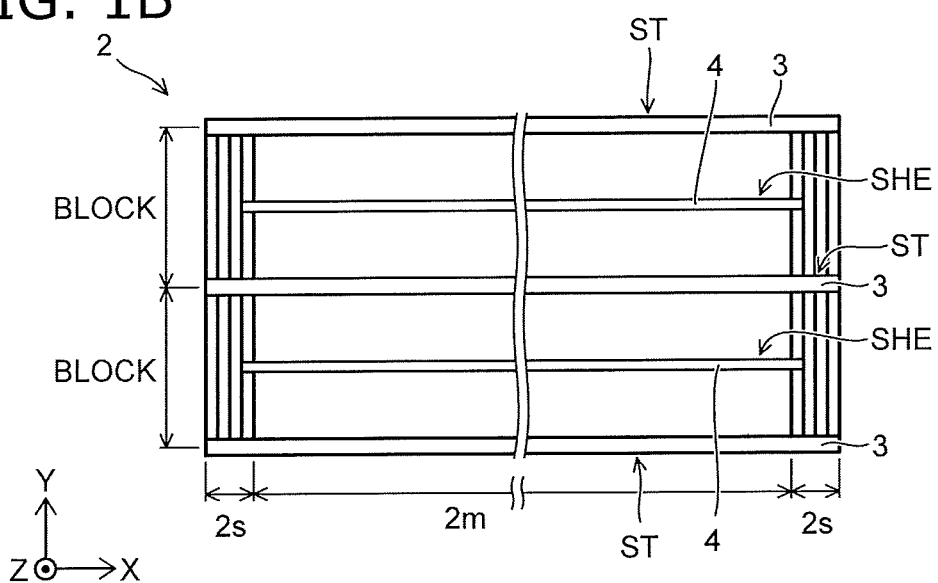
FIG. 1B is a schematic plan view showing a stacked body.
Figure 2A:
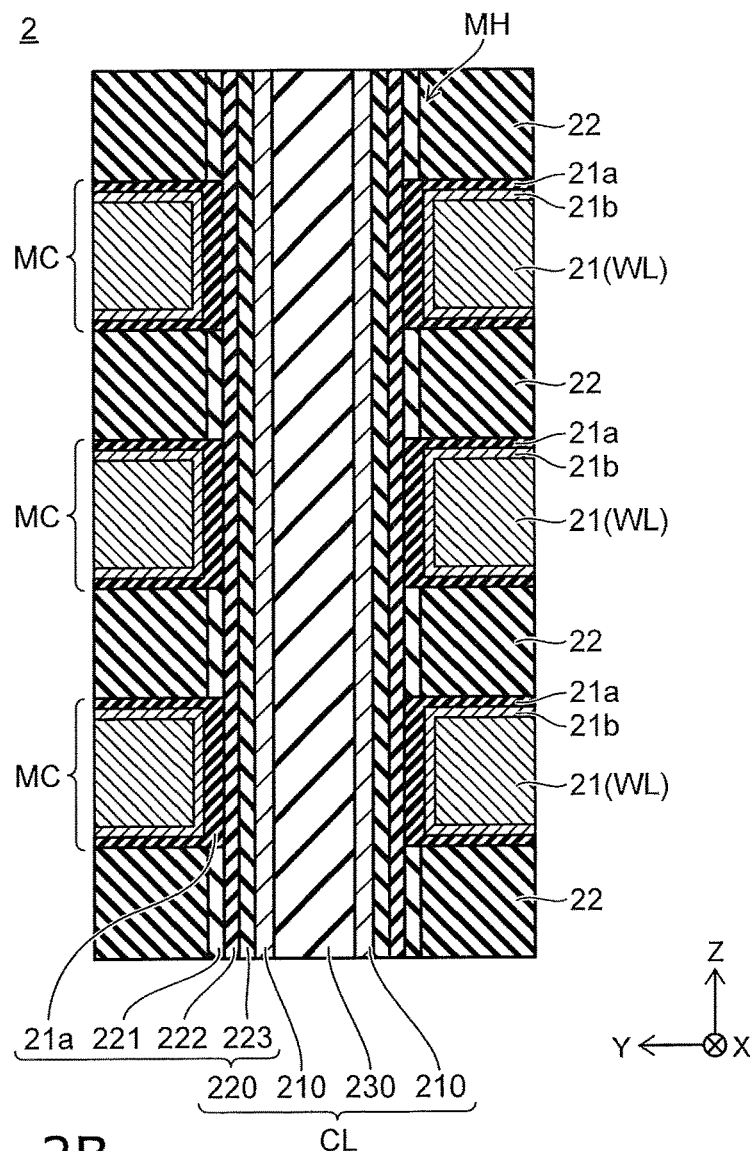
FIGS. 2A and 2B are schematic cross-sectional views illustrating memory cells having a three-dimensional structure.
Figure 2B:
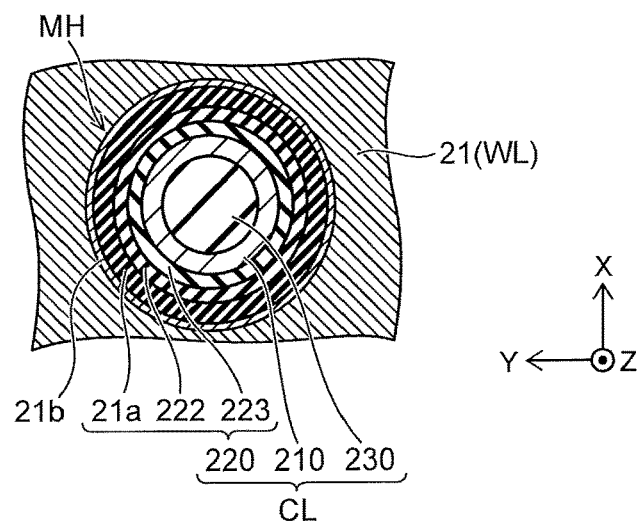
Figure 3:
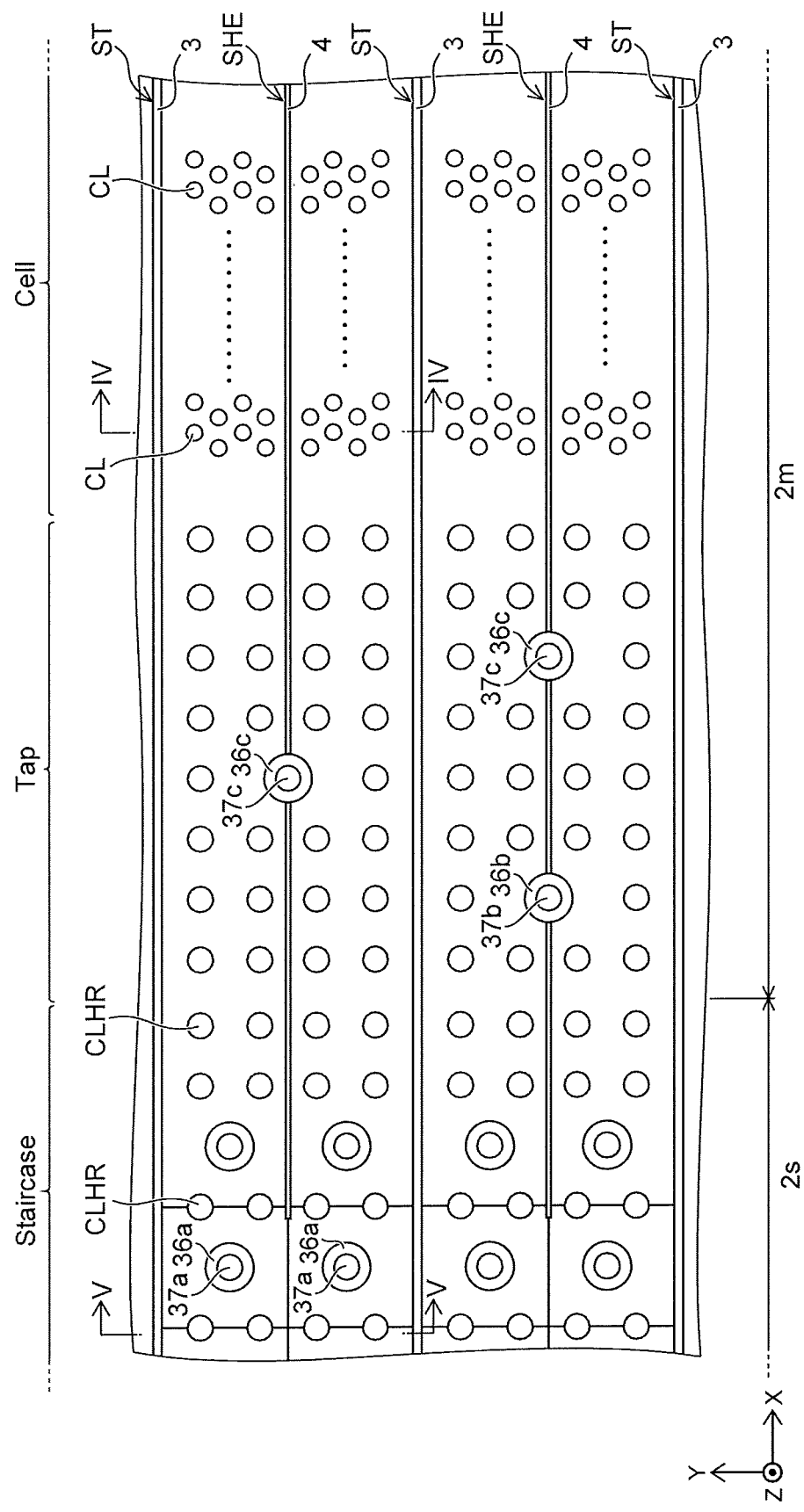
FIG. 3 is a schematic plan view illustrating the semiconductor device according to the first embodiment.
Figure 4:
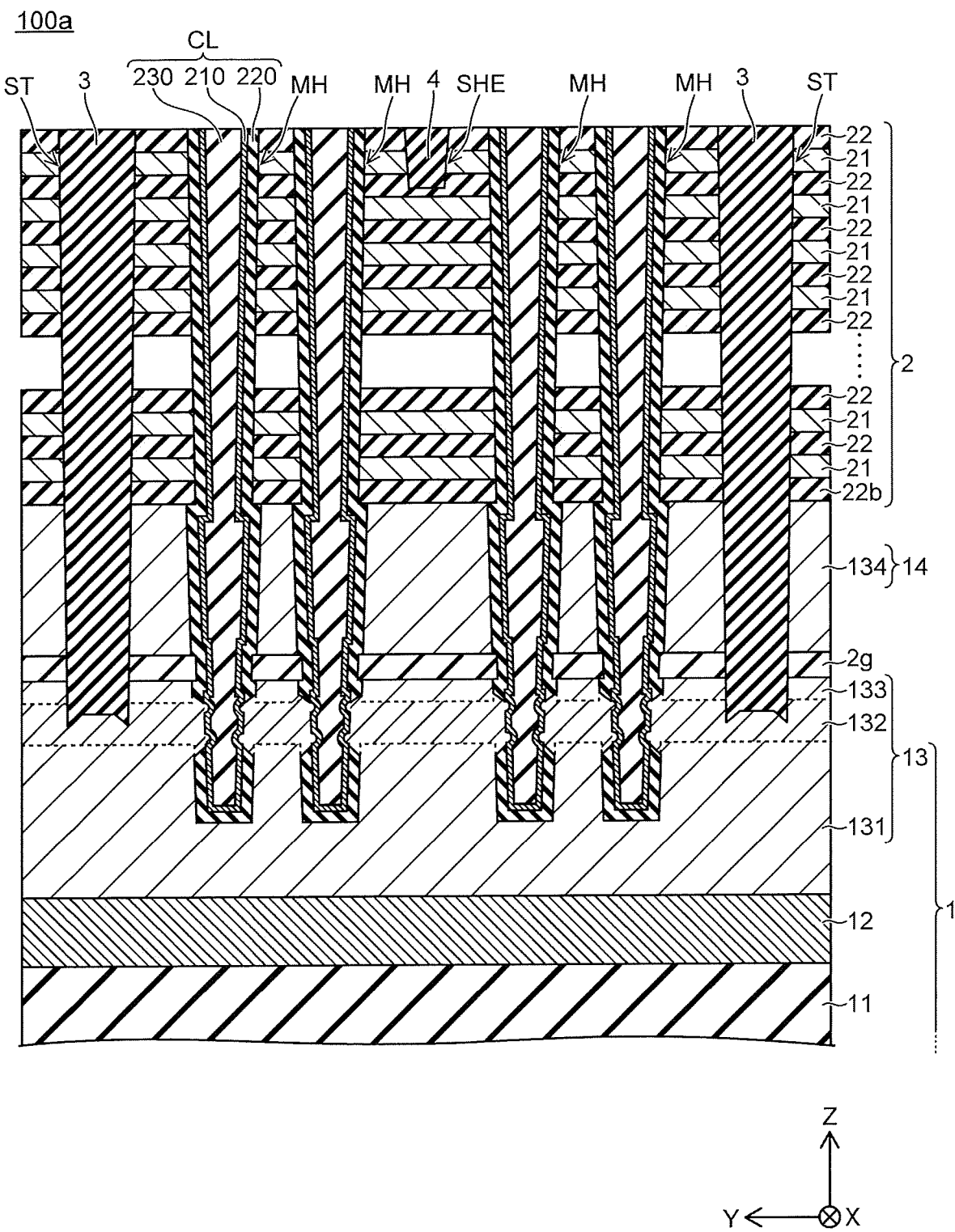
FIG. 4 is a schematic cross-sectional view along line IV-IV in FIG. 3.
Figure 5:
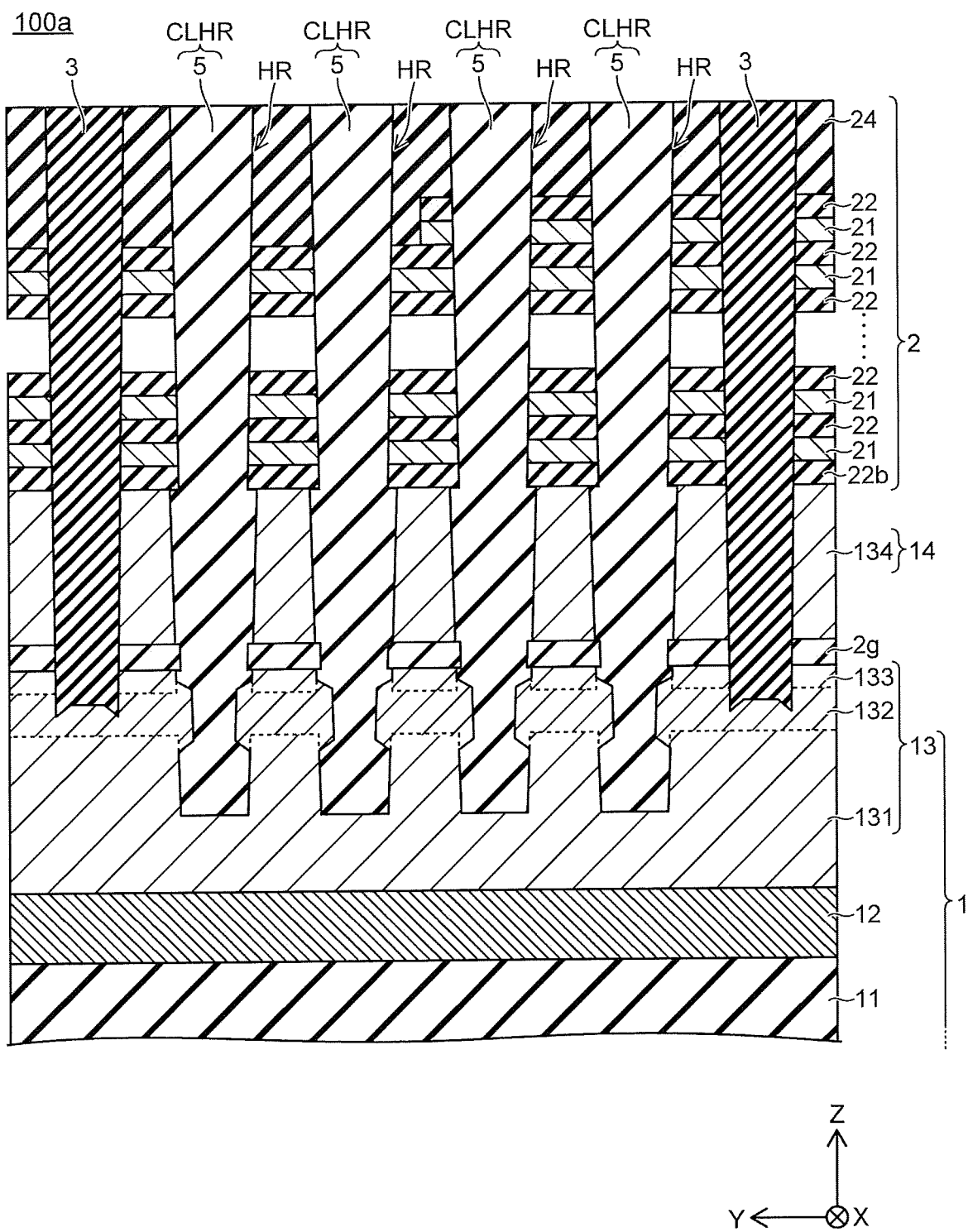
FIG. 5 is a schematic cross-sectional view along line V-V in FIG. 3.

FIG. 1A is a schematic perspective view illustrating a semiconductor device 100a according to a first embodiment. FIG. 1B is a schematic plan view showing a stacked body 2, In the specification, the stacking direction of the stacked body 2 is taken as a Z-axis direction. One direction crossing, e.g., orthogonal to, the Z-axis direction is taken as a first direction. In the specification, the first direction is, for example, a Y-axis direction. One direction crossing, e.g., orthogonal to, the Z- and Y-axis directions is taken as a second direction. The second direction is, for example, an X-axis direction. FIG. 2A and FIG. 2B each are schematic cross-sectional views illustrating memory cells having a three-dimensional structure. FIG. 3 is a schematic plan view illustrating the semiconductor device 100a according to the first embodiment. FIG. 4 is a schematic cross-sectional view along line IV-IV in FIG. 3, FIG. is a schematic cross-sectional view along line V-V in FIG. 3.

As shown in FIG. 1A to FIG. 5, the semiconductor device 100a according to the first embodiment is nonvolatile memory device including memory cells having a three-dimensional structure.

The semiconductor device 100a includes a base body 1, the stacked body 2, a plate portion 3, multiple first columnar parts CL, and multiple second columnar parts CLHR.

The base body 1 includes a substrate 10, a first insulating film 11, a first conductive film 12, and a first semiconductor part 13. The first insulating film 11 is provided on the substrate 10. The first conductive film 12 is provided on the first insulating film 11. The first semiconductor part 13 is provided on the first conductive film 12. The substrate 10 is a semiconductor substrate, e.g., a silicon substrate. The conductivity type of the silicon (Si) is, for example, a p-type. For example, an element separation region 10$i$ is provided in the surface region of the substrate 10. The element separation region 10$i$ is, for example, an insulating region including silicon oxide and partitions an active area AA in the surface region of the substrate 10. Source and drain regions of a transistor Tr are provided in the active area AA. The transistor Tr is included in the peripheral circuit of the nonvolatile memory. The first insulating film 11 includes, for example, silicon oxide ($SiO_2$) and insulates the transistor Tr. An interconnect 11$a$ is provided inside the first insulating film 11. The interconnect 11$a$ is an interconnect that is electrically connected to the transistor Tr. The first conductive film 12 includes a conductive metal, e.g., tungsten (W). The first semiconductor part 13 includes, for example, silicon. The conductivity type of the silicon is, for example, an n-type. A portion of the first semiconductor part 13 may include undoped silicon.

The stacked body 2 is positioned in the Z-axis direction with respect to the first semiconductor part 13. The stacked body 2 alternately includes multiple conductive layers 21 and multiple insulating layers 22 along the Z-axis direction. The conductive layers 21 include conductive metal, e.g., tungsten. The insulating layers 22 include, for example, silicon oxide. The insulating layers 22 insulate the conductive layers 21 from each other. The number of stacks of the conductive layers 21 and the number of stacks of the insulating layers 22 are arbitrary. The insulating layers 22 may be, for example, gaps. For example, an insulating film 2$g$ is provided between the stacked body 2 and the first semiconductor part 13. The insulating film 2$g$ includes, for example, silicon oxide ($SiO_2$). As described below, the insulating film 2$g$ may include a high dielectric having a higher relative dielectric constant than silicon oxide. The high dielectric is, for example, metal oxide.

The conductive layers 21 include at least one source-side select gate SGS, multiple word lines WL, and at least one drain-side select gate SGD, The source-side select gate SGS is a gate electrode of a source-side select transistor STS. The word lines WL are gate electrodes of memory cells MC. The drain-side select gate SGD is a gate electrode of a drain-side select transistor STD. The source-side select gate SGS is provided in the lower region of the stacked body 2. The drain-side select gate SGD is provided in the upper region of the stacked body 2. The lower region refers to the region of the stacked body 2 on the side proximal to the base body 1; and the upper region refers to the region of the stacked body 2 on the side distal to the base body 1. The word lines WL are provided between the source-side select gate SGS and the drain-side select gate SGD.

Among the multiple insulating layers 22, the thickness in the Z-axis direction of the insulating layer 22 that insulates the source-side select gate SGS and the word line WL may be, for example, thicker than the thickness in the Z-axis direction of the insulating layer 22 insulating the word line WL and the word line WL. A cover insulating film may be further provided on the insulating layer 22 of the uppermost layer most distal to the base body 1. The cover insulating film includes, for example, silicon oxide.

The semiconductor device 100a includes the multiple memory cells MC connected in series between the source-side select transistor STS and the drain-side select transistor STD. The structure in which the source-side select transistor STS, the memory cells MC, and the drain-side select transistor STD are connected in series is called a "memory string" or a "NAND string." For example, the memory string is connected to a bit line BL via a contact Cb. The bit line BL is provided above the stacked body 2 and extends in the Y-axis direction.

Multiple deep slits ST and multiple shallow slits SHE are provided inside the stacked body 2. The deep slits ST extend in the X-axis direction, are provided inside the stacked body 2, and extend through the stacked body 2 from the upper end of the stacked body 2 to the base body 1. The plate portions 3 are provided inside the deep slits ST (see FIG. 1B). The plate portions 3 include, for example, at least a first insulator. The first insulator is, for example, silicon oxide. The plate portions 3 may include a conductor electrically connected to the first semiconductor part 13 while being electrically insulated from the stacked body 2 by the first insulator. The shallow slits SHE extend in the X-axis direction and are provided partway through the stacked body 2 from the upper end of the stacked body 2. For example, a second insulator 4 is provided inside the shallow slits SHE (see FIG. 1B). The second insulator 4 is, for example, silicon oxide.

The stacked body 2 includes a staircase portion 2s and a memory cell array 2m (see FIG. 1B), The staircase portion 2s is provided in the edge portion of the stacked body 2. The memory cell array 2m is interposed between the staircase portions 2s or is surrounded with the staircase portion 2s, The deep slits ST are provided from the staircase portion 2s of one end of the stacked body 2 through the memory cell array 2m to the staircase portion 2s of the other end of the stacked body 2. The shallow slits SHE are provided in at least the memory cell array 2m.

The memory cell array 2m includes a cell region (Cell) and a tap region (Tap). The staircase portion 2s includes a staircase region (Staircase) as shown in FIG. 3. For example, the tap region is provided between the cell region and the staircase region. Although not illustrated in FIG. 3, the tap region may be provided between the cell regions. The staircase region is a region where multiple interconnects 37a are provided. The tap region is a region where interconnects 37b and 37c are provided. For example, the interconnects 37a to 37c each extend in the Z-axis direction. For example, the interconnects 37a are electrically connected respectively to the conductive layers 21. For example, the interconnects 37b are electrically connected to the first conductive film 12. For example, the interconnects 37c are electrically connected to the interconnects 11a.

The portion of the stacked body 2 interposed between two plate portions 3 is called a block (BLOCK). For example, the block is the minimum unit of the data erase. The second insulators 4 are provided inside the block. The stacked body 2 that is between the plate portion 3 and the second insulator 4 is called a finger. The drain-side select gate SGD is subdivided every finger. Therefore, one finger inside a block can be set to the selected state by the drain-side select gate SGD when programming and reading data.

The multiple first columnar parts CL are provided respectively inside memory holes MH provided inside the stacked body 2. The memory holes MH extend through the stacked body 2 from the upper end of the stacked body 2 along the Z-axis direction and are provided inside the stacked body 2 and inside the first semiconductor part 13 (see FIG. 4). The multiple first columnar parts CL each include a semiconductor body 210, a memory film 220, and a core layer 230. The semiconductor body 210 is electrically connected to the first semiconductor part 13. The memory film 220 includes a charge trapping portion between the semiconductor body 210 and the conductive layer 21. One bit line BL is connected commonly to one of the multiple first columnar parts CL selected from each of the fingers via the contacts Cb. The first columnar parts CL each are provided in, for example, the cell region (Cell) as shown in FIG. 3.

As shown in FIG. 2A and FIG. 2B, the configuration of the memory hole MH in the X-Y plane is, for example, a circle or an ellipse. A blocking insulating film 21a that is included in a portion of the memory film 220 may be provided between the conductive layer 21 and the insulating layers 22. The blocking insulating film 21a is, for example, a silicon oxide film or a metal oxide film. One example of the metal oxide is aluminum oxide. A barrier film 21b may be provided between the conductive layer 21 and the insulating layers 22 and between the conductive layer 21 and the memory film 220. For example, in the case where the conductive layer 21 is tungsten, for example, a stacked structure film of titanium nitride and titanium is selected as the barrier film 21b. The blocking insulating film 21a suppresses back-tunneling of charge from the conductive layer 21 to the memory film 220 side. The barrier film 21b improves the adhesion between the conductive layer 21 and the blocking insulating film 21a.

The configuration of the semiconductor body 210 is, for example, a tubular configuration having a bottom. The semiconductor body 210 includes, for example, silicon. The silicon is, for example, polysilicon made of amorphous silicon that is crystallized. The semiconductor body 210 is, for example, undoped silicon. The semiconductor body 210 may be p-type silicon. The semiconductor body 210 is used to form the channels of the drain-side select transistor STD, the memory cells MC, and the source-side select transistor STS.

A portion of the memory film 220 other than the blocking insulating film 21a is provided between the semiconductor body 210 and the inner wall of the memory hole MH. The configuration of the memory film 220 is, for example, a tubular configuration. The multiple memory cells MC are stacked in the Z-axis direction and include memory regions between the semiconductor body 210 and the conductive layers 21 used to form the word lines WL. The memory film 220 includes, for example, a cover insulating film 221, a charge trapping film 222, and a tunneling insulating film 223. The semiconductor body 210, the charge trapping film 222, and the tunneling insulating film 223 each extend in the Z-axis direction.

The cover insulating film 221 is provided between the insulating layer 22 and the charge trapping film 222. The cover insulating film 221 includes, for example, silicon oxide. The cover insulating film 221 provides protection so that the charge trapping film 222 is not etched when replacing sacrificial films (not illustrated) with the conductive layers 21 (a replacement process). The cover insulating film 221 may be removed from between the conductive layer 21 and the memory film 220 in the replacement process. In such a case, as shown in FIG. 2A and FIG. 2B, for example, the blocking insulating film 21a is provided between the conductive layer 21 and the charge trapping film 222. The cover insulating film 221 may not be provided in the case where the replacement process is not utilized to form the conductive layers 21.

The charge trapping film 222 is provided between the blocking insulating film 21a and the tunneling insulating film 223 and between the cover insulating film 221 and the tunneling insulating film 223. For example, the charge trapping film 222 includes silicon nitride and has trap sites that trap charge inside a film. The portion of the charge trapping film 222 is included in the memory region of the memory cell MC as a charge trapping portion. The portion of the charge trapping film 222 is interposed between the semiconductor body 210 and the conductive layer 21 that is used to form the word line WL. The threshold voltage of the memory cell MC changes according to the existence or absence of the charge inside the charge trapping portion or the amount of the charge trapped inside the charge trapping portion. Thereby, the memory cell MC stores information.

The tunneling insulating film 223 is provided between the semiconductor body 210 and the charge trapping film 222. The tunneling insulating film 223 includes, for example, silicon oxide, or silicon oxide and silicon nitride. The tunneling insulating film 223 is a potential barrier between the semiconductor body 210 and the charge trapping film 222. For example, transmission (tunneling) of electrons and holes through the potential barrier of the tunneling insulating film 223 occur respectively when the electrons are injected from the semiconductor body 210 into the charge trapping portion (a program operation) and when the holes are injected from the semiconductor body 210 into the charge trapping portion (an erase operation).

The core layer 230 fills the interior space of the semiconductor body 210 having the tubular configuration. The configuration of the core layer 230 is, for example, a columnar configuration. The core layer 230 includes, for example, silicon oxide and is insulative.

Each of the multiple second columnar parts CLHR is provided inside a hole HR provided inside the stacked body 2. The hole HR extends through the stacked body 2 from the upper end of the stacked body 2 along the Z-axis direction and is provided inside the stacked body 2 and inside the first semiconductor part 13 (see FIG. 5). The second columnar parts CLHR each include at least a third insulator 5. The third insulator 5 is, for example, silicon oxide. The second columnar parts CLHR each may have the same structure as the first columnar part CL. For example, the second columnar parts CLHR each are provided in the staircase region (Staircase) and the tap region (Tap) as shown in FIG. 3. The second columnar parts CLHR function as support members for maintaining the gaps formed in the staircase region and the tap region when replacing the sacrificial films (not illustrated) with the conductive layers 21 (the replacement process).

The first semiconductor part 13 includes, for example, a first semiconductor layer 131 of the n-type, a second semiconductor layer 132 of the n-type, and an n-type or undoped third semiconductor layer 133. The first semiconductor layer 131 contacts the first conductive film 12. The second semiconductor layer 132 contacts the first semiconductor layer 131 and the semiconductor body 210. For example, the second semiconductor layer 132 extends at the portion where the memory film 220 is removed, and contacts the semiconductor body 210. The second semiconductor layer 132 is provided to surround the semiconductor body 210 in the X-Y plane. The third semiconductor layer 133 contacts the second semiconductor layer 132.

The semiconductor device 100a further includes a second semiconductor part 14. The second semiconductor part 14 is positioned between the stacked body 2 and the first semiconductor part 13. The second semiconductor part 14 includes a fourth semiconductor layer 134. The fourth semiconductor layer 134 is provided between the insulating film 2g and an insulating layer 22b of the insulating layers 22 most proximal to the first semiconductor part 13. The conductivity type of the fourth semiconductor layer 134 is, for example, the n-type. For example, the fourth semiconductor layer 134 functions as the source-side select gate SGS.

Figure 6:
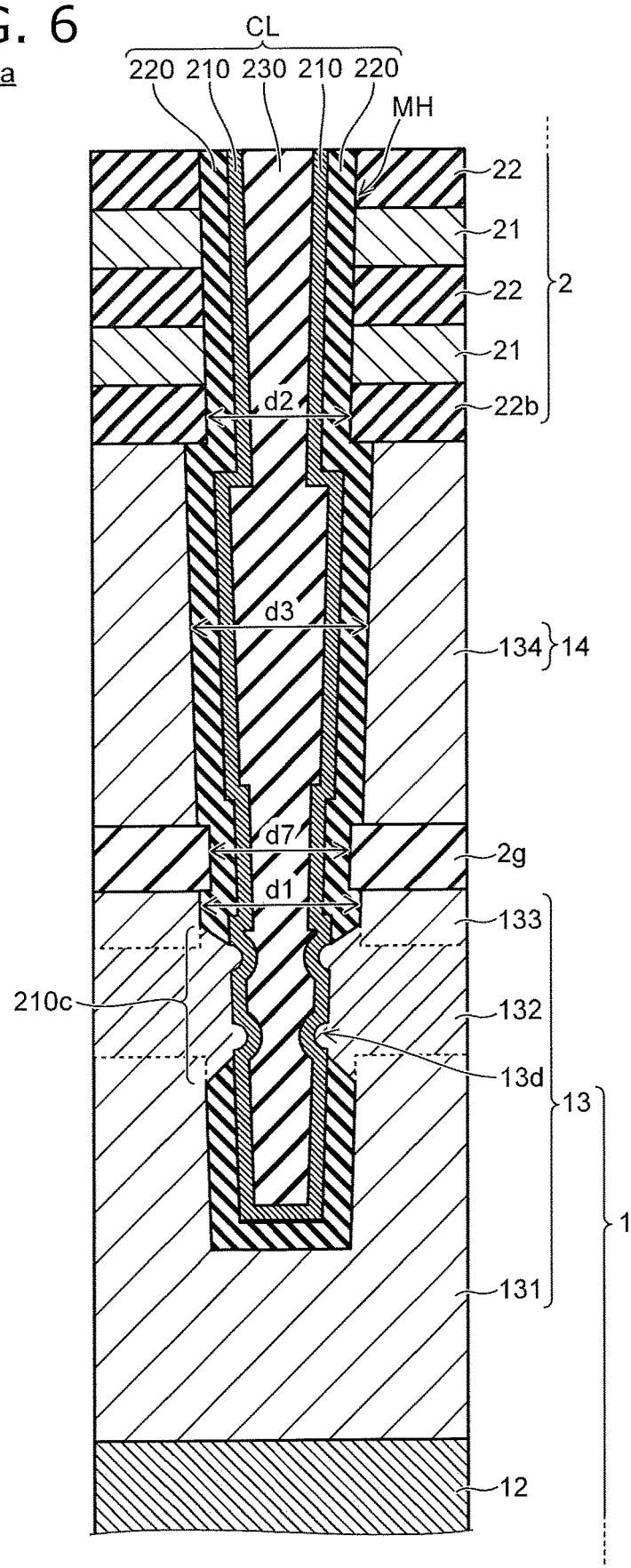
FIG. 6 is a schematic cross-sectional view illustrating an enlargement of the first columnar part, the first semiconductor part, and the second semiconductor part of the semiconductor device according to the first embodiment.

FIG. 6 is a schematic cross-sectional view illustrating an enlargement of the first columnar part CL, the first semiconductor part 13, and the second semiconductor part 14 of the semiconductor device 100a according to the first embodiment. The cross section shown in FIG. 6 corresponds to the cross section shown in FIG. 4.

As shown in FIG. 6, a first diameter d1 of the first columnar part CL of the semiconductor device 100a is larger than a second diameter d2 of the first columnar part CL of the semiconductor device 100a. The first diameter d1 is the diameter of the first columnar part CL inside the first semiconductor part 13; and the second diameter d2 is the diameter of the first columnar part CL inside the stacked body 2.

The first diameter d1 is, for example, a diameter of the first columnar part CL at a portion surrounded with the first semiconductor part 13 other than a contact portion 210c where the second semiconductor layer 132 contacts the semiconductor body 210. The first diameter d1 may be, for example, a diameter of the first columnar part CL at a portion surrounded with the third semiconductor layer 133. The second diameter d2 is a diameter of the first columnar part CL at a portion surrounded with one insulating layer 22. The one insulating layer 22 is, for example, the insulating layer 22b most proximal to the first semiconductor part 13.

In the semiconductor device 100a, a third diameter d3 of the first columnar part CL is larger than the second diameter d2. The third diameter d3 is, for example, the diameter of the first columnar part CL inside the second semiconductor part 14. The third diameter d3 may be, for example, the diameter of a location of the first columnar part CL surrounded with the fourth semiconductor layer 134.

According to the semiconductor device 100a, it is possible to suppress the collapse of the stacked body 2, e.g., the collapse of the stacked body 2 when manufacturing. For example, a portion of the first columnar part CL is used as a post maintaining a first space S1 formed when replacing a first intermediate film 13a, a first sacrificial film 13b, and a second intermediate film 13c with the second semiconductor layer 132 in the processes shown in FIG. 23A to FIG. 27D. Therefore, by increasing the diameter of the portion of the first columnar part CL positioned inside the first semiconductor part 13, it is possible to stably support the stacked body 2 positioned above the first space S1; and the collapse of the stacked body 2 can be avoided.

For example, etching of the memory film 220 is performed in the interior of the first space S1 to cause the second semiconductor layer 132 to contact the semiconductor body 210. Thus, there may be a case where the first columnar part CL that is exposed inside the first space S1 gets slim and no longer can support the stacked body 2. As a result, the collapsing of the stacked body 2 may increase in the cell region (Cell).

It is considered that such a circumstance becomes more pronounced as the first columnar part CL is downscaled. For example, when the first columnar part CL is downscaled, the case also is imagined where the etching progresses from the semiconductor body 210 into the core layer 230 at the contact location 210c. In such a case, the first columnar part CL gets slimmer.

In contrast, the portion of the first columnar part CL positioned inside the first semiconductor part 13 is set to be wider in the semiconductor device 100a. For example, the diameter (the first diameter d1) of the first columnar part CL inside the first semiconductor part 13 is larger than the diameter (the second diameter d2) of the first columnar part CL inside the stacked body 2. Thereby, even when the etching of the first columnar part CL progresses at the contact portion 210c, the first columnar part CL remains inside the first semiconductor part 13 with the diameter (the first diameter d1) enough to suppress the collapse. Accordingly, the collapse of the stacked body 2 can be suppressed.

According to the semiconductor device 100a in which the collapse of the stacked body 2 can be suppressed, for example, an advantage can be obtained in that the semiconductor device 100a is advantageous for the improvement of the manufacturing yield and the advancement of the downscaling.

Figure 7:
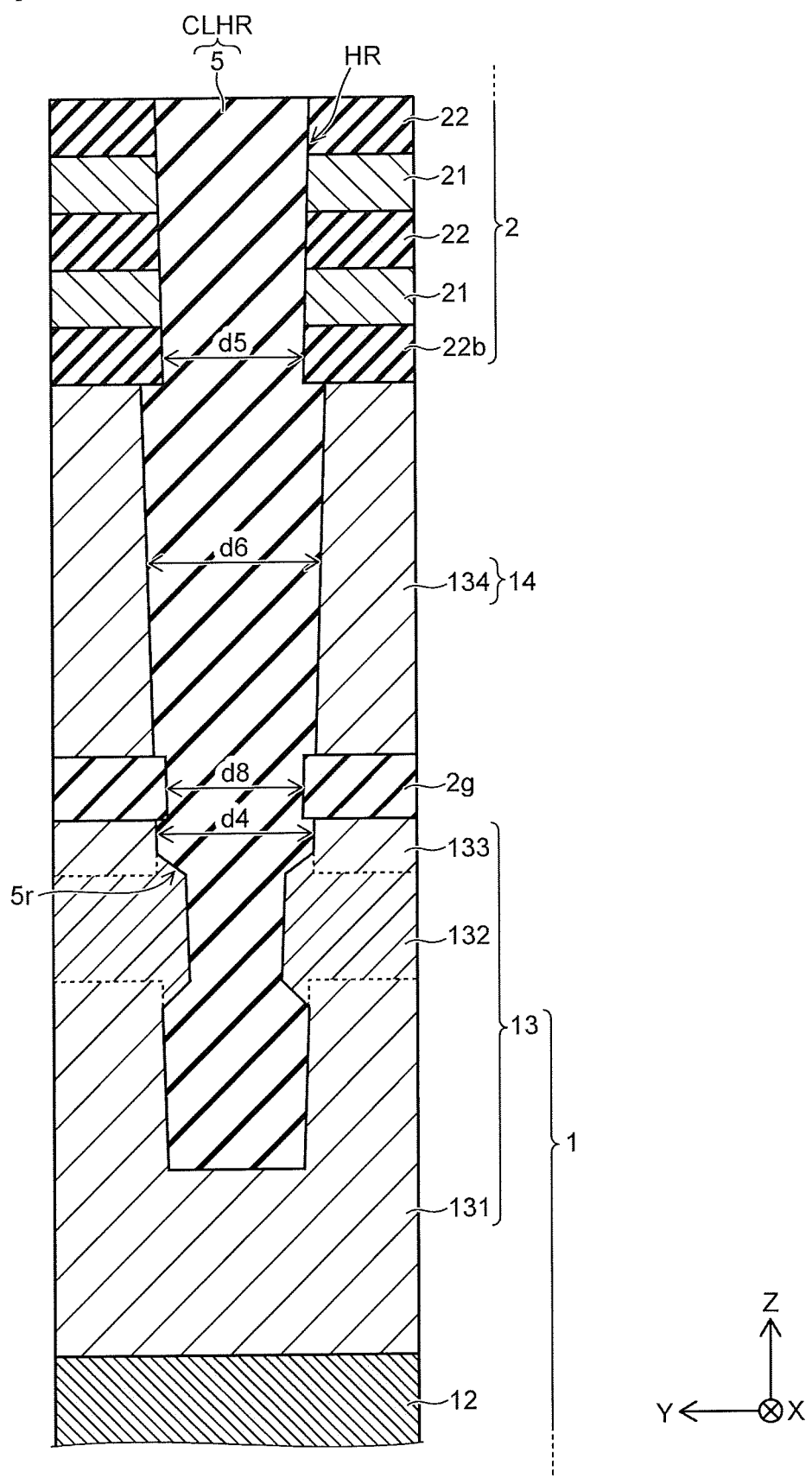
FIG. 7 is a schematic cross-sectional view illustrating an enlargement of the second columnar part, the first semiconductor part, and the second semiconductor part of the semiconductor device according to the first embodiment.

FIG. 7 is a schematic cross-sectional view illustrating an enlargement of the second columnar part CLHR, the first semiconductor part 13, and the second semiconductor part 14 of the semiconductor device 100a according to the first embodiment. The cross section shown in FIG. 7 corresponds to the cross section shown in FIG. 5.

According to the semiconductor device 100a as shown in FIG. 7, a fourth diameter d4 of the second columnar part CLHR is set to be larger than a fifth diameter d5 of the second columnar part CLHR. The fourth diameter d4 is the diameter of the second columnar part CLHR inside the first semiconductor part 13; and the fifth diameter d5 is the diameter of the second columnar part CLHR inside the stacked body 2.

The second columnar part CLHR includes a recess portion 5r inside the first semiconductor part 13. The third insulator 5 is etched along the X-Y planar direction at the recess portion 5r, The second columnar part CLHR is narrower at the recess portion Sr. For example, the recess portion 5r corresponds to the contact portion 210c where the memory film 220 is removed.

The fourth diameter d4 is, for example, a diameter of the second columnar part CLHR at a portion surrounded with the first semiconductor part 13 other than the recess portion 5r. The fourth diameter d4 may be, for example, a diameter of the second columnar part CLHR at a portion surrounded with the third semiconductor layer 133, The fifth diameter d5 is a diameter of the second columnar part CLHR at a portion surrounded with one insulating layer 22. The one insulating layer 22 is, for example, the insulating layer 22b most proximal to the first semiconductor part 13.

Further, in the semiconductor device 100a, a sixth diameter d6 of the second columnar part CLHR is larger than the fifth diameter d5. The sixth diameter d6 is, for example, a diameter of the second columnar part CLHR inside the second semiconductor part 14. The sixth diameter d6 may be, for example, a diameter of the second columnar part CLHR at a portion surrounded with the fourth semiconductor layer 134.

Thus, in the second columnar part CLHR according to the semiconductor device 100a, the diameter (the fourth diameter d4) of the second columnar part CLHR inside the first semiconductor part 13 is set to be larger than the diameter (the fifth diameter d5) of the second columnar part CLHR inside the stacked body 2.

The recess portion 5r is formed in the second columnar part CLHR when the etching of the third insulator 5 progresses in the etching of the memory film 220 at the contact portion 210c. Therefore, the diameter of the second columnar part CLHR becomes narrow inside the first semiconductor part 13. Similarly to the first columnar part CL, the second columnar part CLHR can no longer support the stacked body 2; and there is a possibility that the stacked body 2 may collapse in the tap region (Tap) and the staircase region (Staircase).

Such a circumstance also can be suppressed further in the semiconductor device 100a by setting the diameter (the fourth diameter d4) of the second columnar part CLHR inside the first semiconductor part 13 to be larger than the diameter (the fifth diameter d5) of the second columnar part CLHR inside the stacked body 2.

It is possible to set the fourth diameter d4 to be larger than the fifth diameter d5 and set the sixth diameter d6 to be larger than the fifth diameter d5, not depending on the first columnar part CL.

Similarly, it is possible to set the first diameter d1 to be larger than the second diameter d2 and set the third diameter d3 to be larger than the second diameter d2, not depending on the second columnar part CLHR.

In the semiconductor device 100a as shown in FIG. 6, the first diameter d1 is larger than a seventh diameter d7. The third diameter d3 also is larger than the seventh diameter d7. The seventh diameter d7 is a diameter of the first columnar part CL at a portion surrounded with the insulating film 2g.

With respect to the seventh diameter d7, the first diameter d1 and the third diameter d3 are larger not in a linear shape but in a step shape. For example, this structure is formed when etching (recessing) the first and second semiconductor parts 13 and 14 from the memory hole MH to cause the first diameter d1 and the third diameter d3 to be larger than the second diameter d2. For example, an etching rate difference occurs in the case where the first and second semiconductor parts 13 and 14 each are silicon and the insulating film 2g is silicon oxide or a metal oxide. When etching silicon, the etching rate of silicon oxide or a metal oxide is slower than that of silicon. The first diameter d1 and the third diameter d3 each are larger than the seventh diameter d7 due to the etching rate difference.

Accordingly, the first columnar part CL includes locations where the diameter has a pinched-in step shape inside the first semiconductor part 13, the insulating film 2g, and the second semiconductor part 14. Thereby, for example, the insulating film 2g has a structure jutting into the first columnar part CL in, for example, the X-Y planar direction. Or, the first columnar part CL includes a level difference where the insulating film 2g rests on the first semiconductor part 13 in the Z-axis direction.

For example, the insulating film 2g is not etched in the etching process of the sacrificial film when forming the second semiconductor layer 132. For example, in the state in which there is no second semiconductor layer 132, the insulating film 2g rests on the first columnar part CL, e.g., on the memory film 220. Therefore, the stacked body 2 does not easily slide down into the space obtained where the sacrificial film is removed. The structure in which the insulating film 2g juts into the first columnar part CL is advantageous for suppressing the collapse of the stacked body 2.

As shown in FIG. 7, the second columnar part CLHR also is similar. The fourth diameter d4 and the sixth diameter d6 each are larger than an eighth diameter d8. With respect to the eighth diameter d8, the fourth diameter d4 and the sixth diameter d6 each are larger not in a linear shape but in a step shape. The eighth diameter d8 is the diameter of a location of the second columnar part CLHR surrounded with the insulating film 2g.

Thus, the second columnar part CLHR also includes locations where the diameter has a pinched-in step shape inside at least the insulating film 2g or a level difference where the insulating film 2g rests on the first semiconductor part 13 in the Z-axis direction. This structure also is advantageous for suppressing the collapse of the stacked body 2.

(First Variation)

Figure 8:
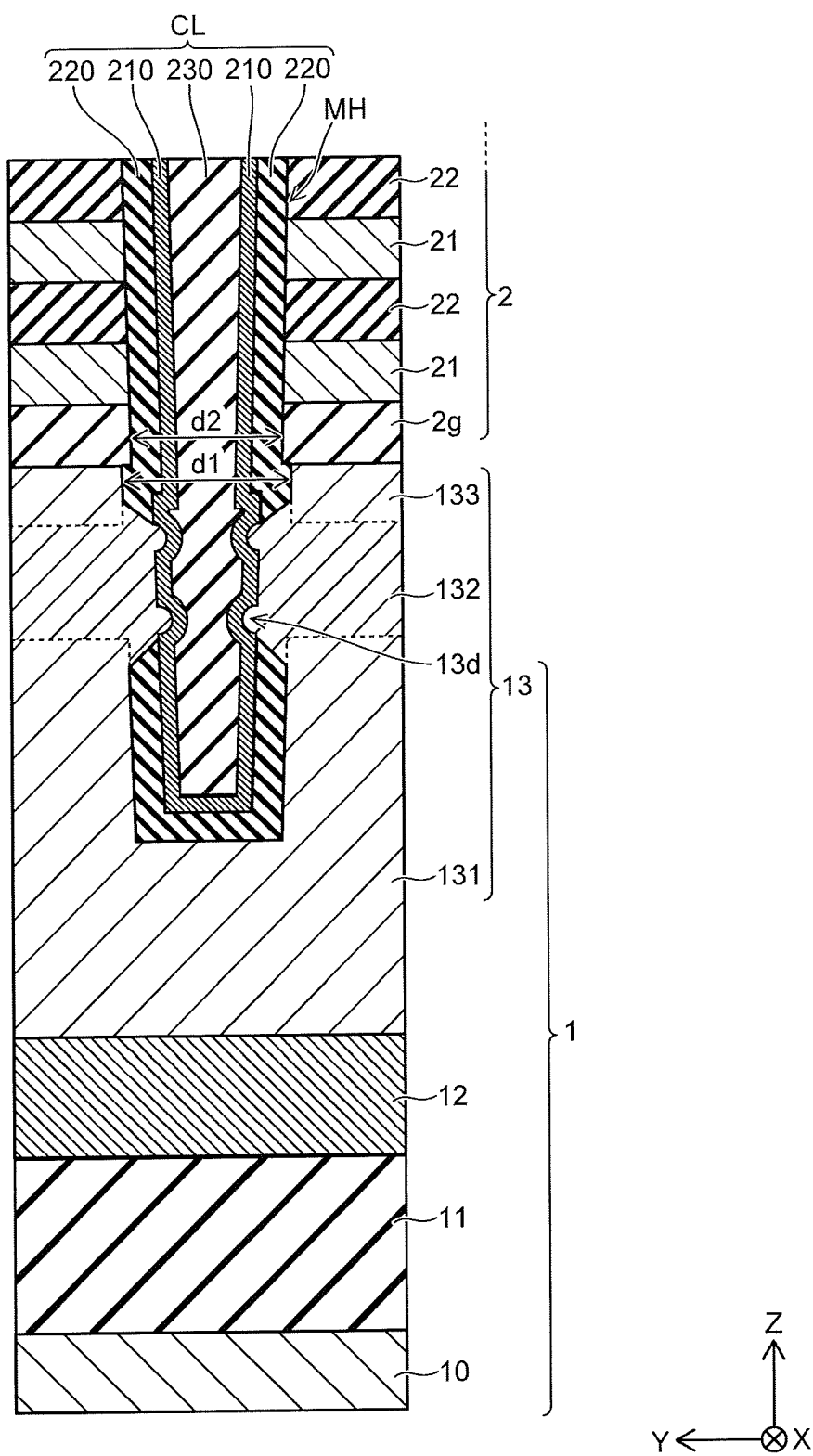
FIG. 8 is a schematic cross-sectional view illustrating an enlargement of the first columnar part and the first semiconductor part of a semiconductor device according to a first variation of the first embodiment.
Figure 9:
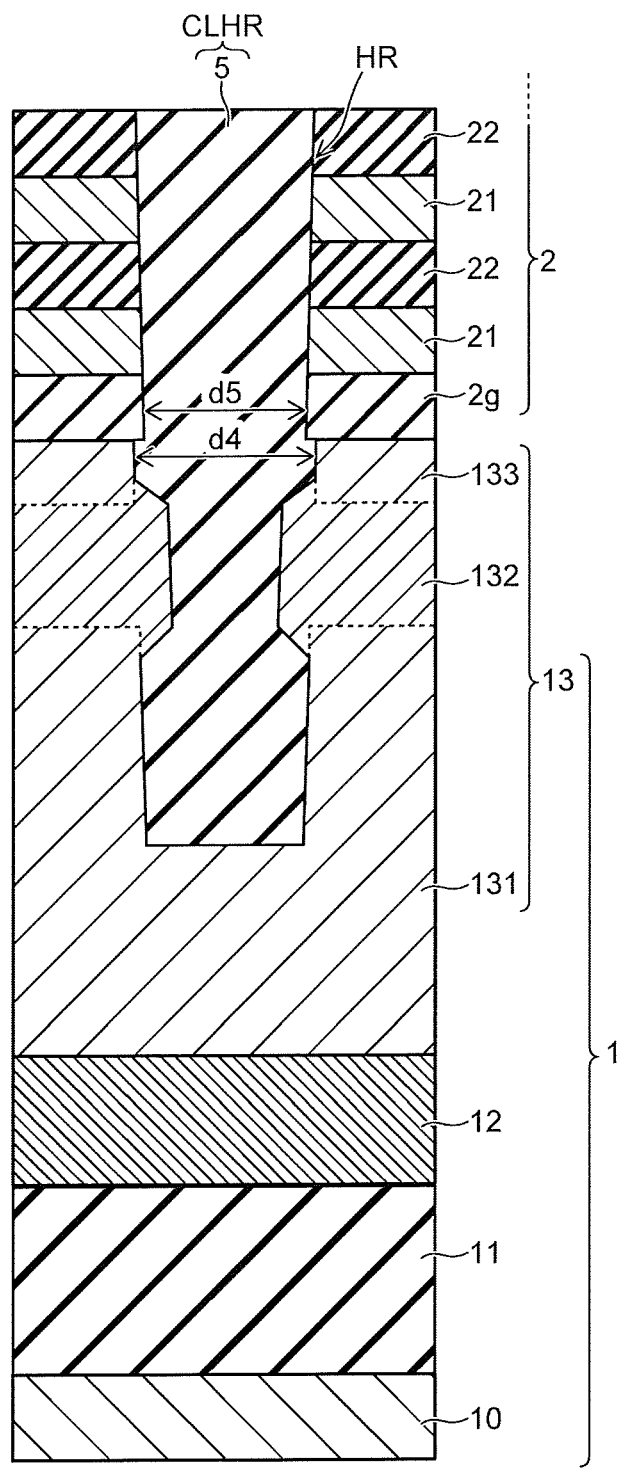
FIG. 9 is a schematic cross-sectional view illustrating an enlargement of the second columnar part and the first semiconductor part of the semiconductor device according to the first variation of the first embodiment.

FIG. 8 is a schematic cross-sectional view illustrating an enlargement of the first columnar part CL and the first semiconductor part 13 of a semiconductor device 100aa according to a first variation of the first embodiment. FIG. 9 is a schematic cross-sectional view illustrating an enlargement of the second columnar part CLHR and the first semiconductor part 13 of the semiconductor device 100aa according to the first variation of the first embodiment. The cross section shown in FIG. 8 corresponds to the cross section shown in FIG. 6; and the cross section shown in FIG. 9 corresponds to the cross section shown in FIG. 7.

As shown in FIG. 8 and FIG. 9, the semiconductor device 100aa according to the first variation differs from the semiconductor device 100a in that, for example, there is no second semiconductor part 14. In such a case, the insulating film 2g may be considered to be included in the stacked body 2; and the insulator of the stacked body 2 most proximal to the first semiconductor part 13 is used as the insulating film 2g. It is also possible to omit the second semiconductor part 14 as in the semiconductor device 100aa.

(Manufacturing Method)

A typical example of a method for manufacturing the semiconductor device 100a will now be described. In the manufacturing method, the formation of the structures around the interconnects 37a to 37c, and the formation of the interconnects 37a to 37c will be described for convenience.

Figure 10:
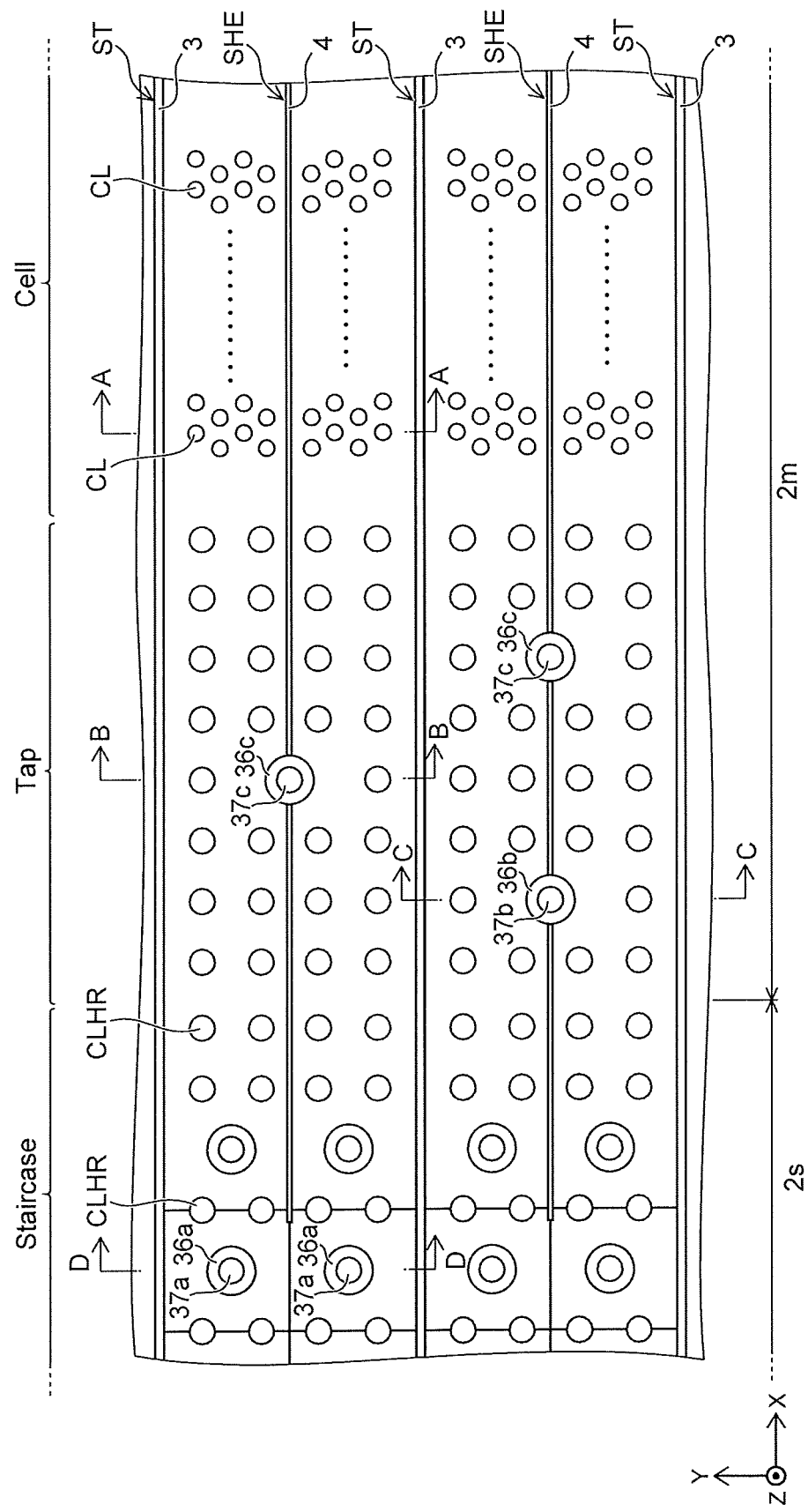
FIG. 10 is a schematic plan view illustrating the semiconductor device according to the first embodiment.
Figure 11A:
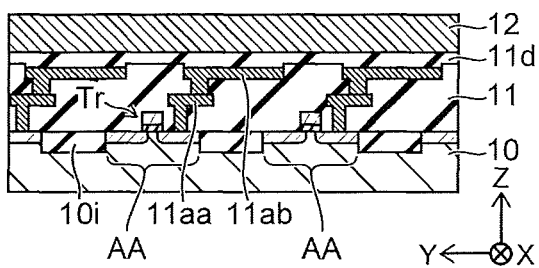
Figure 11B:
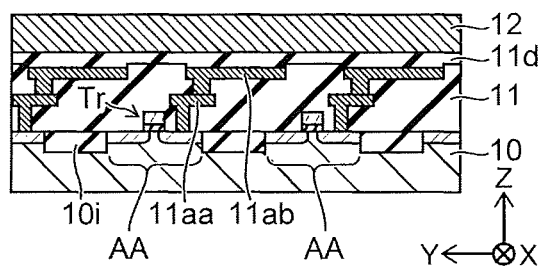
Figure 11C:
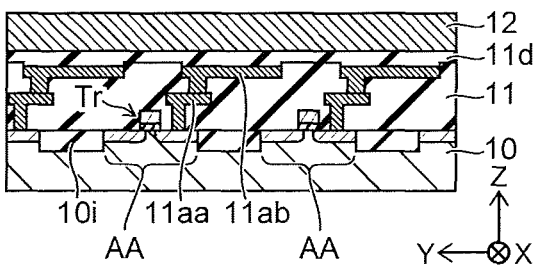
Figure 11D:
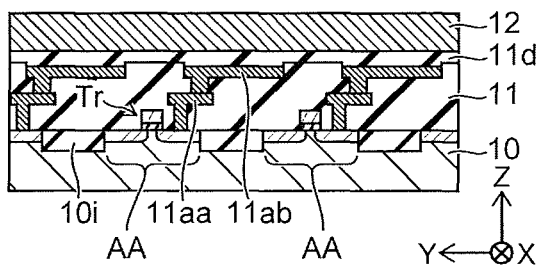
Figure 12A:
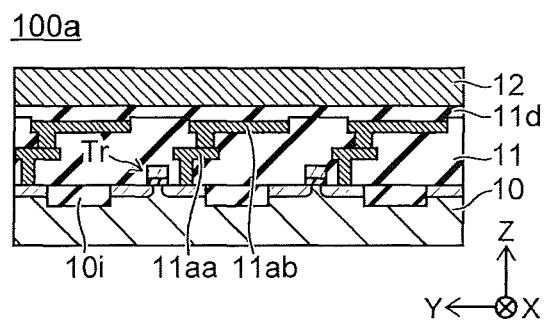
Figure 12B:
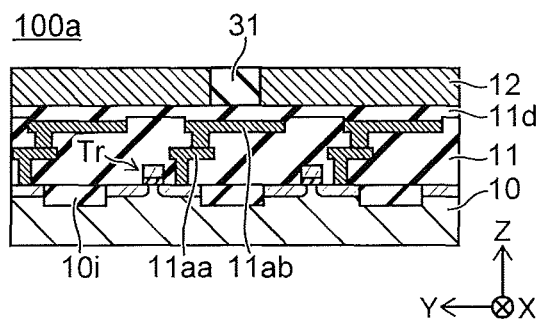
Figure 12C:
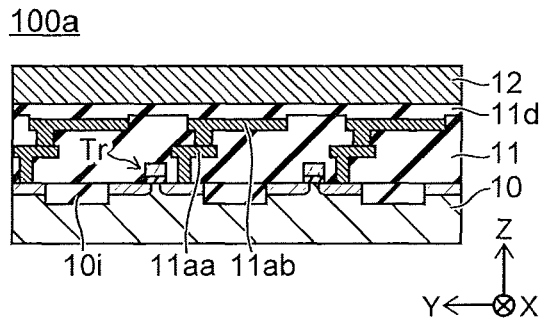
Figure 12D:
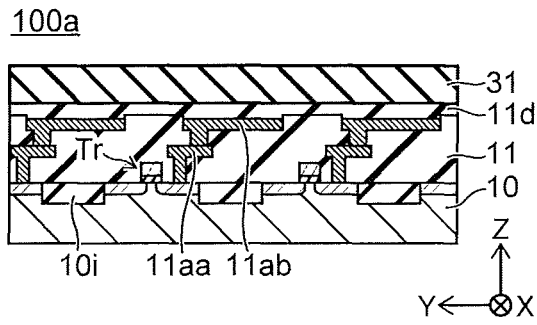
Figure 13A:
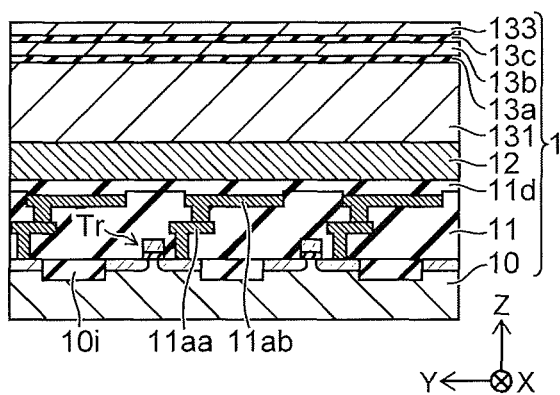
Figure 13B:
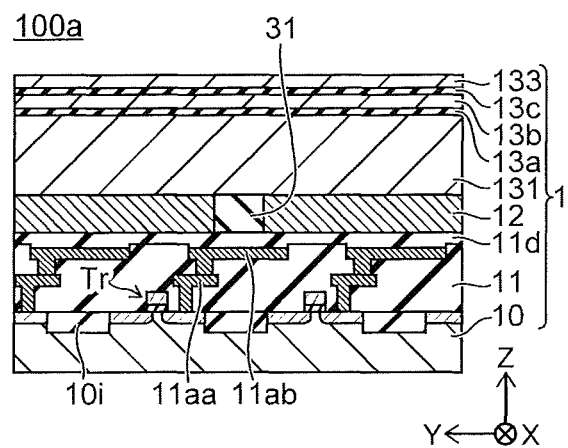
Figure 13C:
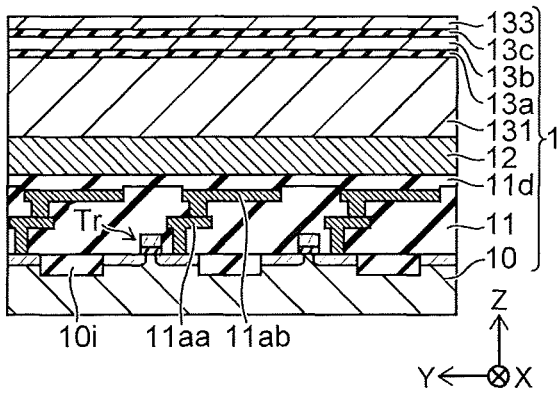
Figure 13D:
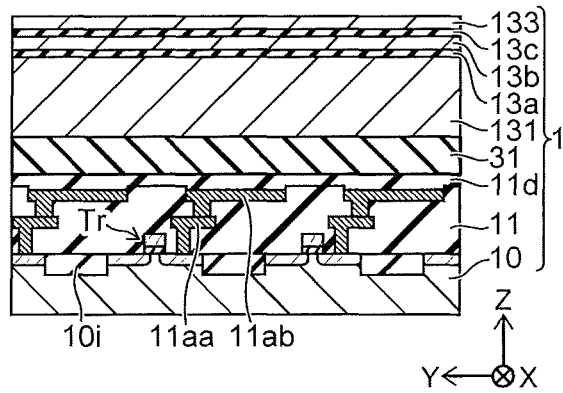
Figure 14A:
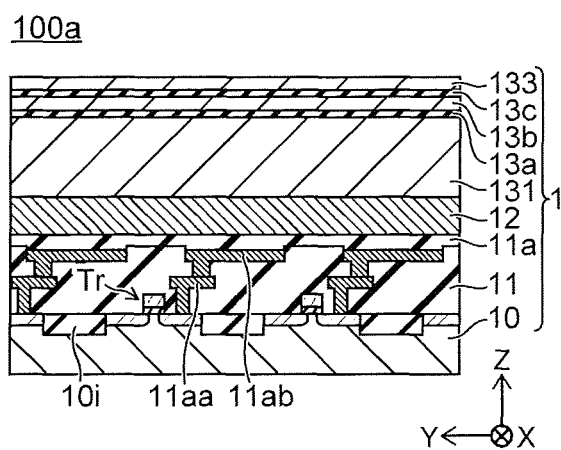
Figure 14B:
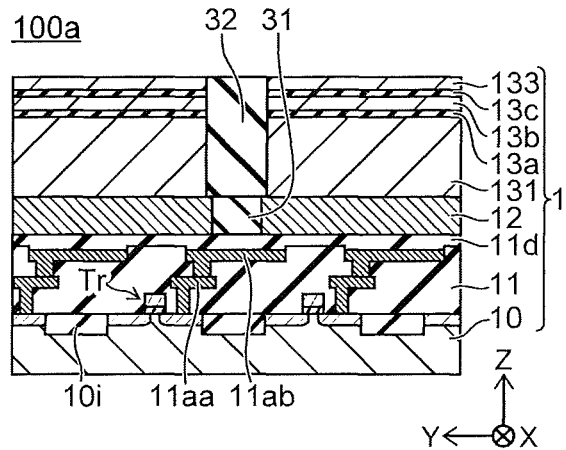
Figure 14C:
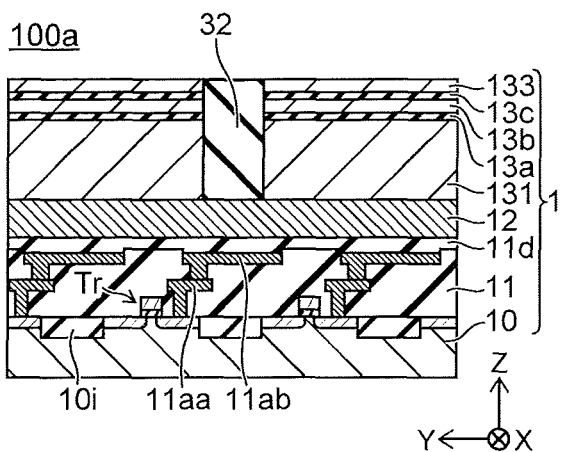
Figure 14D:
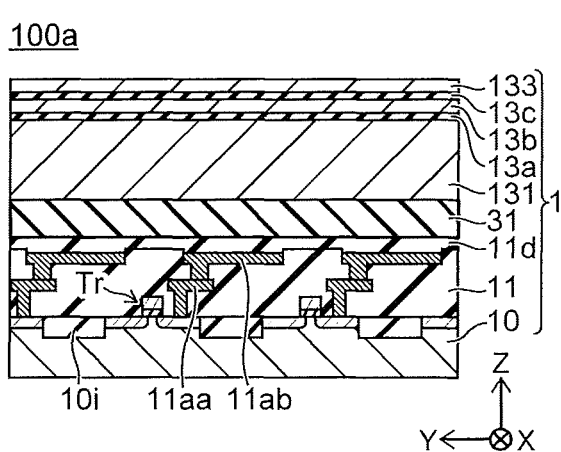
Figure 15A:
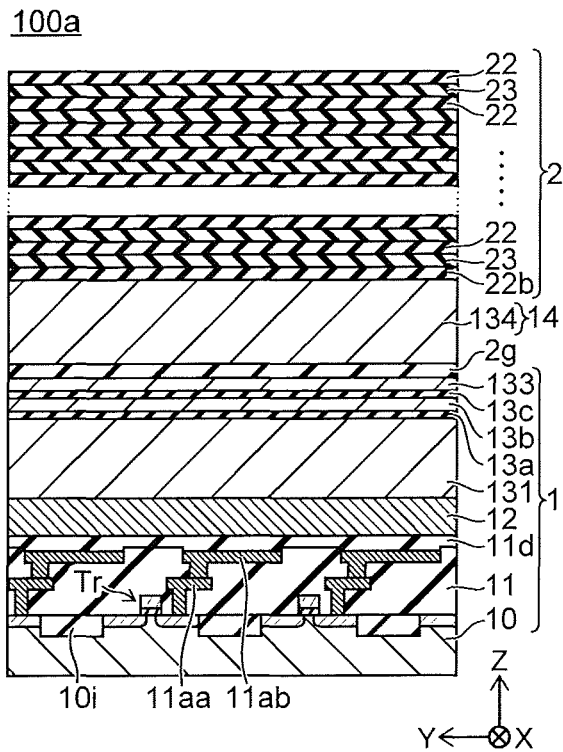
Figure 15B:
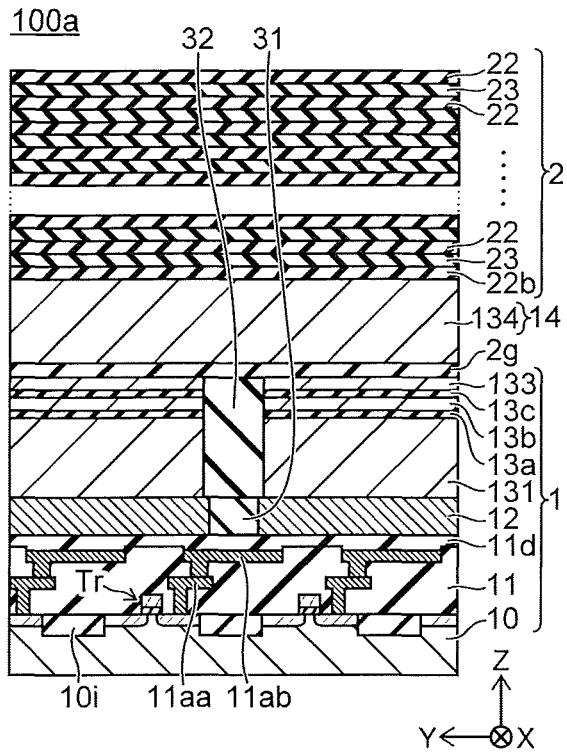
Figure 15C:
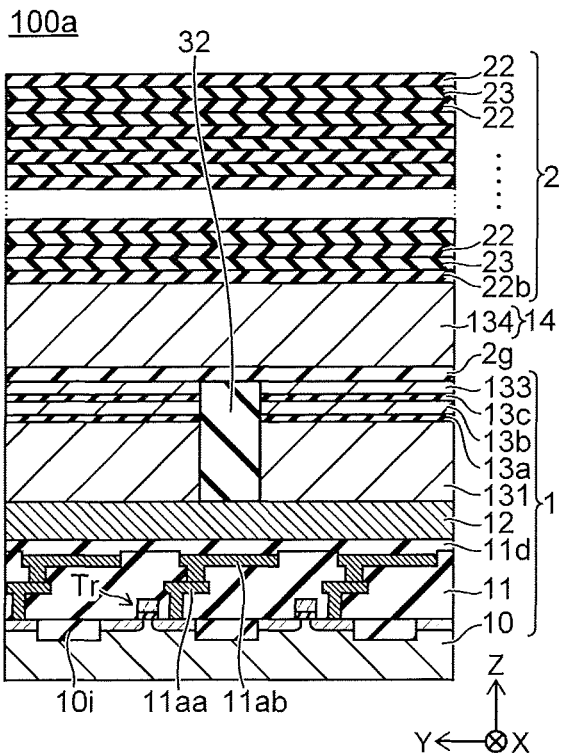
Figure 15D:
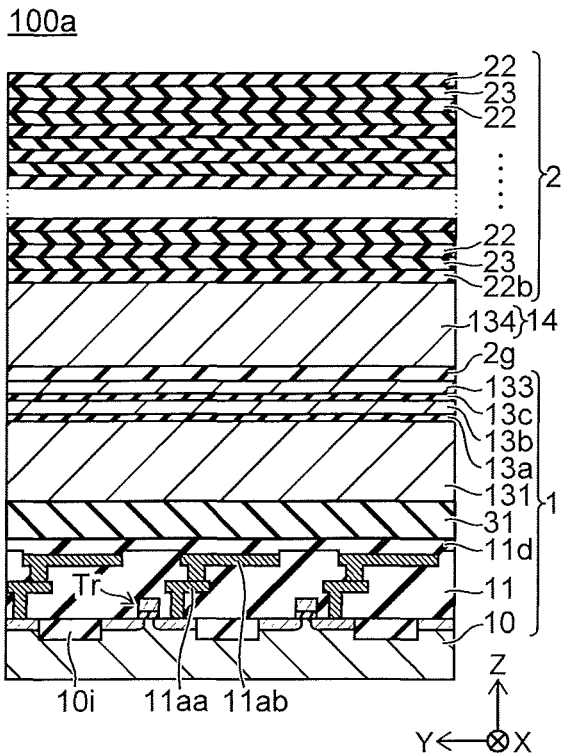
Figure 16A:
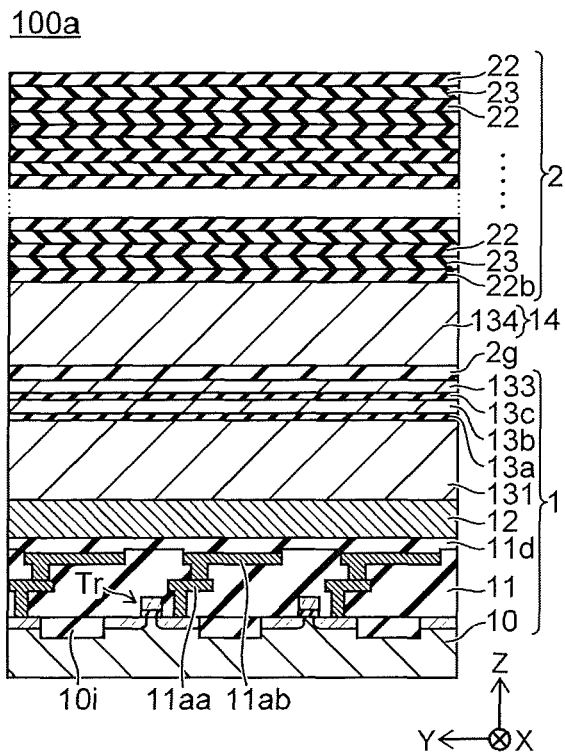
Figure 16B:
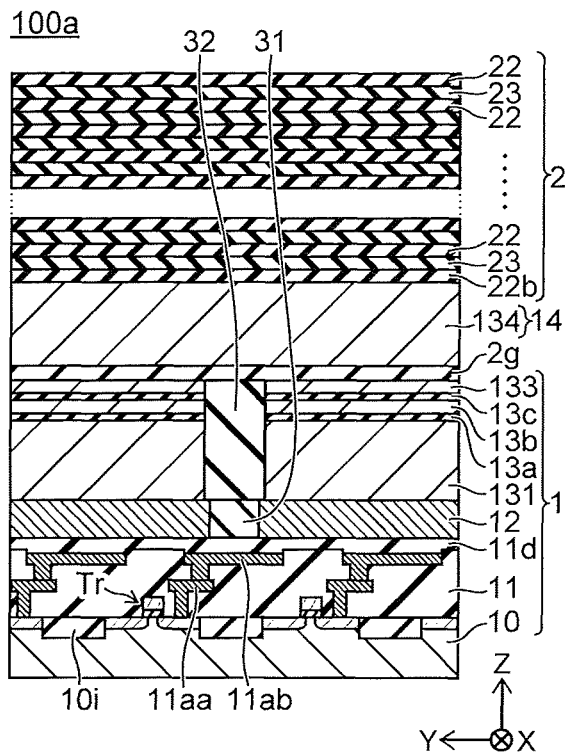
Figure 16C:
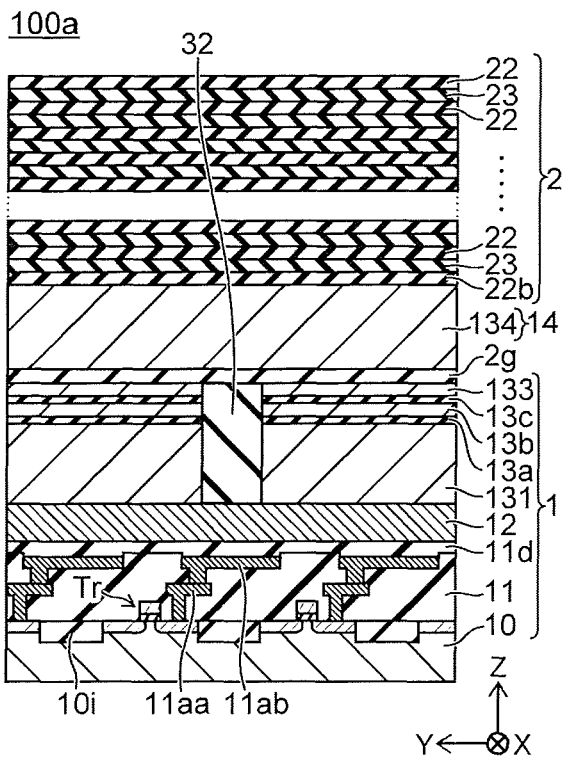
Figure 16D:
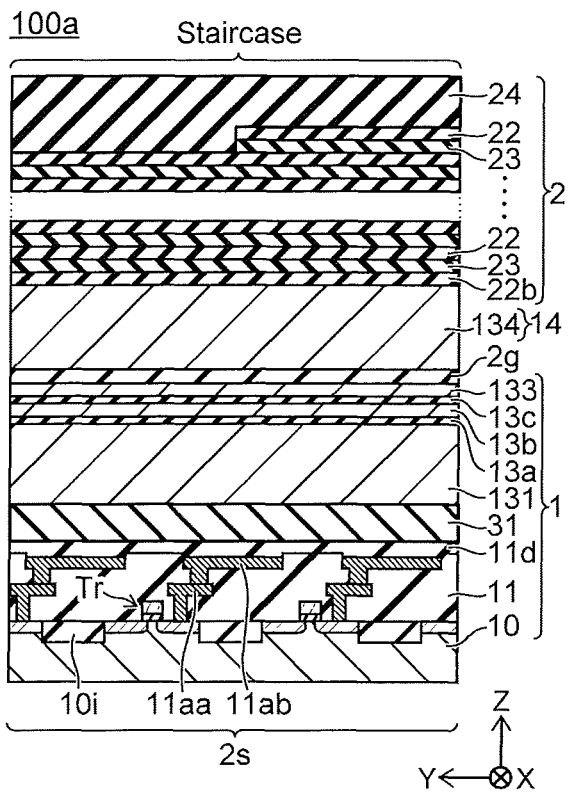
Figure 17A:
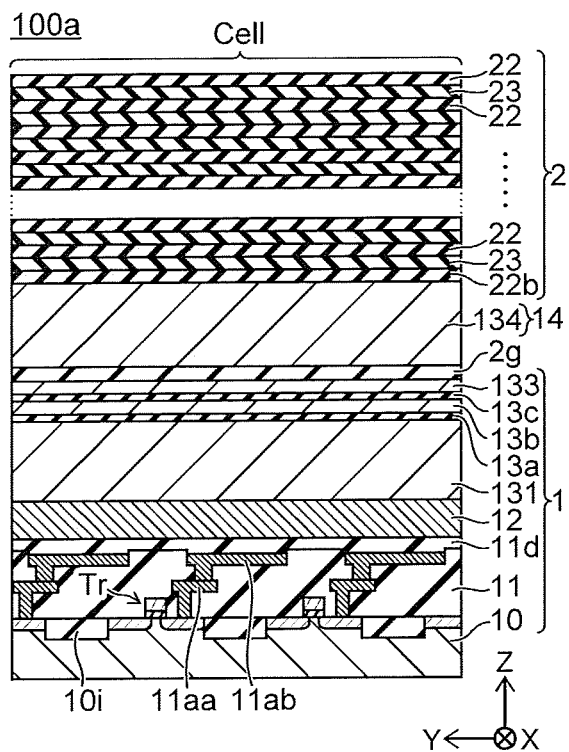
Figure 17B:
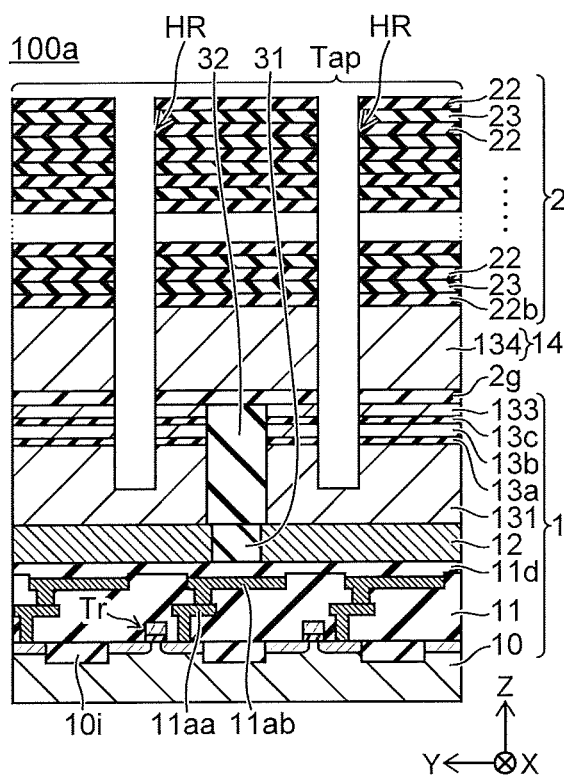
Figure 17C:
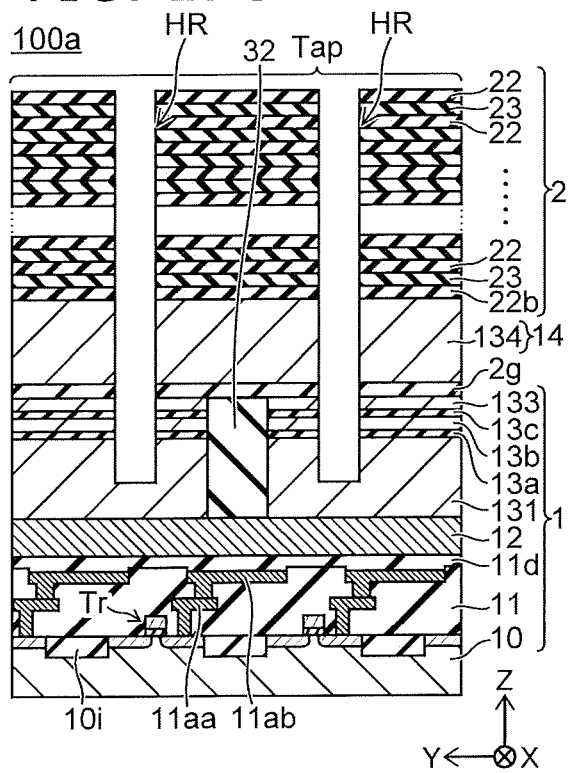
Figure 17D:
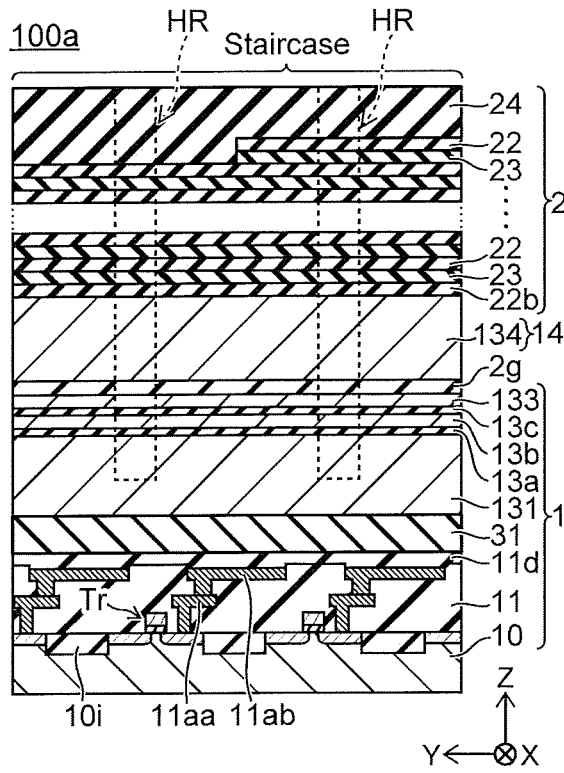
Figure 18A:
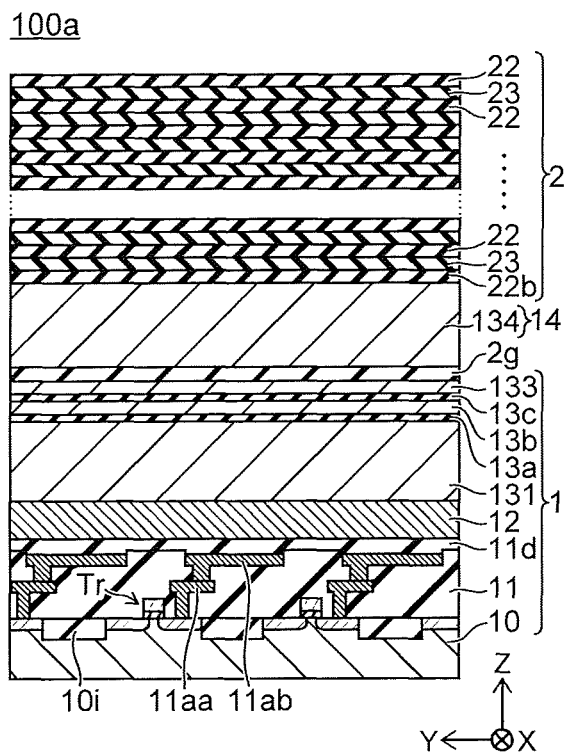
Figure 18B:
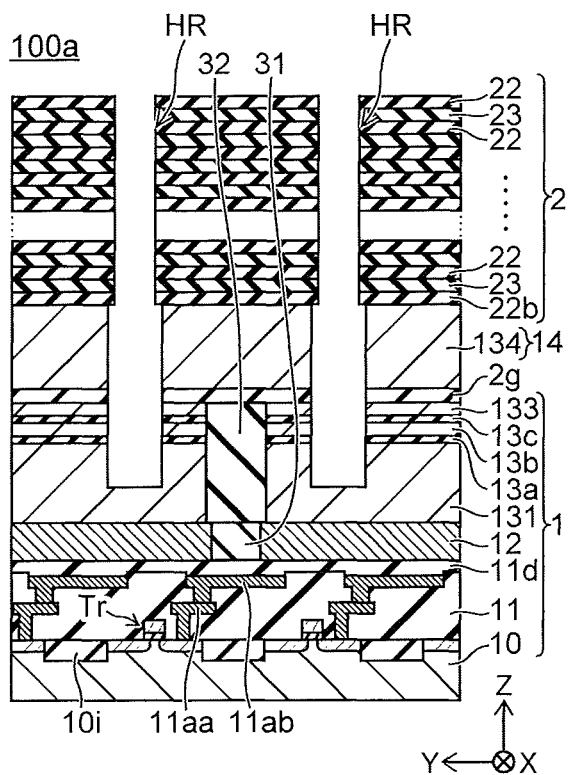
Figure 18C:
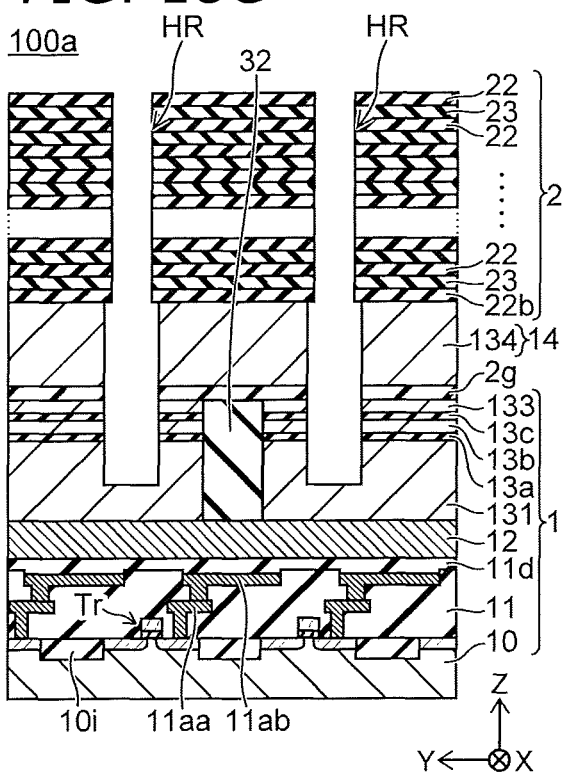
Figure 18D:
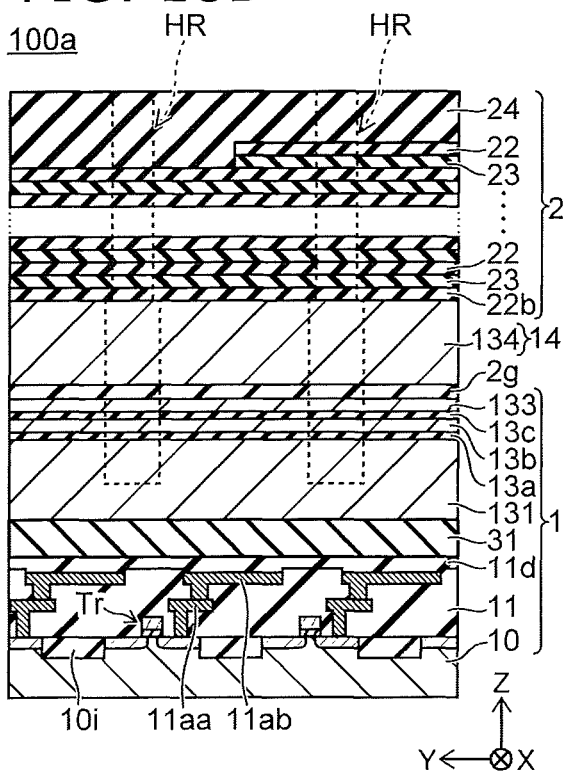
Figure 19A:
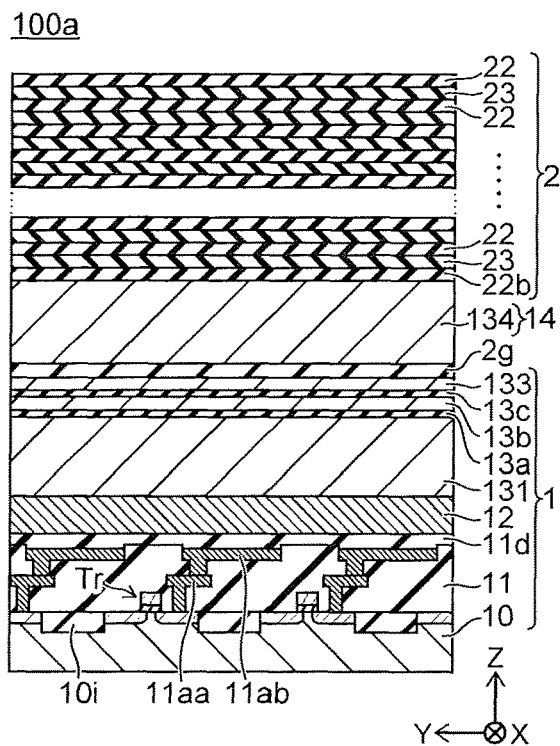
Figure 19B:
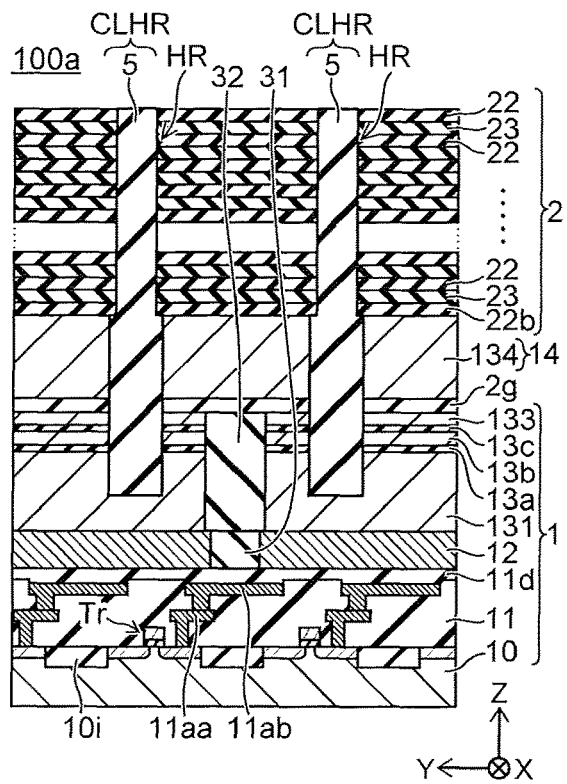
Figure 19C:
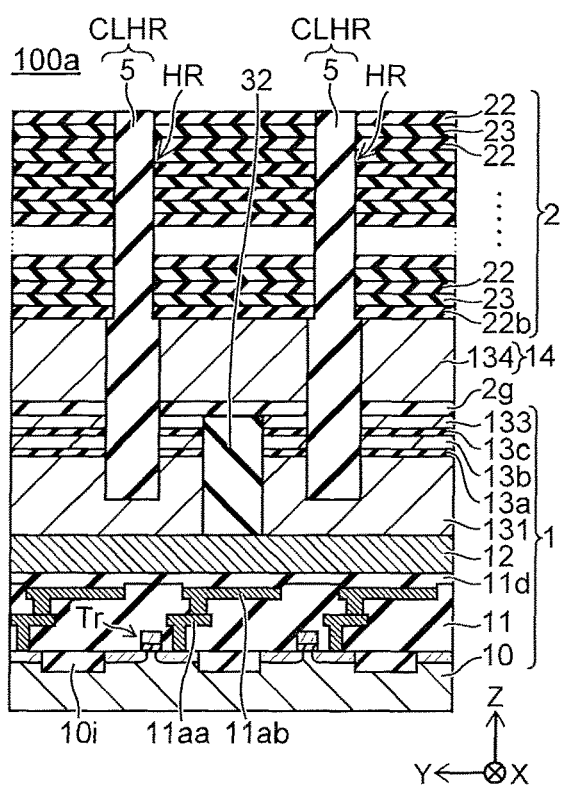
Figure 19D:
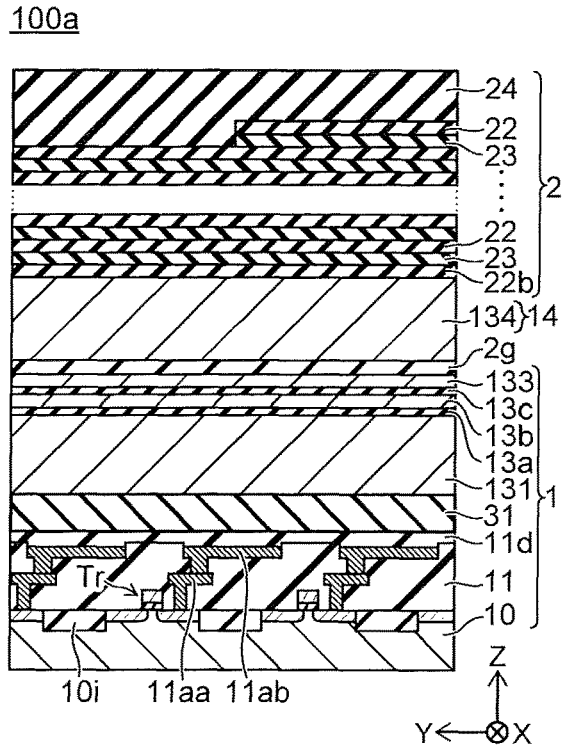
Figure 20A:
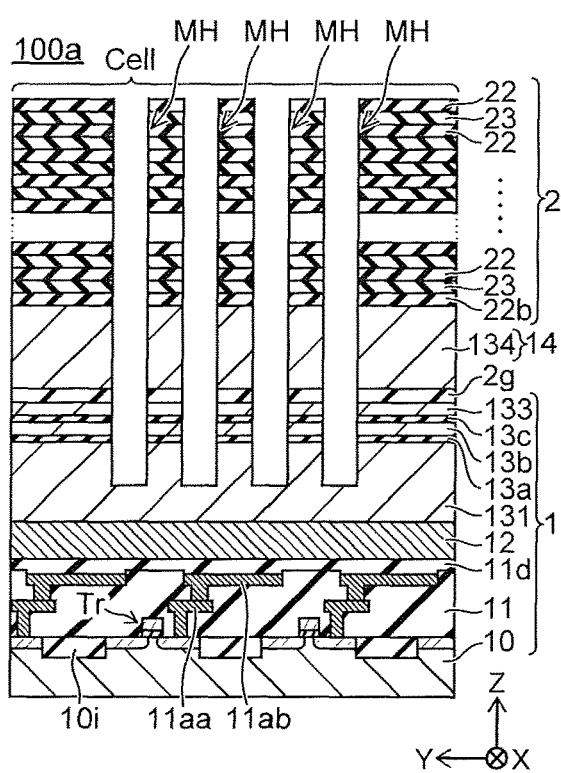
Figure 20B:
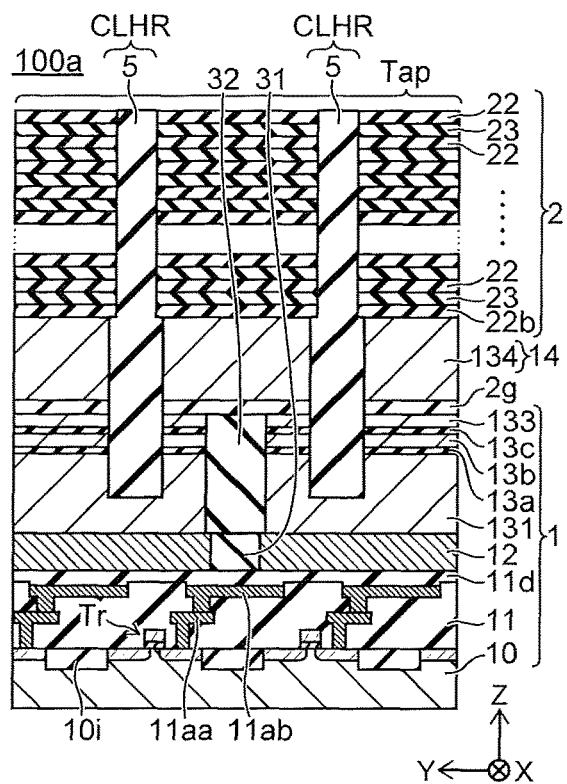
Figure 20C:
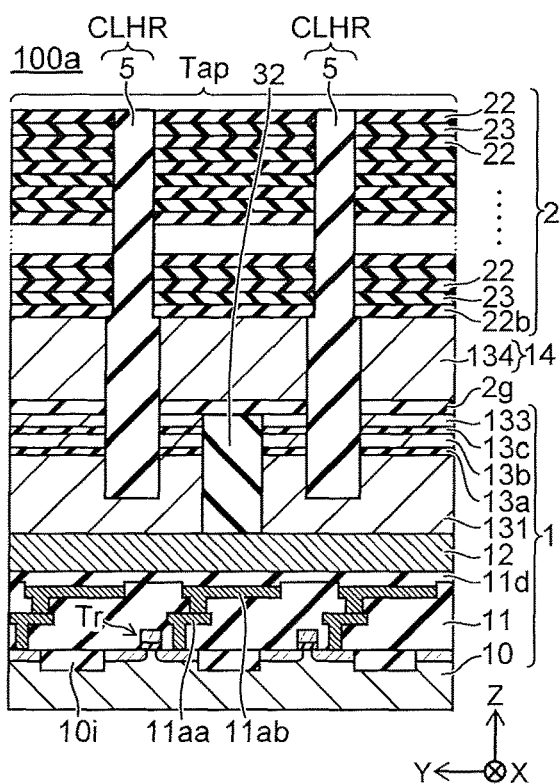
Figure 20D:
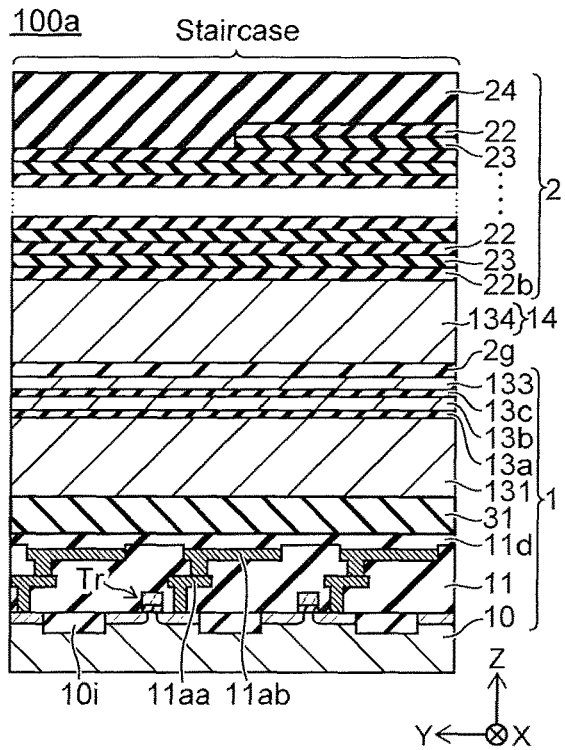
Figure 22A:
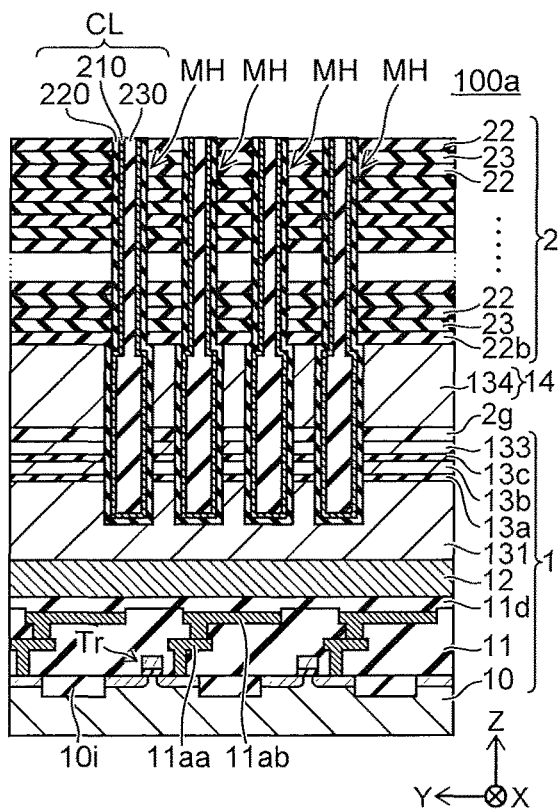
Figure 22B:
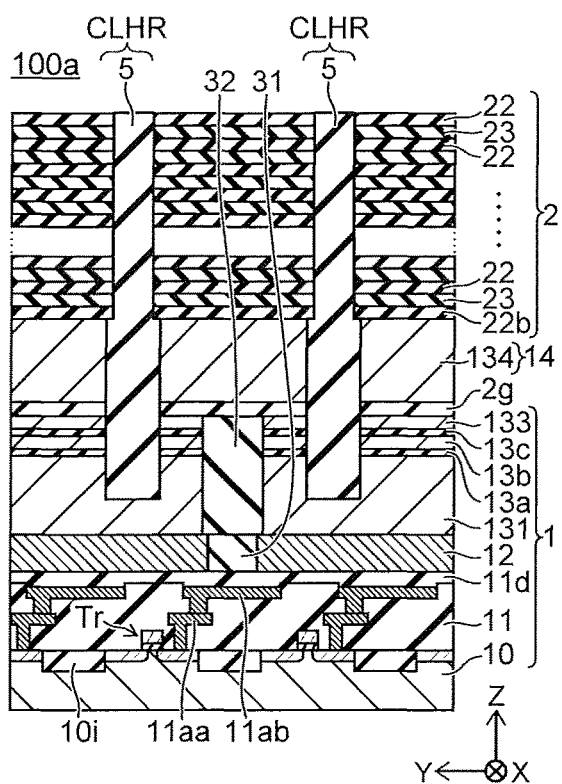
Figure 22C:
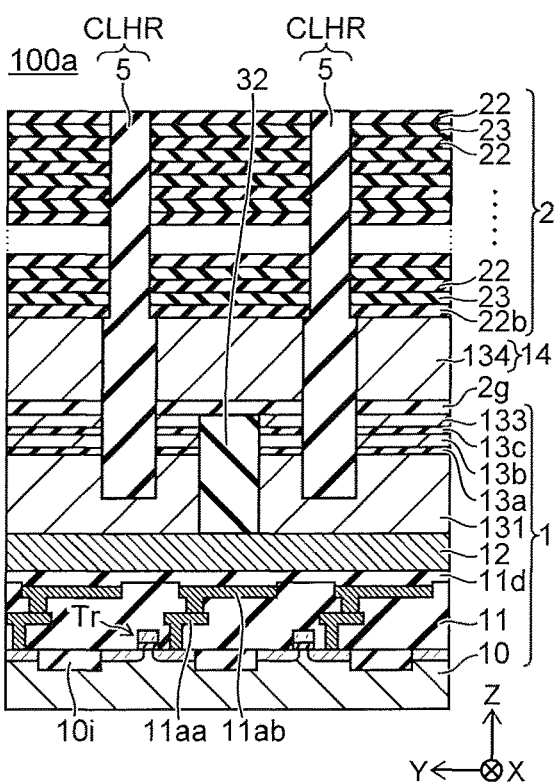
Figure 22D:
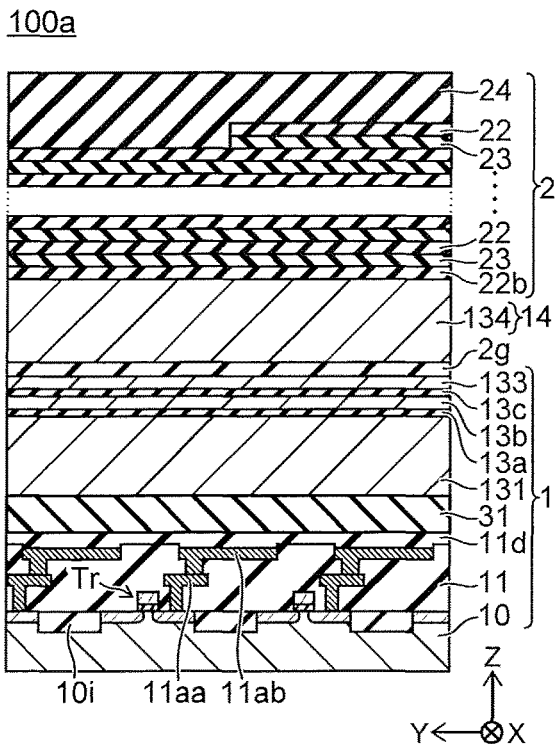
Figure 23A:
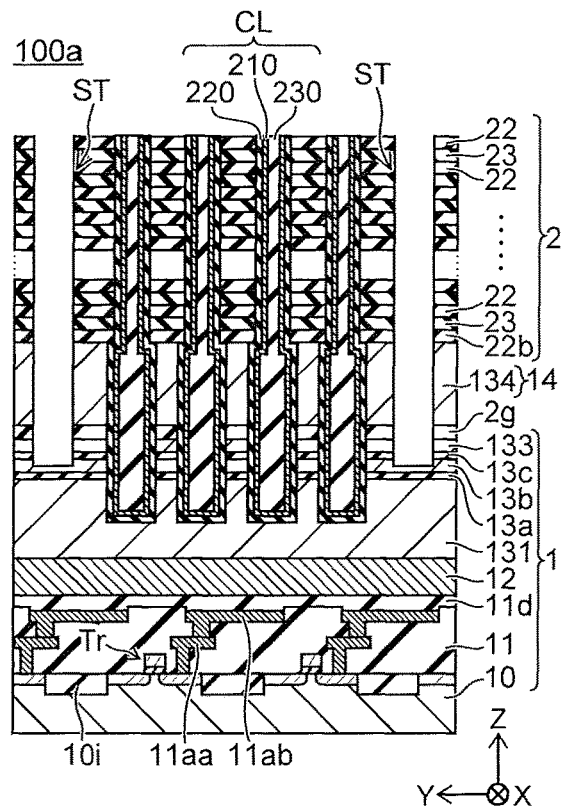
Figure 23B:
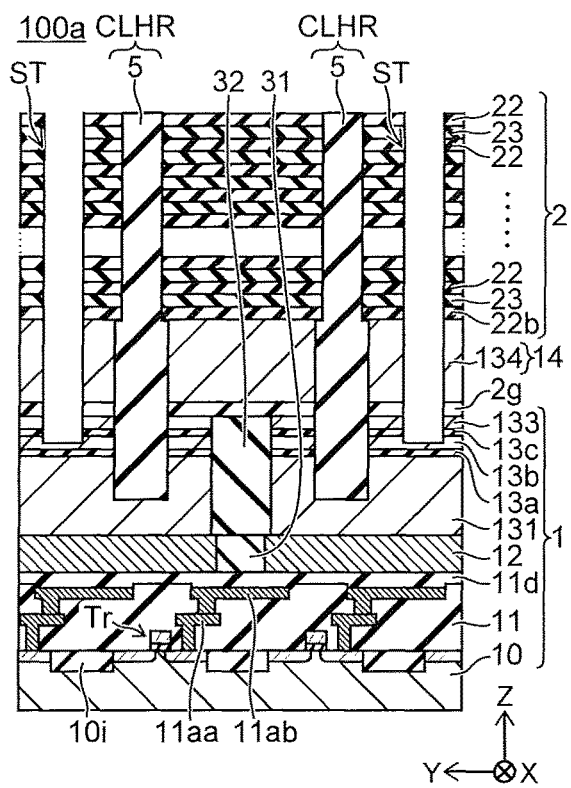
Figure 23C:
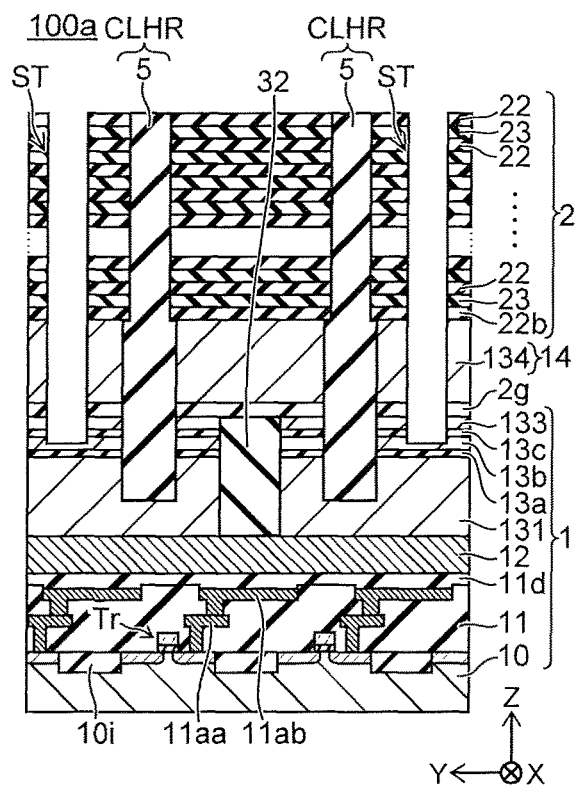
Figure 23D:
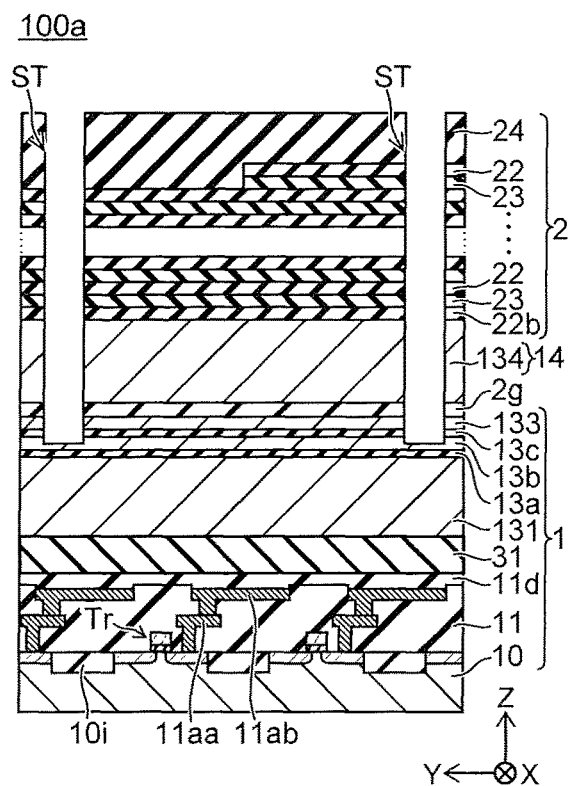
Figure 24A:
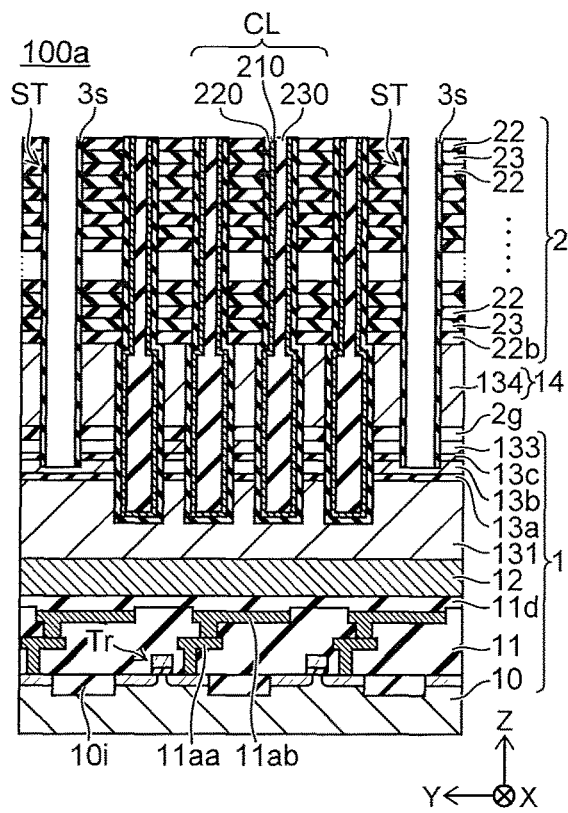
Figure 24B:
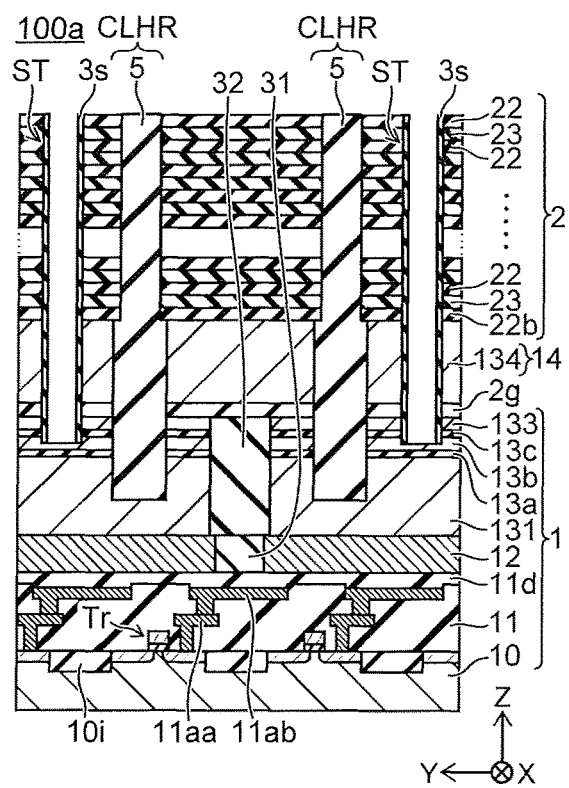
Figure 24C:
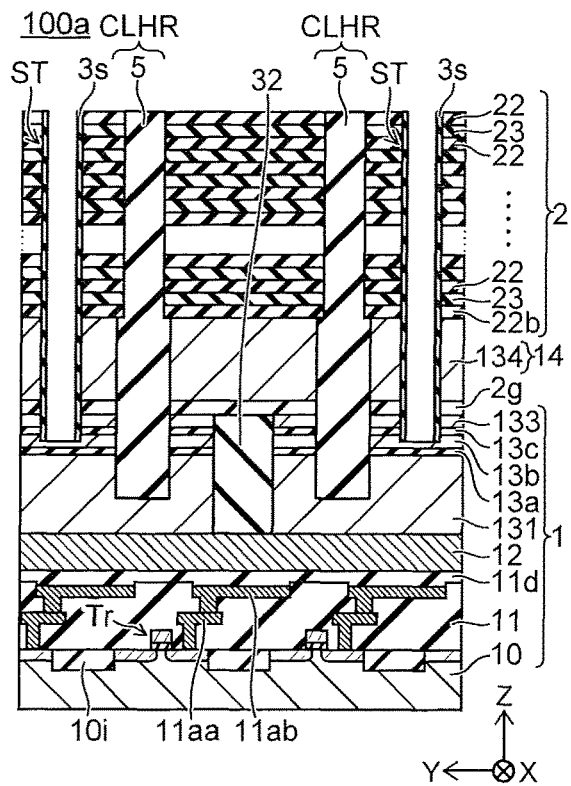
Figure 24D:
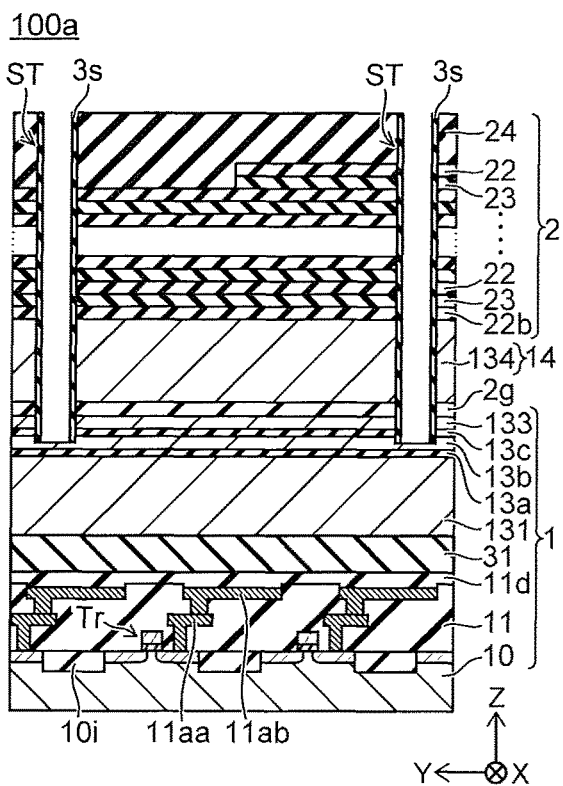
Figure 25A:
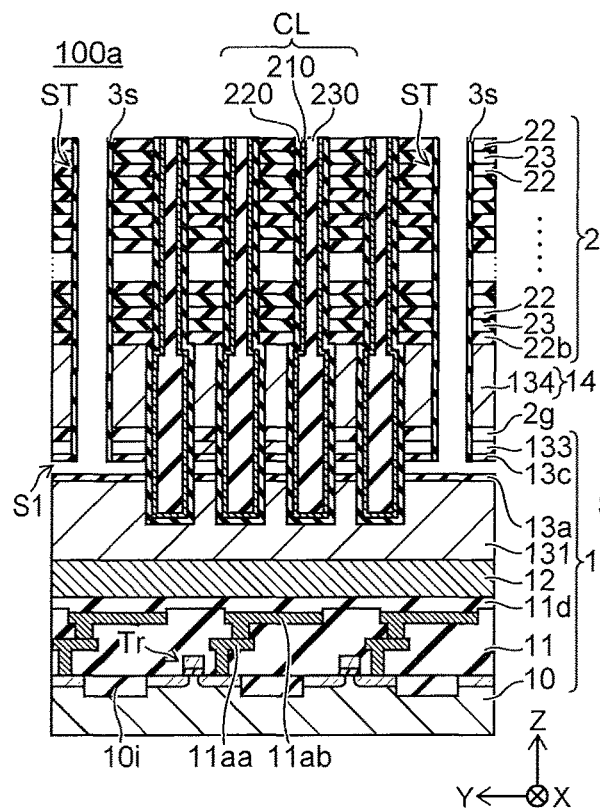
Figure 25B:
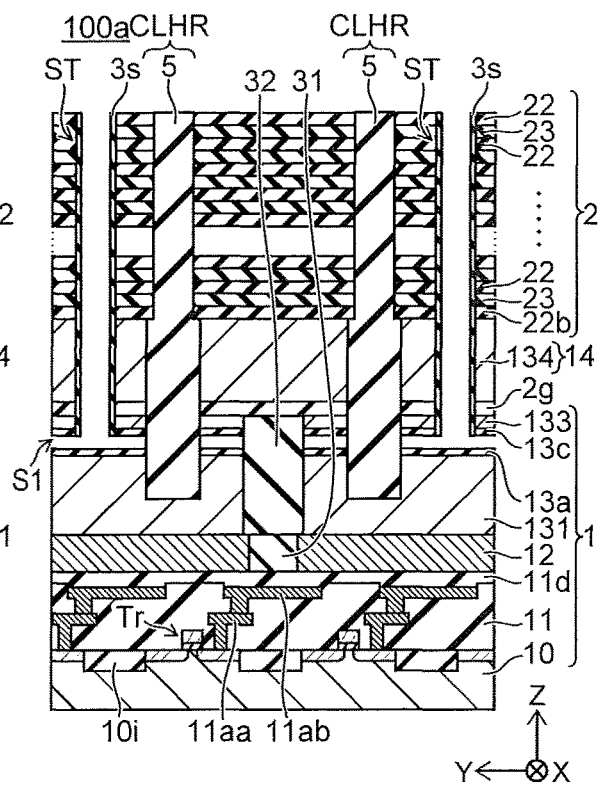
Figure 25C:
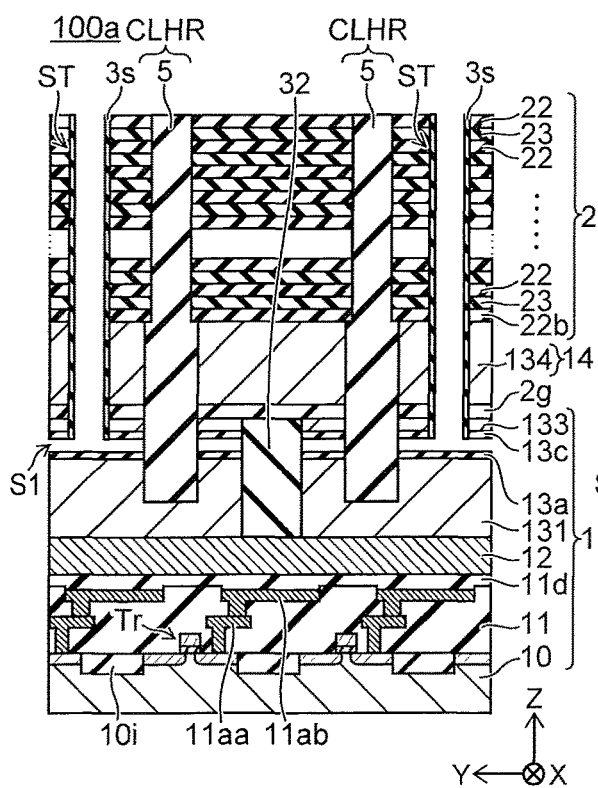
Figure 25D:
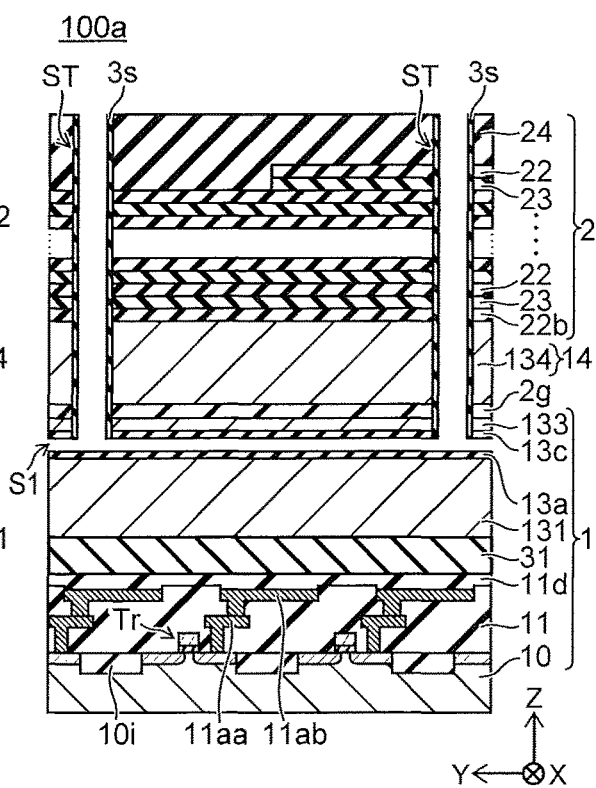
Figure 26A:
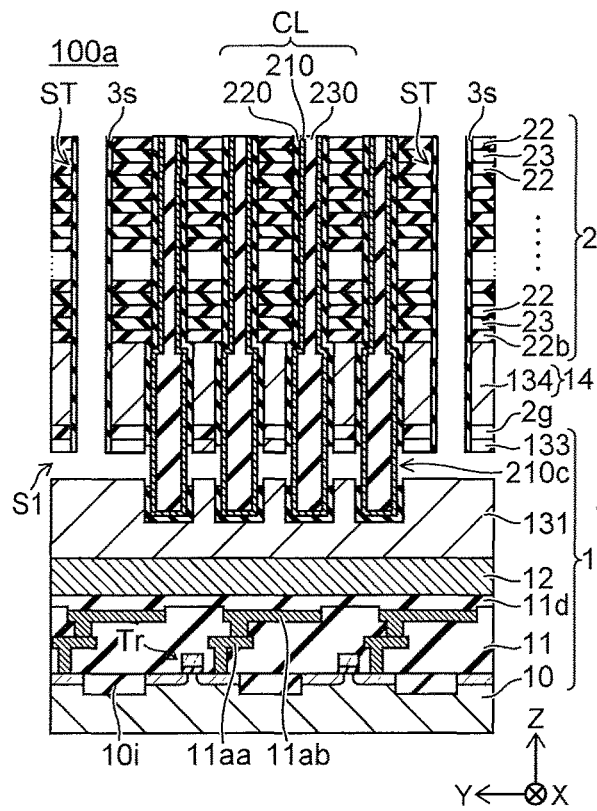
Figure 26B:
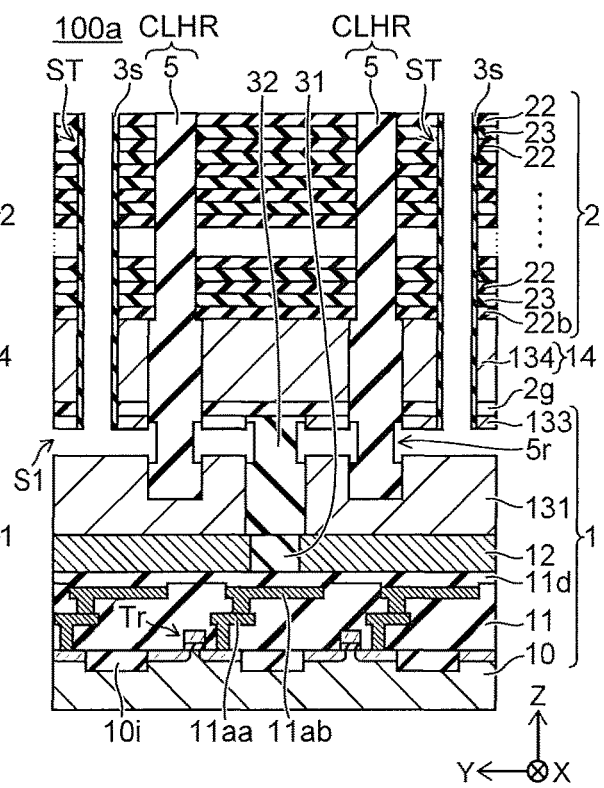
Figure 26C:
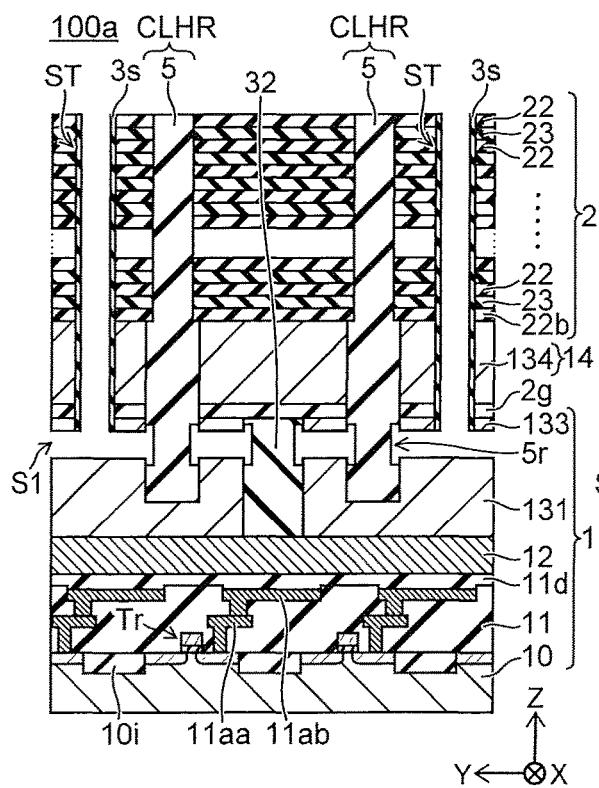
Figure 26D:
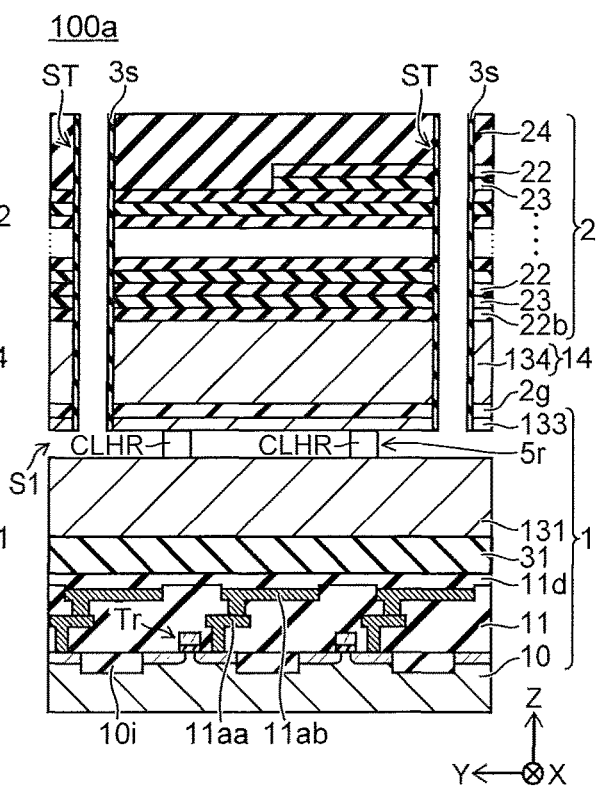
Figure 27A:
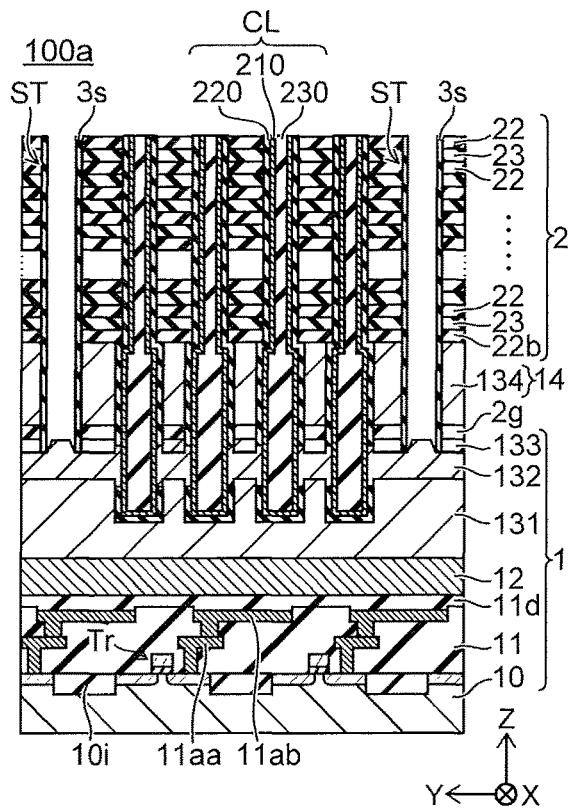
Figure 27B:
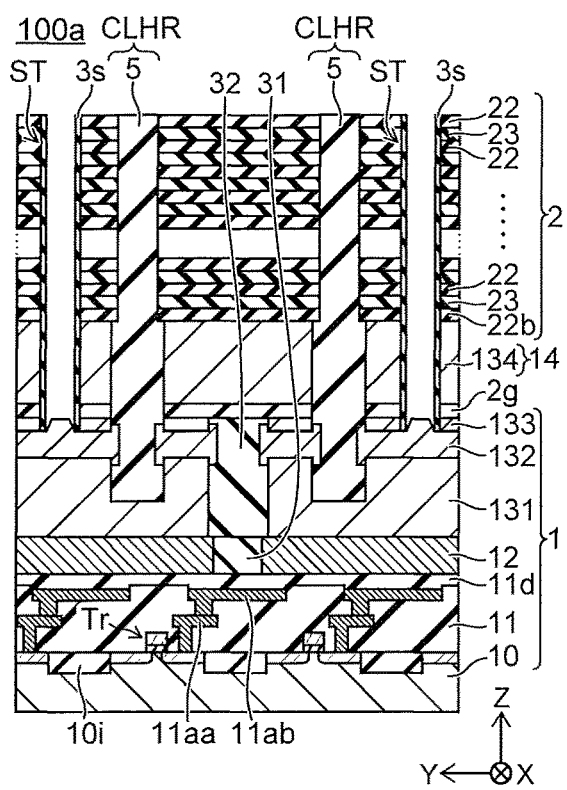
Figure 27C:
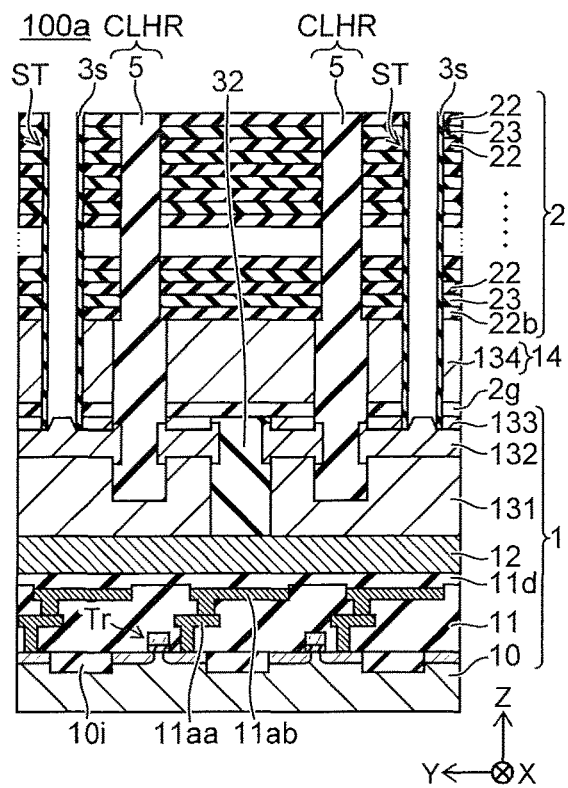
Figure 27D:
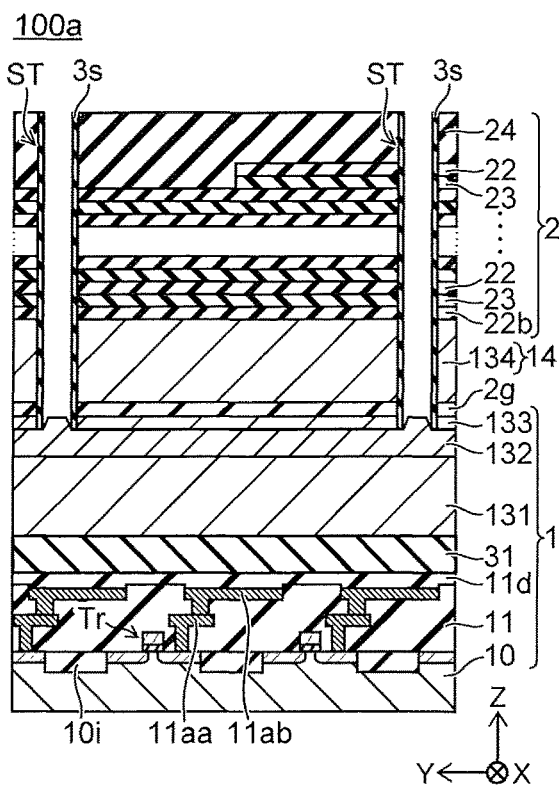
Figure 28A:
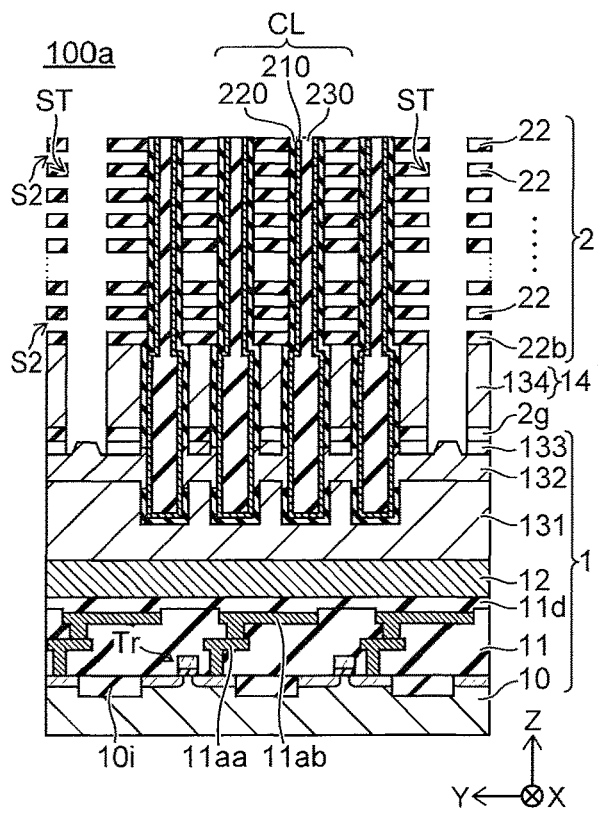
Figure 28B:
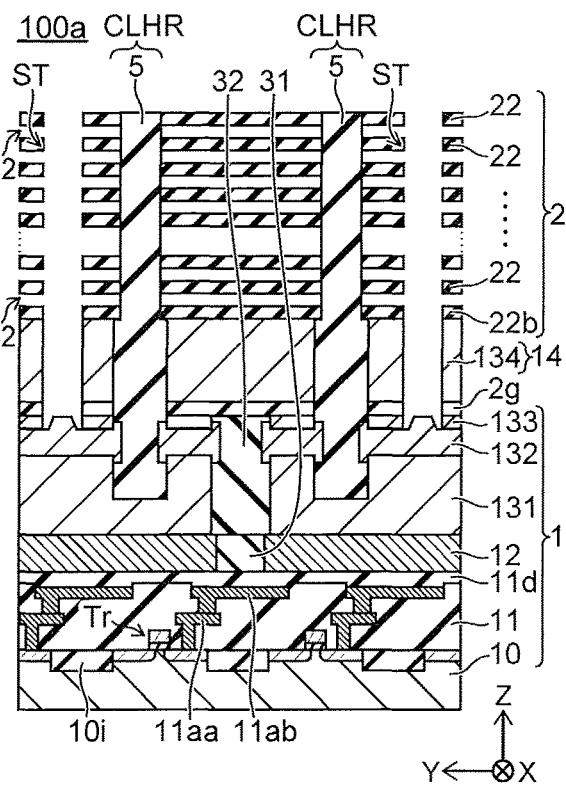
Figure 28C:
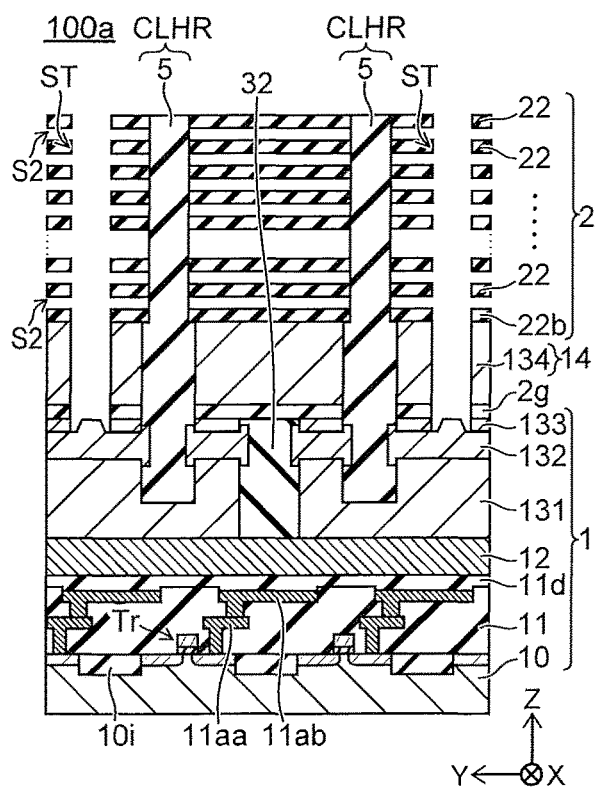
Figure 28D:
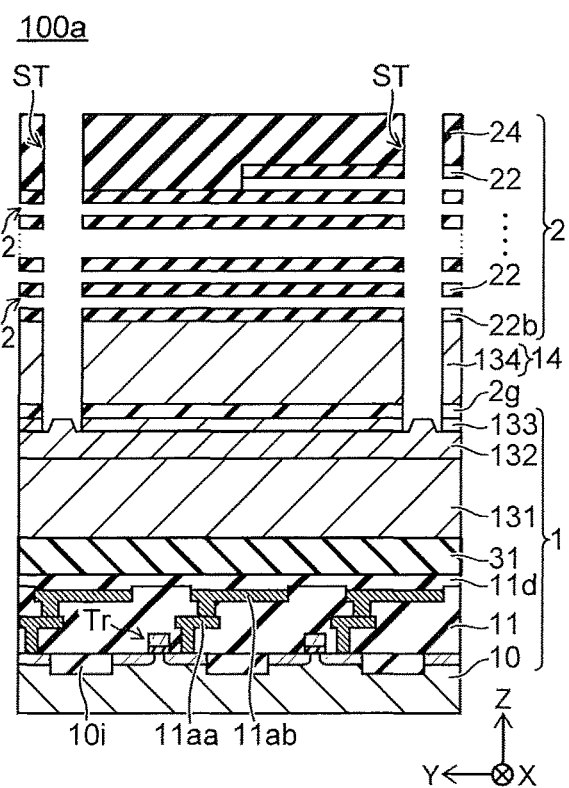
Figure 29A:
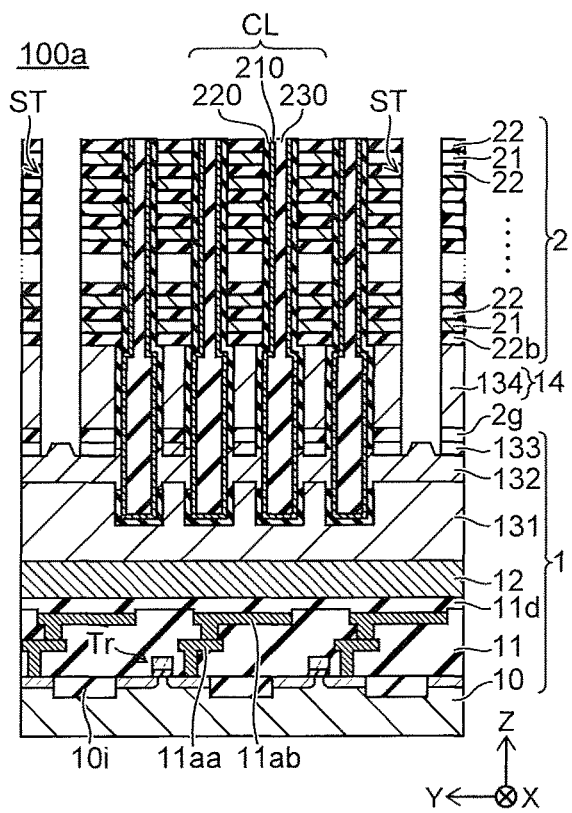
Figure 29B:
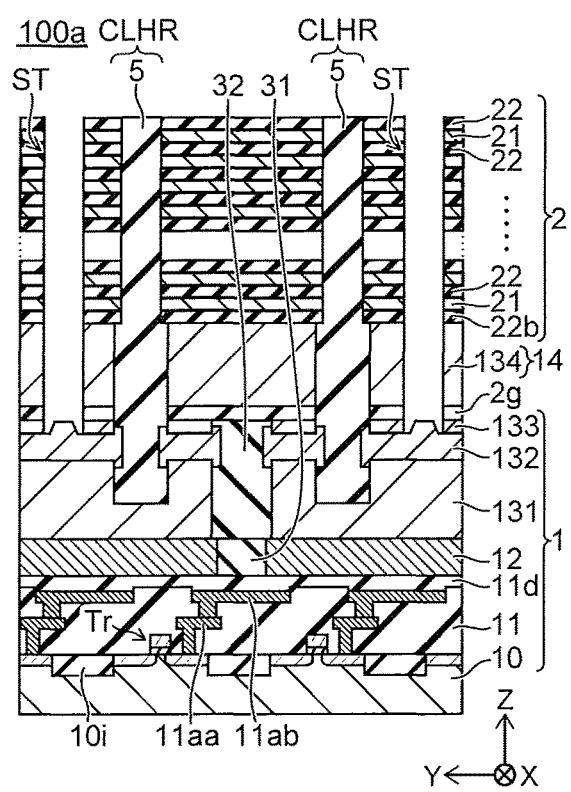
Figure 29C:
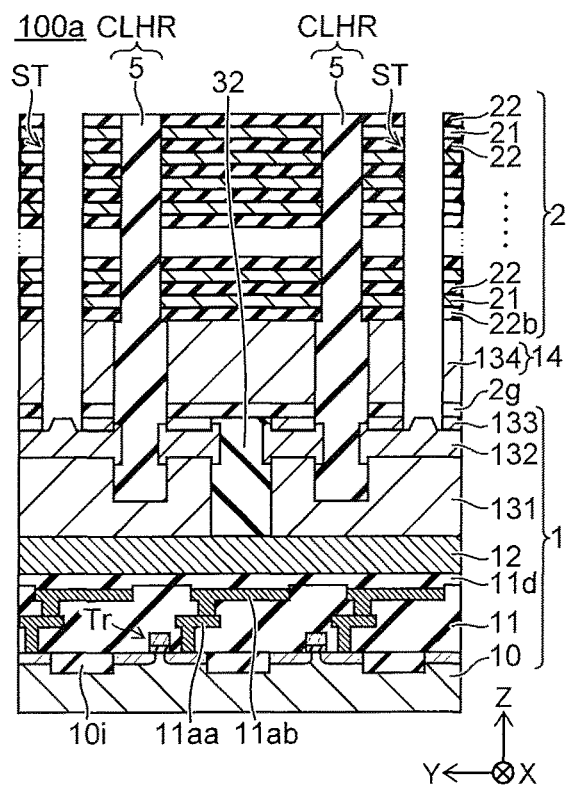
Figure 29D:
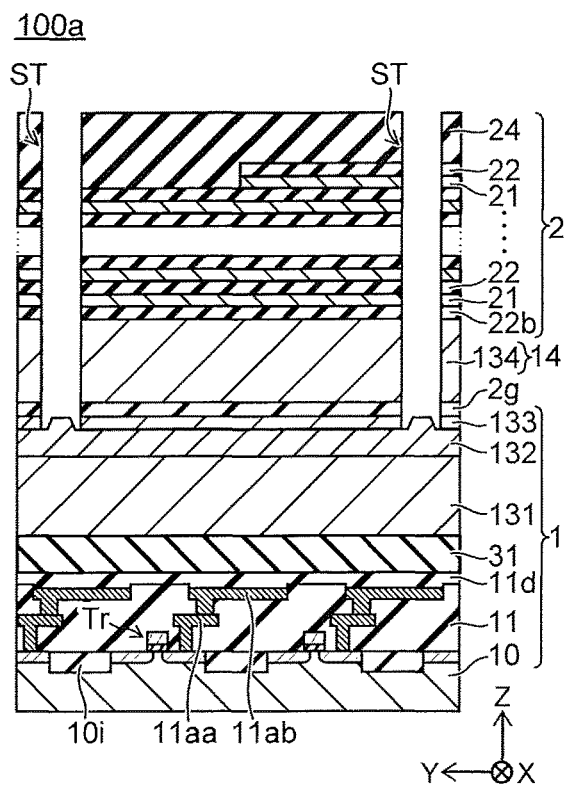
Figure 30A:
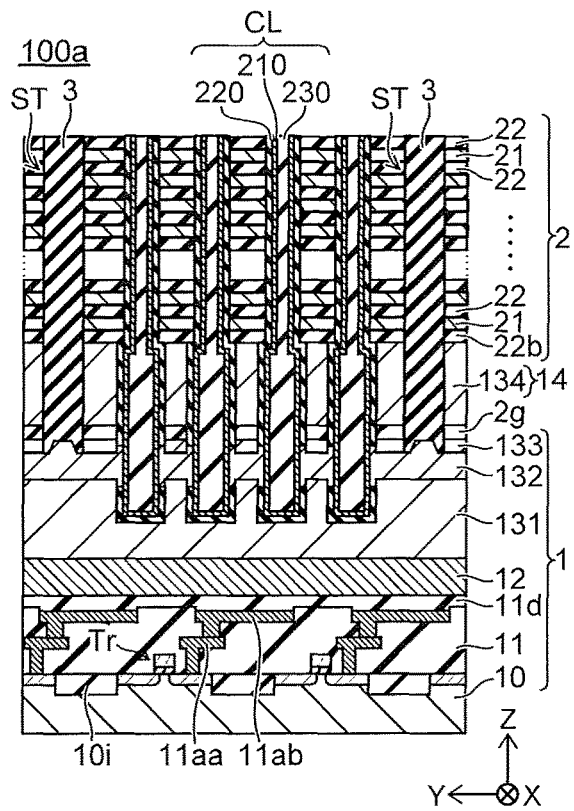
Figure 30B:
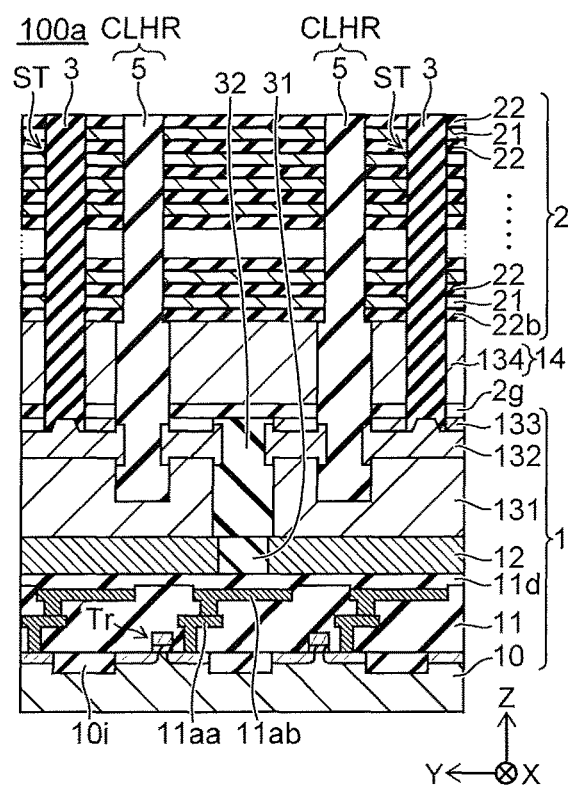
Figure 30C:
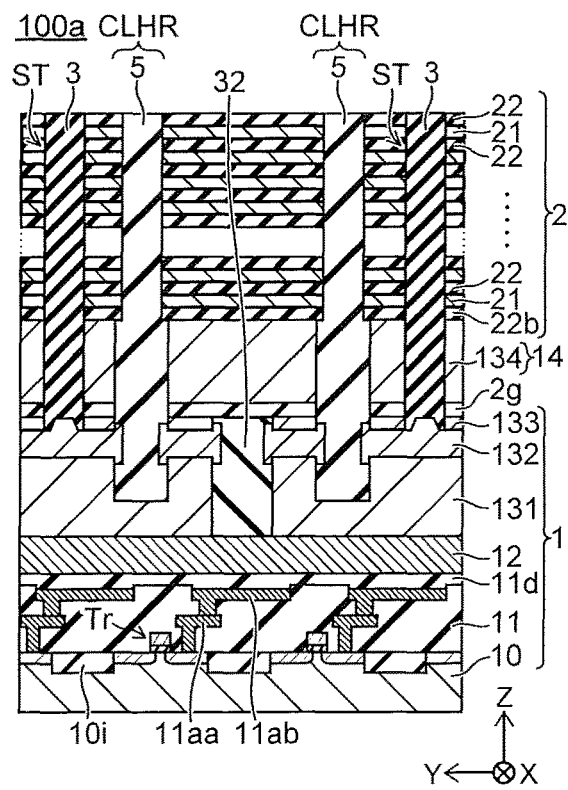
Figure 30D:
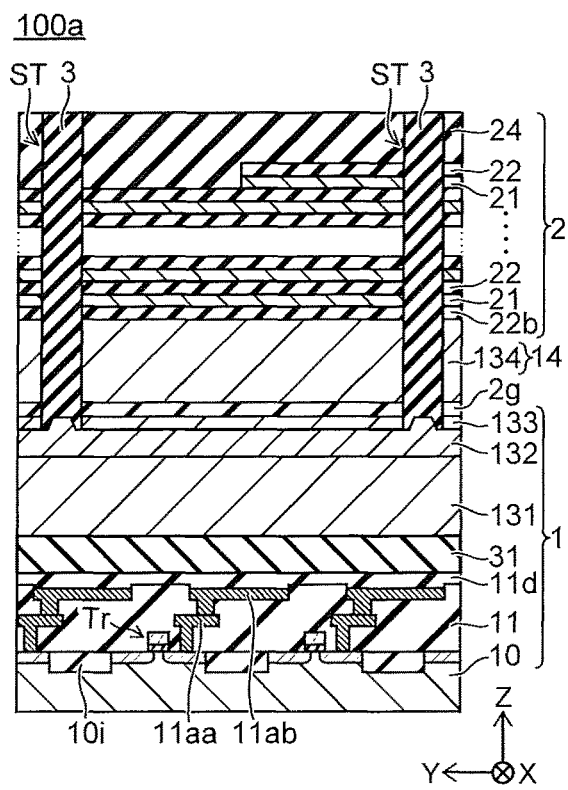
Figure 31A:
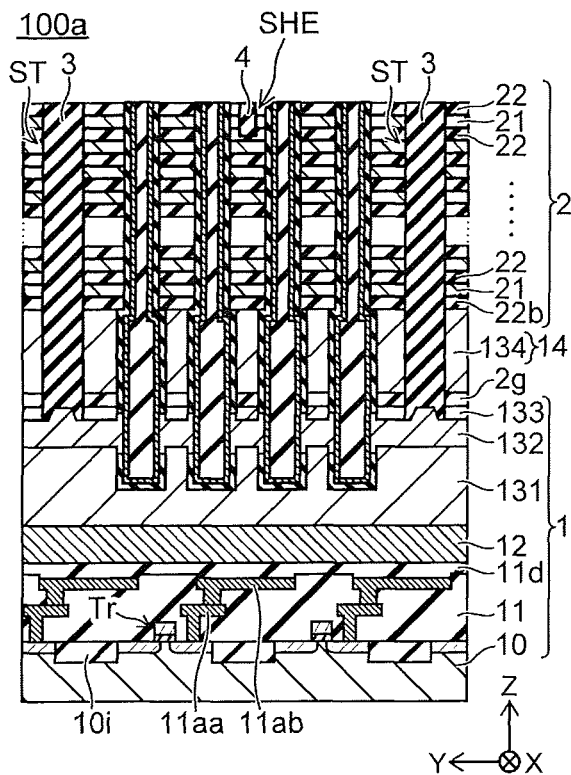
Figure 31B:
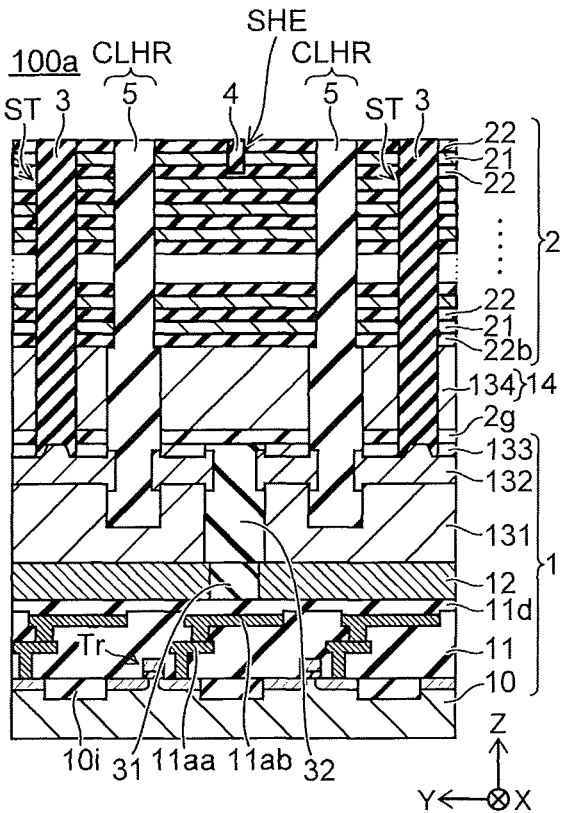
Figure 31C:
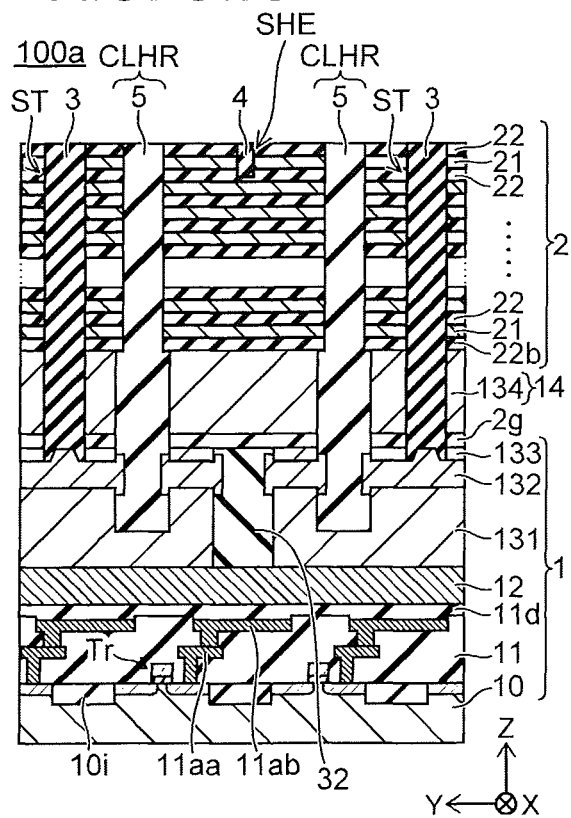
Figure 31D:
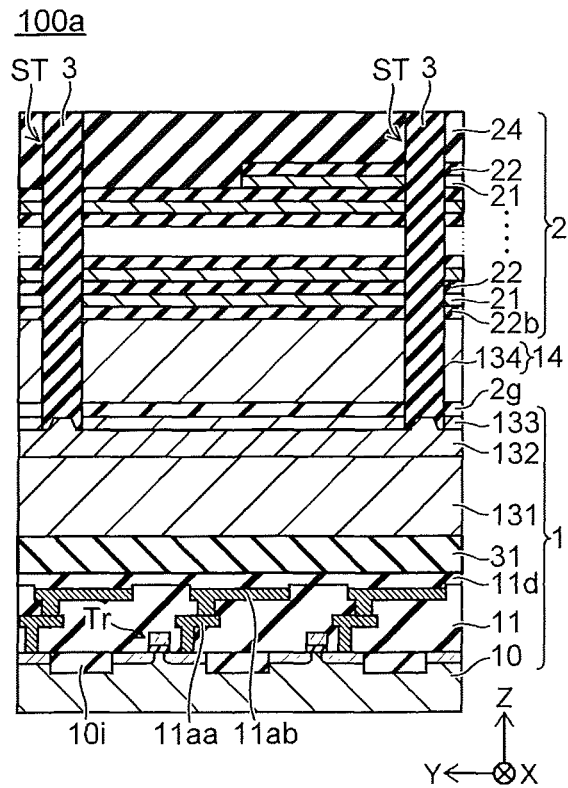
Figure 32A:
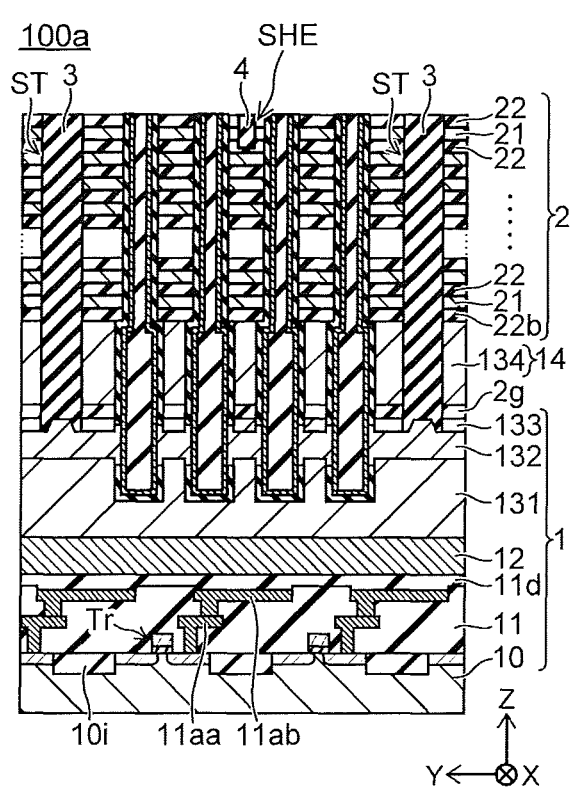
Figure 32B:
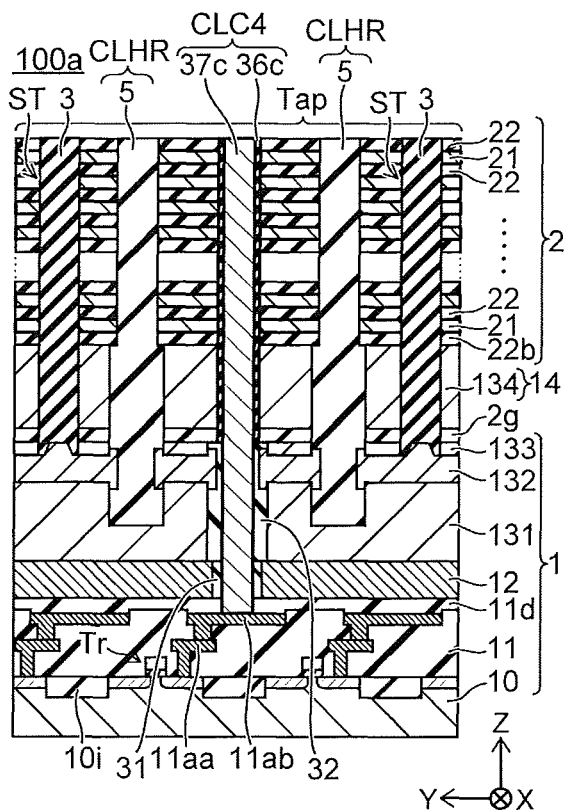
Figure 32C:
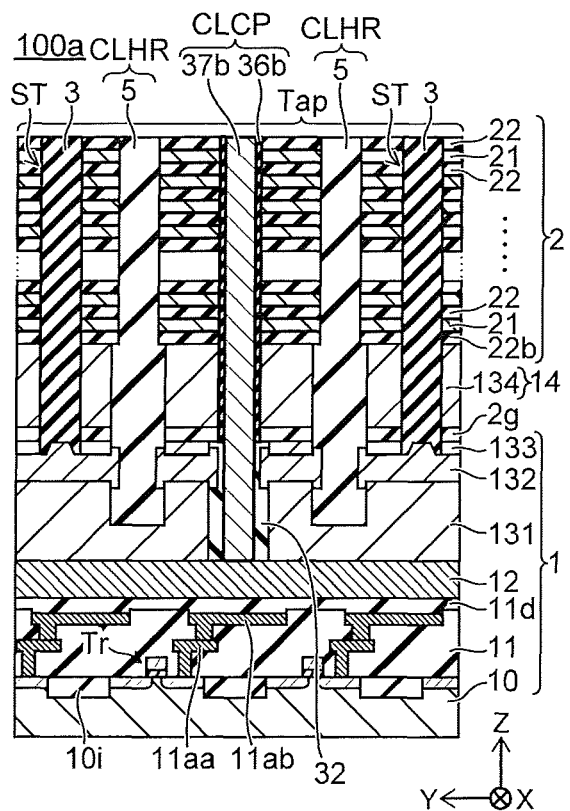
Figure 32D:
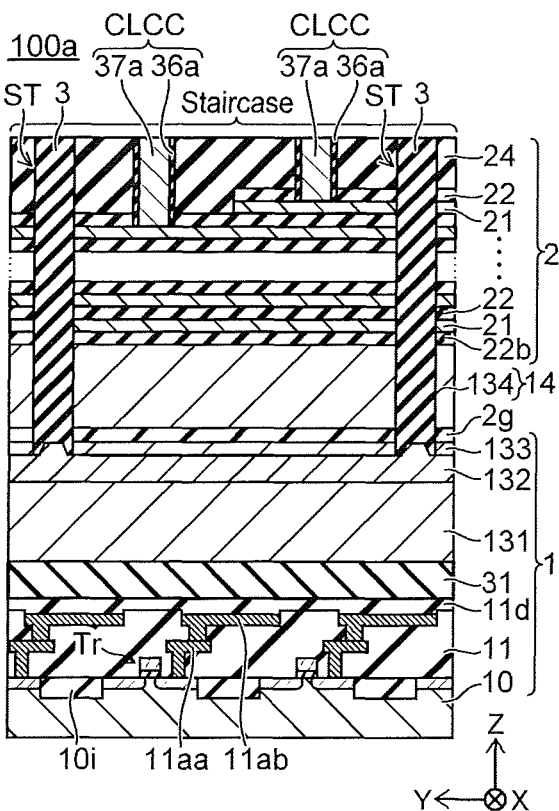

FIG. 10 is a schematic plan view illustrating the semiconductor device 100a according to the first embodiment.

FIG. 11A to FIG. 32D are schematic cross-sectional views sequentially illustrating the processes, which show the method for manufacturing the semiconductor device 100a according to the first embodiment. The plan view shown in FIG. 10 corresponds to the plan view shown in FIG. 3. The cross sections shown in FIG. 11A to FIG. 32A are along line A-A shown in FIG. 10, The cross sections shown in FIG. 11B to FIG. 32B are along line B-B shown in FIG. 10, The cross sections shown in FIG. 11C to FIG. 32C are along line C-C shown in FIG. 10. The cross sections shown in FIG. 11D to FIG. 32D are along line D-D shown in FIG. 10.

As shown in FIG. 11A to FIG. 11D, the element separation region 10i is formed inside the substrate 10; and the transistor Tr is formed inside the active area AA. Continuing, the first insulating film 11 is formed on the substrate 10. The first insulating film 11 is, for example, an inter-layer insulating film and includes the interconnect 11a, The interconnect 11a is, for example, a multilayer interconnect; and an interconnect 11aa and an interconnect 11ab provided above the interconnect 11aa are illustrated in FIG. 11A to FIG. 11D. Continuing, an insulating film 11d is formed on the interconnect 11ab. The insulating film 11d includes, for example, silicon oxide. Continuing, the first conductive film 12 is formed on the insulating film 11d.

Then, as shown in FIG. 12A to FIG. 12D, the first conductive film 12 is etched; and the first conductive film 12 is patterned into a designed pattern. It is sufficient for the first conductive film 12 to remain inside the memory cell array 2m; and, for example, the first conductive film 12 is removed in the staircase portion 25. The first conductive film 12 also is removed from the portions where the interconnects 37c are formed in the tap region (Tap) inside the memory cell array 2m. The interconnects 37c are electrically connected to the interconnects 11ab. Continuing, an insulating film 31 is formed by filling, with an insulator, the clearance made by patterning the first conductive film 12. The insulating film 31 includes, for example, silicon oxide.

Continuing as shown in FIG. 13A to FIG. 13D, the first semiconductor layer 131 is formed on the first conductive film 12 and the insulating film 31. The first semiconductor layer 131 includes, for example, n-type doped silicon. Continuing, the first intermediate film 13a is formed on the first semiconductor layer 131. The first intermediate film 13a includes, for example, silicon oxide. Continuing, the first sacrificial film 13b is formed on the first intermediate film 13a. The first sacrificial film 13b includes, for example, n-type doped silicon or undoped silicon. Continuing, the second intermediate film 13c is formed on the first sacrificial film 13b. The second intermediate film 13c includes, for example, silicon oxide. Continuing, the third semiconductor layer 133 is formed on the second intermediate film 13c. The third semiconductor layer 133 includes, for example, n-type doped silicon or undoped silicon. Thereby, for example, the basic structure of the base body 1 when manufacturing is obtained.

Then, as shown in FIG. 14A to FIG. 14D, the third semiconductor layer 133, the second intermediate film 13c, the first sacrificial film 13b, the first intermediate film 13a, and the first semiconductor layer 131 are etched; and these films are patterned into a designed pattern. Continuing, an insulating film 32 is formed by filling, with an insulator, the opening made by patterning these films. The insulating film 32 includes, for example, silicon oxide.

Continuing as shown in FIG. 15A to FIG. 15D, the insulating film 2g is formed on the third semiconductor layer 133 and the insulating film 32. The insulating film 2g includes, for example, silicon oxide or a metal oxide. Continuing, the fourth semiconductor layer 134 is formed on the insulating film 2g. The fourth semiconductor layer 134 includes, for example, n-type doped silicon. Thereby, the second semiconductor part 14 is formed, Continuing, the insulating layer 22b is formed on the fourth semiconductor layer 134. Continuing, second sacrificial films 23 and the insulating layers 22 are stacked alternately on the insulating layer 22b. The insulating layers 22 and 22b each include, for example, silicon oxide. The second sacrificial films 23 include, for example, silicon nitride. Thereby, the basic structure of the stacked body 2 when manufacturing that is positioned in the Z-axis direction with respect to the first semiconductor part 13 is obtained.

Then, as shown in FIG. 16A to FIG. 16D, the insulating layers 22 and the second sacrificial films 23 are patterned into a staircase configuration in the staircase portion 2s. Thereby, the staircase region (Staircase) is obtained in the staircase portion 2s. Continuing, an insulating film 24 is formed by filling the recess formed in the staircase region with an insulator. The insulating film 24 includes, for example, silicon oxide.

Continuing as shown in FIG. 17A to FIG. 17D, the holes HR are formed by performing anisotropic etching of the stacked body 2, the fourth semiconductor layer 134, the insulating film 2g, the third semiconductor layer 133, the second intermediate film 13c, the first sacrificial film 13b, the first intermediate film 13a, and the first semiconductor layer 131 in the tap region (Tap) and the staircase region (Staircase). The holes HR are formed partway through the first semiconductor layer 131 from the upper end of the stacked body 2, In the specification, reactive ion etching (RIE) is a specific example of the anisotropic etching. For example, RIE can be employed for the anisotropic etching performed hereinbelow as well.

Then, as shown in FIG. 18A to FIG. 18D, isotropic etching of the fourth semiconductor layer 134, the insulating film 2g, the third semiconductor layer 133, the second intermediate film 13c, the first sacrificial film 13b, the first intermediate film 13a, and the first semiconductor layer 131 is performed via the holes HR; and the diameters of the holes HR are enlarged at the portions corresponding to the first semiconductor part 13 (e.g., the first semiconductor layer 131, the first sacrificial film 13b, and the third semiconductor layer 133) and the portions corresponding to the second semiconductor part 14 (e.g., the fourth semiconductor layer 134). For example, an etchant that can etch silicon quickly compared to silicon oxide and/or a metal oxide is selected for the isotropic etching process. Therefore, as shown in FIG. 6, for example, the etching amount at the insulating film 2g is low compared to those of the portions corresponding to the first and second semiconductor parts 13 and 14. The etching amounts of the portions corresponding to the insulating film 2g and the first and second semiconductor parts 13 and 14 are shown as being equal in FIG. 18A to FIG. 18D and subsequent drawings to prevent complexity of the drawings. This is similar for subsequent drawings as well. Chemical vapor etching (CVE) or wet etching are specific examples of the isotropic etching in the specification.

Continuing as shown in FIG. 19A to FIG. 19D, the third insulators 5 are formed by filling the interiors of the holes HR with an insulator. The third insulators 5 include, for example, silicon oxide. Thereby, the second columnar parts CLHR are formed.

Then, as shown in FIG. 20A to FIG. 20D, the memory holes NH are formed by performing anisotropic etching of the stacked body 2, the fourth semiconductor layer 134, the insulating film 2g, the third semiconductor layer 133, the second intermediate film 13c, the first sacrificial film 13b, the first intermediate film 13a, and the first semiconductor layer 131 in the cell region (Cell). The memory holes MH are formed partway through the first semiconductor layer 131 from the upper end of the stacked body 2.

Then, as shown in FIG. 21A to FIG. 21D, isotropic etching of the fourth semiconductor layer 134, the insulating film 2g, the third semiconductor layer 133, the second intermediate film 13c, the first sacrificial film 13b, the first intermediate film 13a, and the first semiconductor layer 131 is performed via the memory holes MH; and the diameters of the memory holes NH are enlarged at the portions corresponding to the first semiconductor part 13 (e.g., the first semiconductor layer 131, the first sacrificial film 13b, and the third semiconductor layer 133) and the portions corresponding to the second semiconductor part 14 (e.g., the fourth semiconductor layer 134). For example, an etchant that can etch silicon quickly compared to silicon oxide (metal oxide) and/or silicon nitride is selected for the isotropic etching process.

Although not illustrated in FIG. 21A, portions of the first intermediate film 13a and the second intermediate film 13c may protrude into the enlarged portions of the memory holes NIH. In such a case, recesses 13d (referring to FIG. 6 and FIG. 8) may be formed in portions of the semiconductor body 210 formed inside the memory holes NH corresponding to the levels of the first intermediate film 13a and the second intermediate film 13c.

Then, as shown in FIG. 22A to FIG. 22D, the memory film 220 is formed inside the memory holes NH. The memory film 220 includes silicon nitride and silicon oxide. Continuing, the semiconductor body 210 is formed on the memory film 220. The semiconductor body 210 includes, for example, undoped silicon or p-type doped silicon. Continuing, the core layer 230 is formed on the semiconductor body 210. The core layer 230 includes, for example, silicon oxide. Thereby, the memory holes MH are filled with the semiconductor body 210, the memory film 220, and the core layer 230.

Continuing as shown in FIG. 23A to FIG. 23D, the deep slits ST are formed by performing anisotropic etching of the stacked body 2, the fourth semiconductor layer 134, the insulating film 2g, the third semiconductor layer 133, the second intermediate film 13c, and the first sacrificial film 13b. The deep slits ST are formed partway through the first sacrificial film 13b from the upper end of the stacked body 2.

Then, as shown in FIG. 24A to FIG. 24D, a first stopper film 3s is formed on the side walls of the deep slits ST. The first stopper film 3s includes, for example, silicon nitride.

Continuing as shown in FIG. 25A to FIG. 25D, the first sacrificial film 13b is removed by performing isotropic etching of the first sacrificial film 13b via the deep slits ST. For example, an etchant that can etch n-type doped silicon or undraped silicon quickly compared to silicon oxide and silicon nitride is selected for the isotropic etching process. Thereby, the first space S1 is formed between the first intermediate film 13a and the second intermediate film 13c.

Then, as shown in FIG. 26A to FIG. 26D, the cover insulating film 221 of the memory film 220 (see FIG. 2A and FIG. 2B) is removed by performing isotropic etching of the cover insulating film 221 via the deep slits ST. For example, an etchant that can etch silicon oxide quickly compared to silicon nitride is selected for the isotropic etching process. Continuing, the charge trapping film 222 of the memory film 220 (FIG. 2A and FIG. 2B) is removed by performing isotropic etching of the charge trapping film 222 via the deep slits ST. For example, an etchant that can etch silicon nitride quickly compared to silicon oxide is selected for the isotropic etching process. Continuing, the tunneling insulating film 223 of the memory film 220 (FIG. 2A and FIG. 2B) is removed via the deep slits ST. The first intermediate film 13a and the second intermediate film 13c also are removed in this process. For example, an etchant that can etch silicon oxide quickly compared to silicon nitride is selected for the isotropic etching process. Thereby, the first space S1 is enlarged between the first semiconductor layer 131 and the third semiconductor layer 133; and the semiconductor body 210 of the first columnar part CL is exposed in the first space S1. The contact portion 210c is formed at a position where the semiconductor body 210 is exposed. The recess portions 5r are formed in the second columnar parts CLHR.

Continuing as shown in FIG. 27A to FIG. 27D, the second semiconductor layer 132 is formed by filling the interior of the first space S1 with a semiconductor via the deep slits ST. The second semiconductor layer 132 is, for example, n-type doped silicon.

Then, as shown in FIG. 28A to FIG. 28D, the first stopper film 3s and the second sacrificial films 23 are removed by performing isotropic etching of the first stopper film 3s and the second sacrificial films 23 via the deep slits ST. Thereby, a second space S2 is formed between the insulating layers 22. For example, an etchant that can etch silicon nitride quickly compared to silicon oxide and polysilicon is selected for the isotropic etching process.

Continuing as shown in FIG. 29A to FIG. 29D, the conductive layers 21 are formed by filling the interior of the second space S2 with a conductor via the deep slits ST. The conductive layers 21 include, for example, tungsten.

Then, as shown in FIG. 30A to FIG. 30D, the plate portions 3 are formed by filling the deep slits ST with an insulator. The plate portions 3 include, for example, silicon oxide.

Continuing as shown in FIG. 31A to FIG. 31D, the shallow slits SHE are formed by performing anisotropic etching of the conductive layers 21 and the insulating layers 22 partway through the stacked body 2. Continuing, the second insulators 4 are formed by filling the shallow slits SHE with an insulator. The second insulators 4 include, for example, silicon oxide.

Then, as shown in FIG. 32A to FIG. 32D, multiple third columnar parts CLCC are formed inside the staircase region (Staircase) of the stacked body 2. The third columnar parts CLCC respectively include the interconnects 37a. The interconnects 37a are electrically insulated from the stacked body 2 by insulators 36a. The respective interconnects 37a are electrically connected to one conductive layer 21. Continuing, multiple fourth columnar parts CLCP are formed inside the insulating film 32 and the tap region (Tap) of the stacked body 2. The fourth columnar parts CLCP respectively include the interconnects 37b, The interconnects 37b are electrically insulated from the stacked body 2 by insulators 36b. The interconnects 37b each are electrically connected to the first conductive film 12. Continuing, multiple fifth columnar parts CLC4 are formed inside the insulating film 31, the insulating film 32, and the tap region (Tap) of the stacked body 2. The fifth columnar parts CLC4 respectively include the interconnects 37c. The interconnects 37c are electrically insulated from the stacked body 2 by insulators 36c. The respective interconnects 37c are electrically connected to one interconnect 11ab.

Subsequently, although not particularly illustrated, it is sufficient to form the bit lines BL, etc., above the stacked body 2 according to well-known methods, Thus, for example, the semiconductor device 100a according to the first embodiment can be manufactured.

Second Embodiment (Semiconductor Device)

Figure 33:
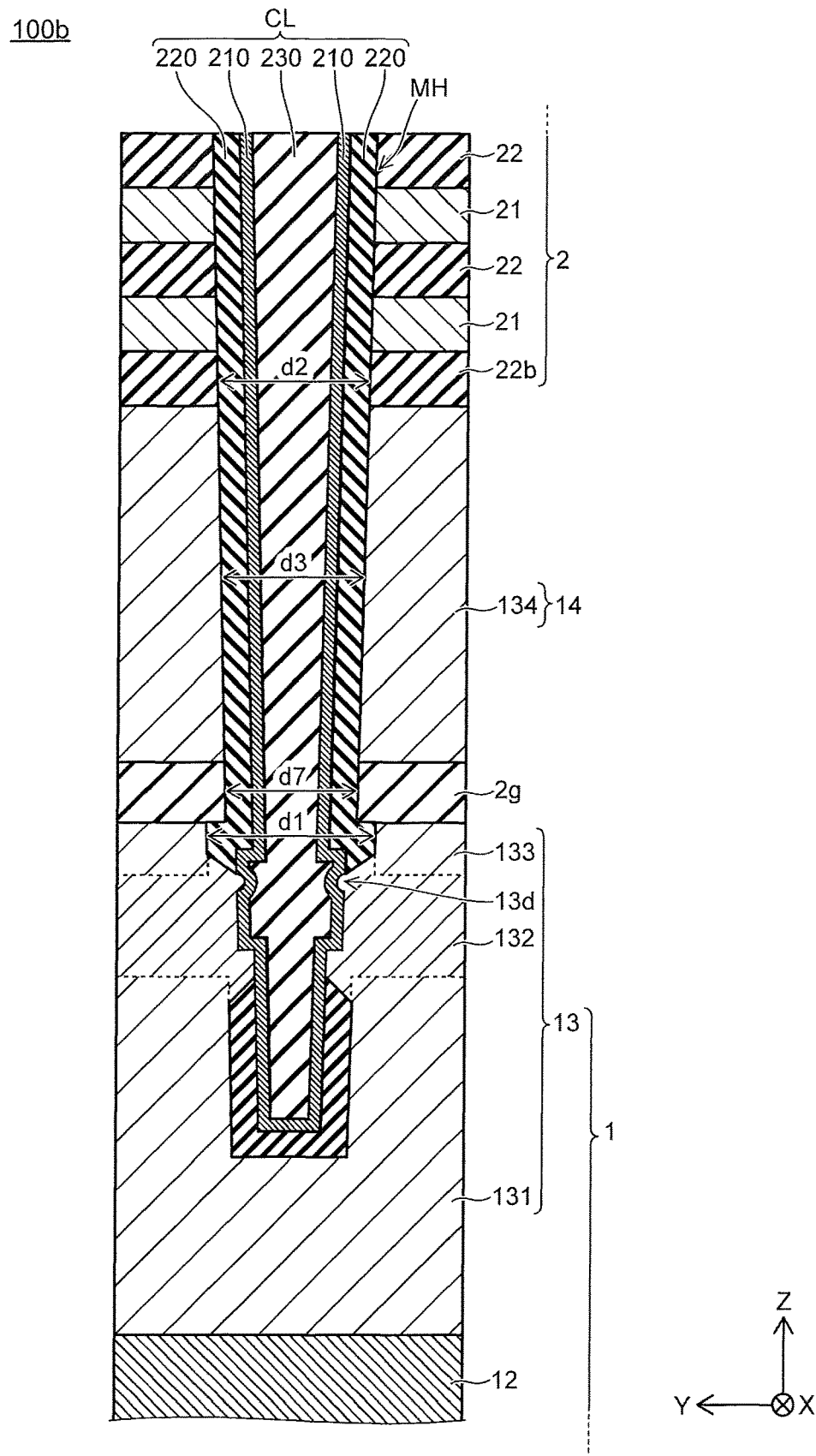
FIG. 33 is a schematic cross-sectional view illustrating an enlargement of the first columnar part, the first semiconductor part, and the second semiconductor part of a semiconductor device according to a second embodiment.
Figure 34:
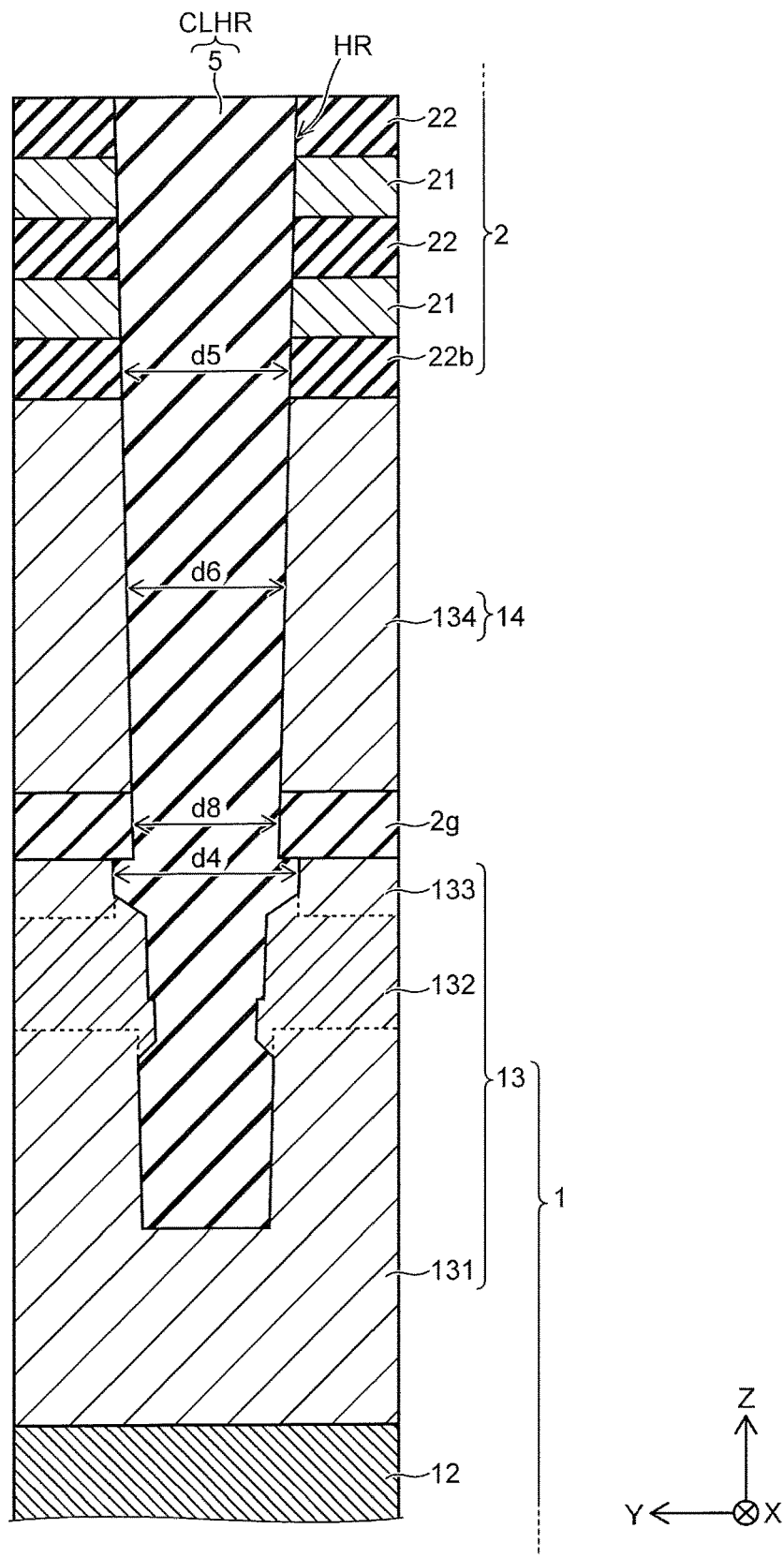
FIG. 34 is a schematic cross-sectional view illustrating an enlargement of the second columnar part, the first semiconductor part, and the second semiconductor part of the semiconductor device according to the second embodiment.
Figure 35A:
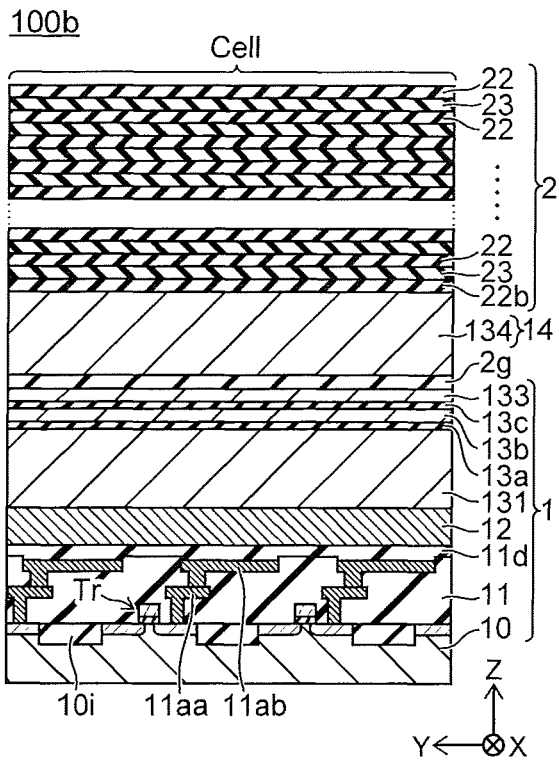
FIGS. 35A to 39D are schematic cross-sectional views illustrating sequential processes, which show a method for manufacturing the semiconductor device according to the second embodiment.
Figure 35B:
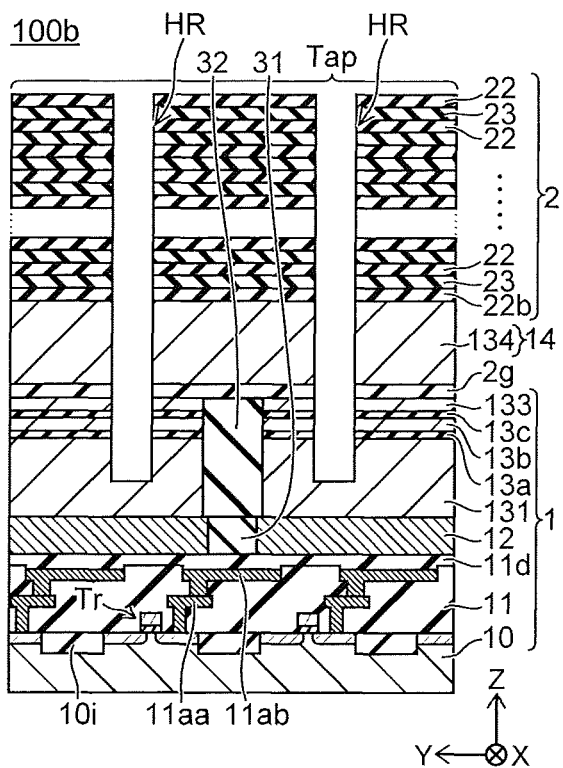
Figure 35C:
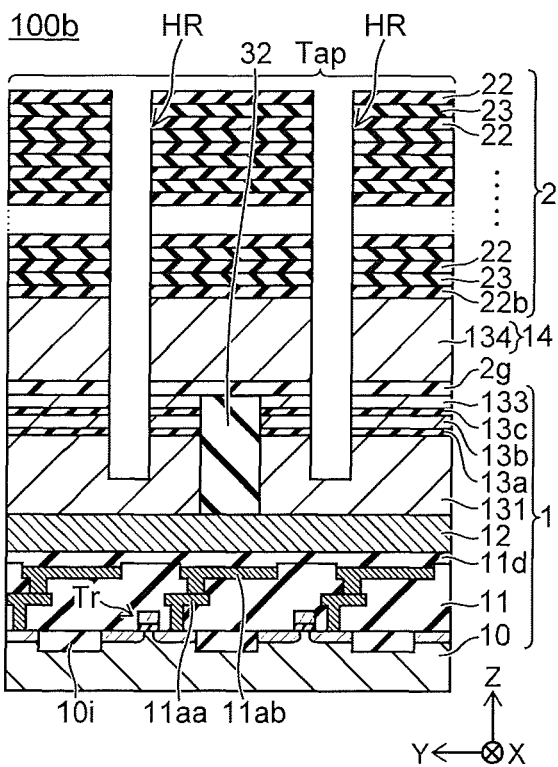
Figure 35D:
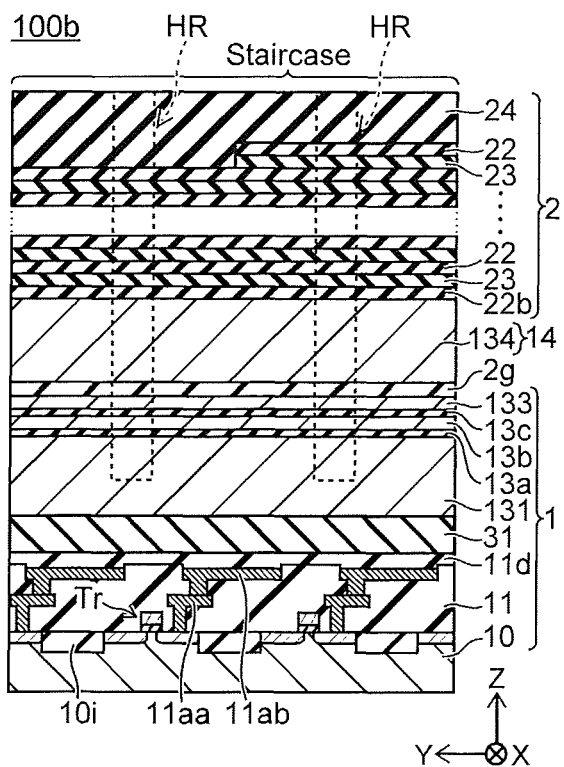
Figure 36A:
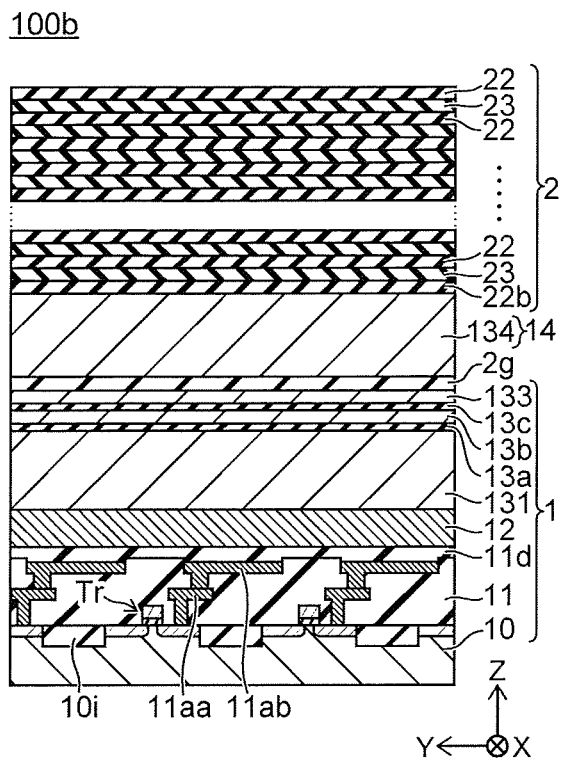
Figure 36B:
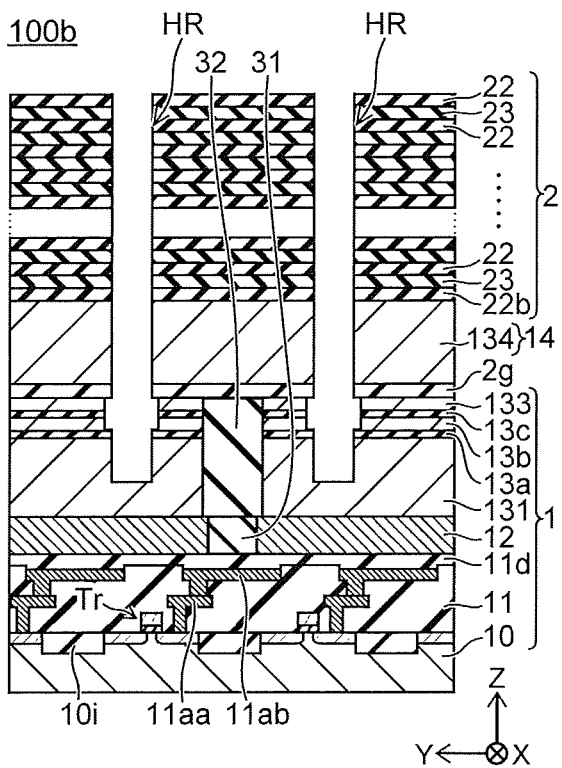
Figure 36C:
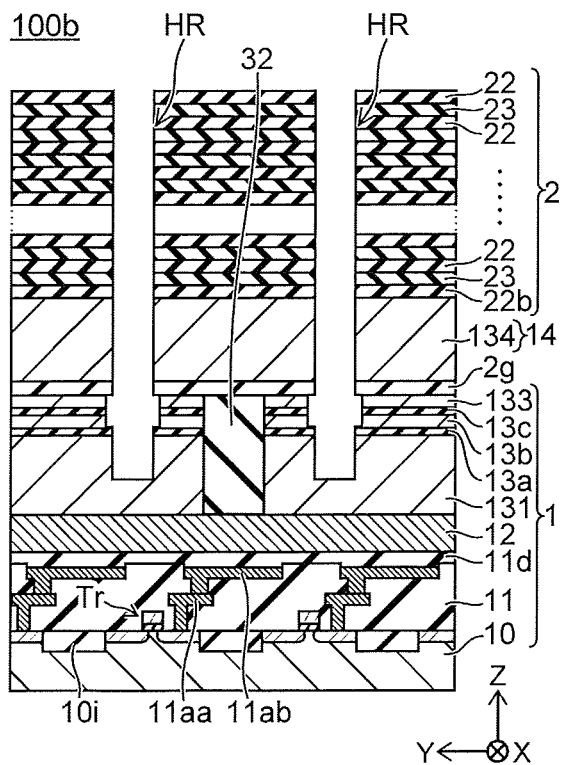
Figure 36D:
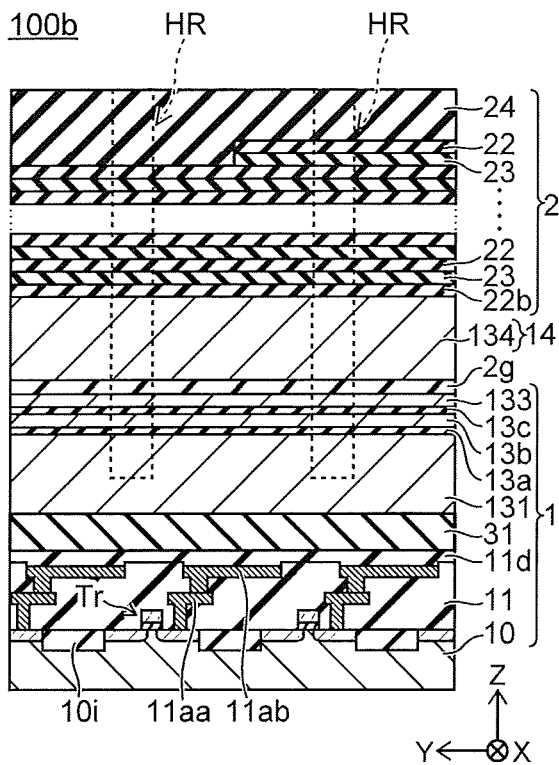
Figure 37A:
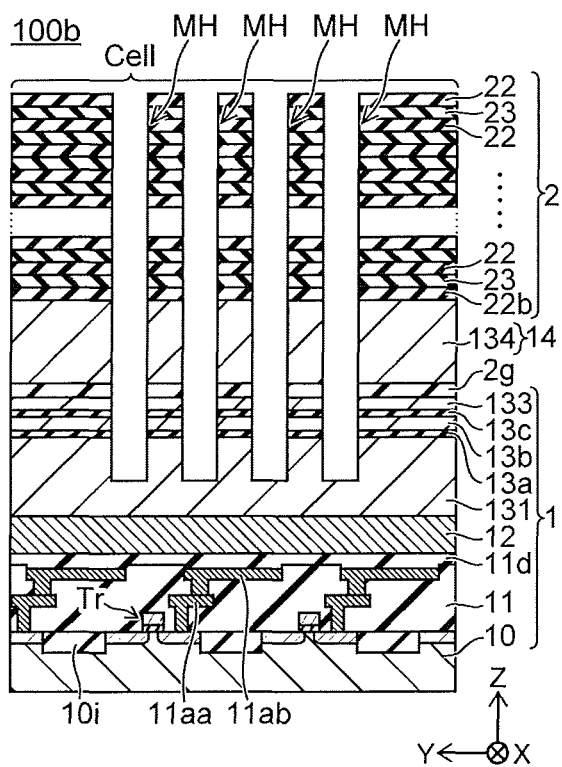
Figure 37B:
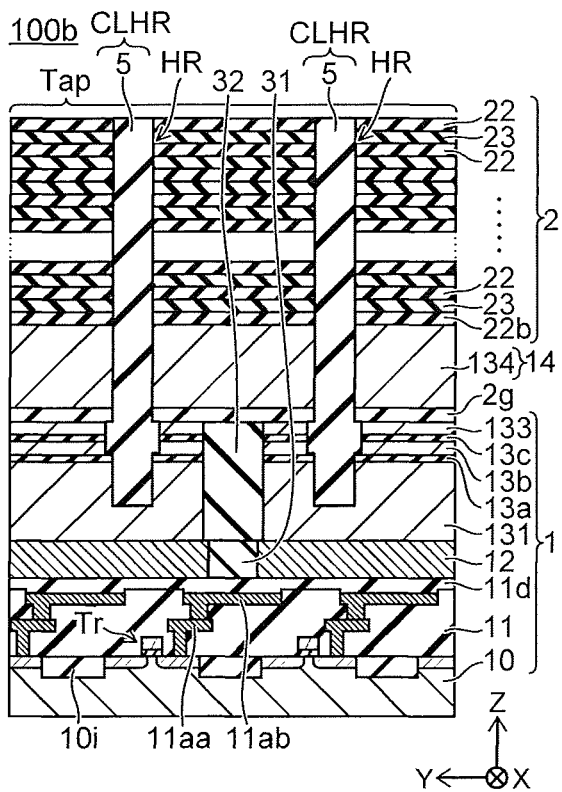
Figure 37C:
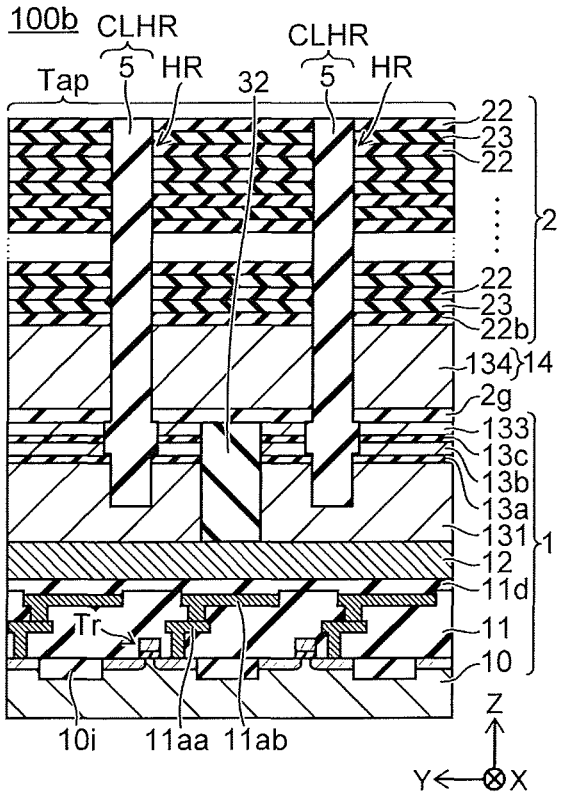
Figure 37D:
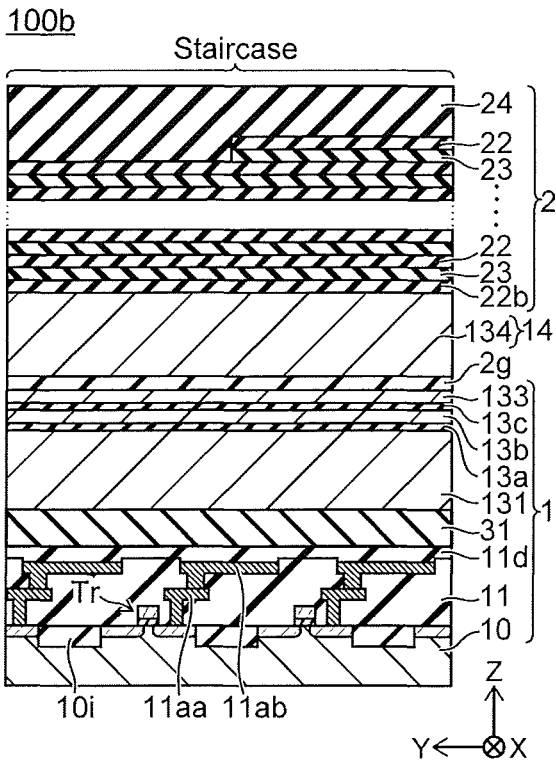
Figure 38A:
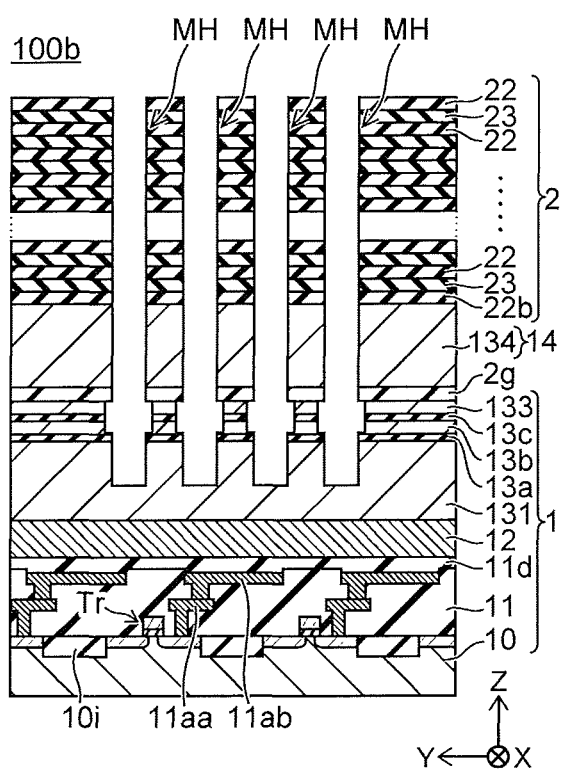
Figure 38B:
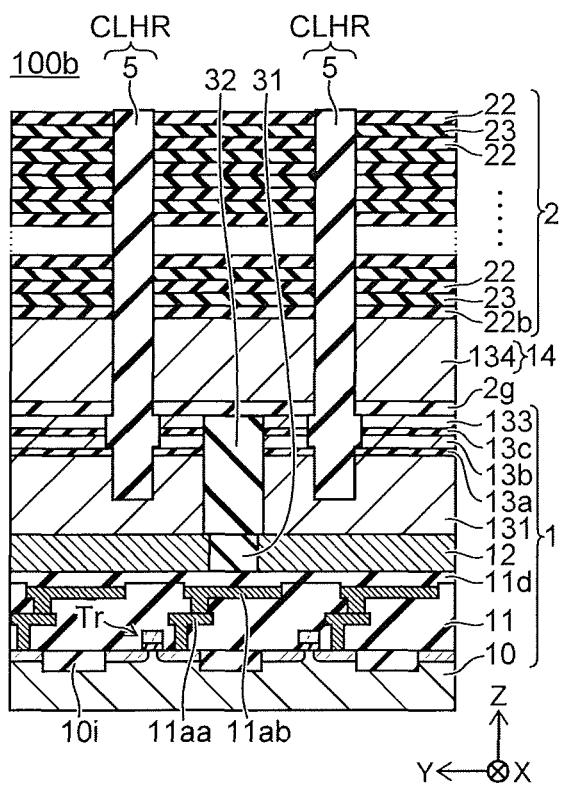
Figure 38C:
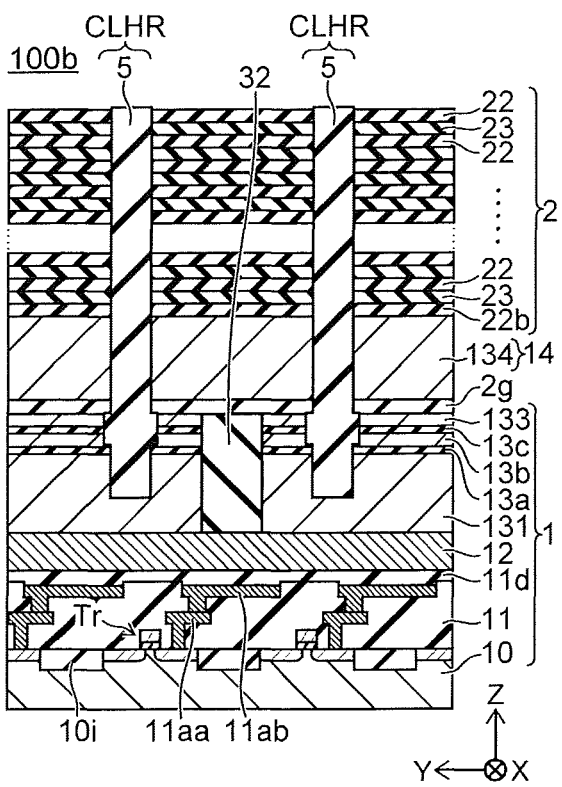
Figure 38D:
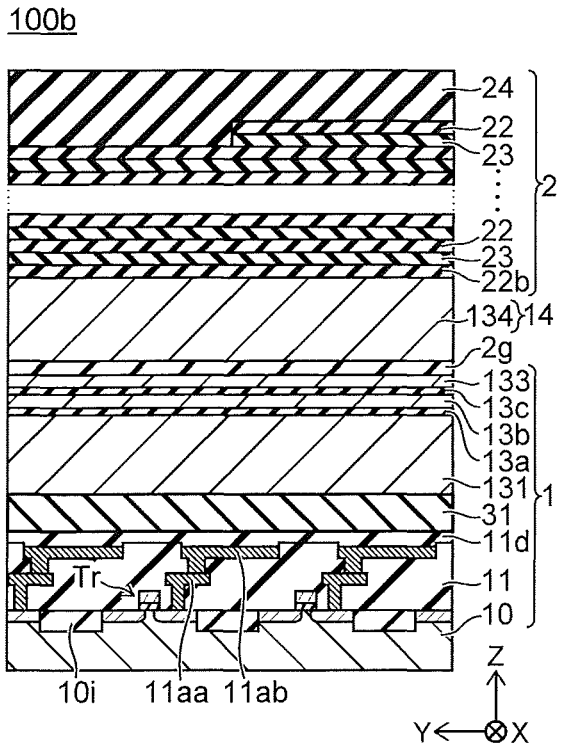
Figure 39A:
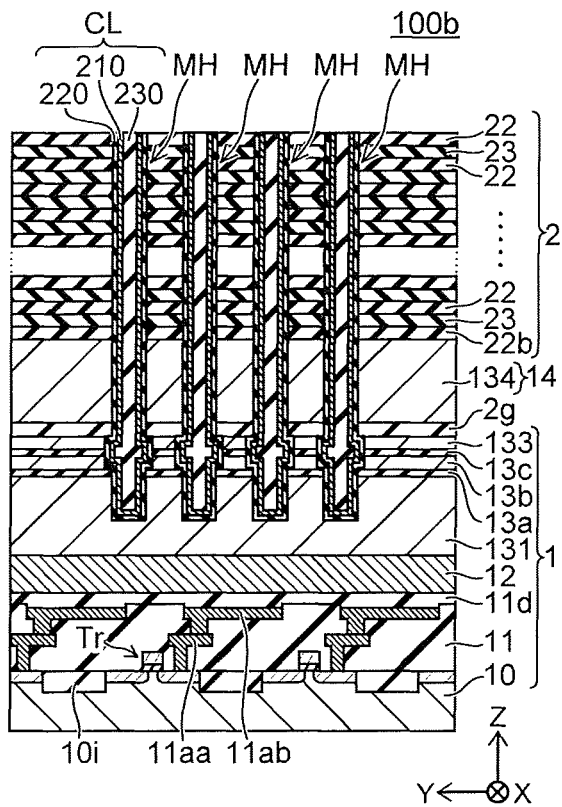
Figure 39B:
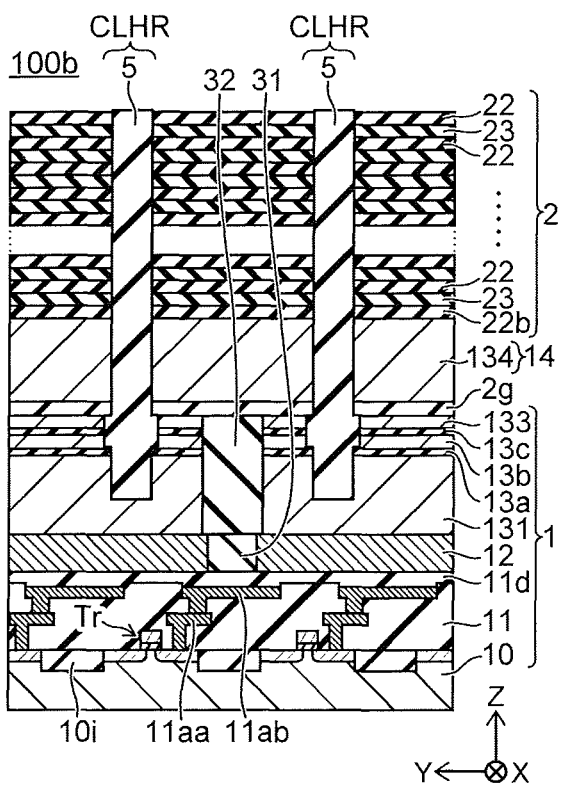
Figure 39C:
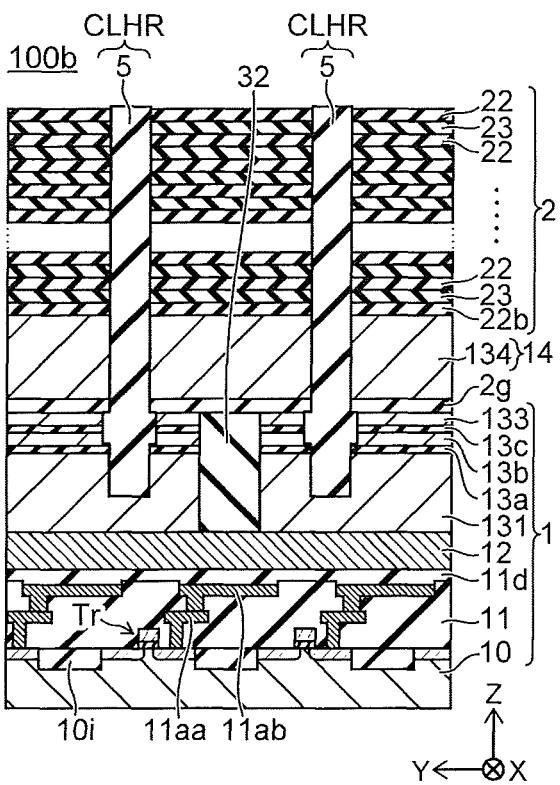
Figure 39D:
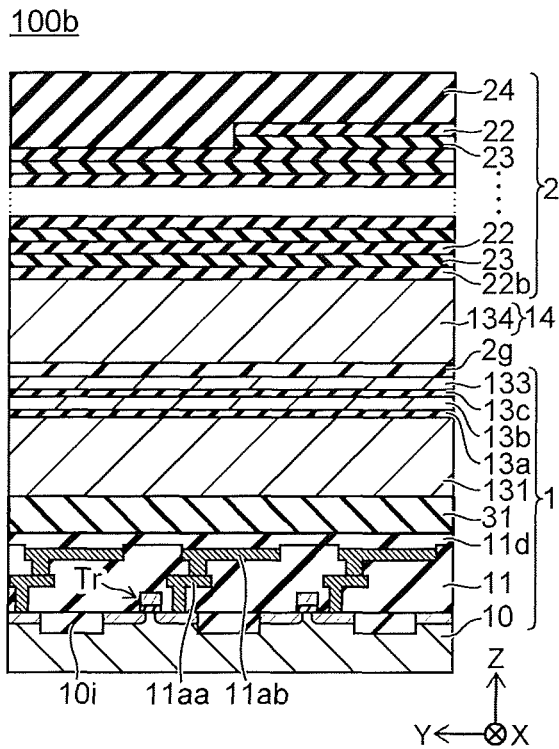

FIG. 33 is a schematic cross-sectional view illustrating an enlargement of the first columnar part CL, the first semiconductor part 13, and the second semiconductor part 14 of a semiconductor device 100b according to a second embodiment. The cross section shown in FIG. 33 corresponds to the cross section shown in FIG. 6. FIG. 34 is a schematic cross-sectional view illustrating an enlargement of the second columnar part CLHR, the first semiconductor part 13, and the second semiconductor part 14 of the semiconductor device 100b according to the second embodiment. The cross section shown in FIG. 34 corresponds to the cross section shown in FIG. 7.

In the semiconductor device 100b according to the second embodiment as shown in FIG. 33, the third diameter d3 is substantially equal to the second diameter d2, and equal to or less than the first diameter d1. The semiconductor device 100b differs from the semiconductor device 100a according to the first embodiment on this point. The third diameter d3 is a diameter of the first columnar part CL at a portion surrounded with the fourth semiconductor layer 134 inside the second semiconductor part 14. The second diameter d2 is the diameter of the first columnar part CL at a portion surrounded with the insulating layer 22 (e.g., the insulating layer 22b most proximal to the first semiconductor part 13). The first diameter d1 is a diameter of the first columnar part CL at a portion surrounded with the first semiconductor part 13 (e.g., the third semiconductor layer 133) other than the contact portion in which the second semiconductor layer 132 contacts the semiconductor body 210.

In the semiconductor device 100b as shown in FIG. 34, the sixth diameter d6 is substantially equal to the fifth diameter d5, and equal to or less than the fourth diameter d4. The semiconductor device 100b differs from the semiconductor device 100a on this point. The sixth diameter d6 is a diameter of the second columnar part CLHR at a portion surrounded with the fourth semiconductor layer 134 inside the second semiconductor part 14. The fifth diameter d5 is a diameter of the second columnar part CLHR at a portion surrounded with the insulating layer 22 (e.g., the insulating layer 22b most proximal to the first semiconductor part 13). The fourth diameter d4 is a diameter of the second columnar part CLHR at a portion surrounded with the first semiconductor part 13 (e.g., the third semiconductor layer 133) other than the recess portion.

As in the semiconductor device 100b, the third diameter d3 may be equal to or less than the first diameter d1; and the sixth diameter d6 may be equal to or less than the fourth diameter d4.

Similarly to the first embodiment, it is also possible to set one of the third diameter d3 and the sixth diameter d6 such that the third diameter d3 is equal to the second diameter d2 or equal to or less than the first diameter d1, or the sixth diameter d6 is equal to the fifth diameter d5 or equal to or less than the fourth diameter d4.

(Manufacturing Method)

A typical example of the method for manufacturing the semiconductor device 100b will now be described.

FIG. 35A to FIG. 39D are schematic cross-sectional views sequentially illustrating the processes, which show the method for manufacturing the semiconductor device 100b according to the second embodiment. The cross sections shown in FIG. 35A to FIG. 39A correspond to the cross section shown in FIG. 17A, etc. The cross sections shown in FIG. 35B to FIG. 39B correspond to the cross section shown in FIG. 17B, etc. The cross sections shown in FIG. 35C to FIG. 39C correspond to the cross section shown in FIG. 17C, etc. The cross sections shown in FIG. 35D to FIG. 39D correspond to the cross section shown in FIG. 17D, etc.

As shown in FIG. 35A to FIG. 35D, similarly to the first embodiment, for example, according to the manufacturing method described with reference to FIG. 11A to FIG. 16D, the staircase region (Staircase) is formed in the staircase portion 2s; and the insulating film 24 is formed by burying the recess formed in the staircase region with an insulator.

In the semiconductor device 100b according to the second embodiment, the components of the first semiconductor layer 131, the first sacrificial film 13b, the third semiconductor layer 133, and the fourth semiconductor layer 134 are, for example, as follows.

First semiconductor layer 131: Doped silicon (e.g., n-type)
First sacrificial film 13b: Undoped silicon
Third semiconductor layer 133: Undoped silicon
Fourth semiconductor layer 134: Doped silicon (e.g., n-type)

Then, the holes HR are formed by performing anisotropic etching of the stacked body 2, the fourth semiconductor layer 134, the insulating film 2g, the third semiconductor layer 133, the second intermediate film 13c, the first sacrificial film 13b, the first intermediate film 13a, and the first semiconductor layer 131 in the tap region (Tap) and the staircase region (Staircase).

Continuing as shown in FIG. 36A to FIG. 36D, the diameters of the holes HR are enlarged at the first sacrificial film 13b and the third semiconductor layer 133 by performing isotropic etching of the fourth semiconductor layer 134, the insulating film 2g, the third semiconductor layer 133, the second intermediate film 13c, the first sacrificial film 13b, the first intermediate film 13a, and the first semiconductor layer 131 via the holes HR. For example, an etchant that can etch silicon quickly compared to silicon oxide and/or silicon nitride and can etch undoped silicon quickly compared to doped silicon is selected for the isotropic etching process. An example of such an etchant is an organic alkaline, e.g., choline (2-Hydroxyethyltrimethylammonium Hydroxide). In the case where choline is used as the etchant, the isotropic etching is, for example, wet etching. For example, the etchant that includes choline can etch undoped silicon quickly compared to n-type doped silicon and p-type doped silicon.

Then, as shown in FIG. 37A to FIG. 37D, the third insulators 5 are formed by filling the interiors of the holes HR with an insulator. Continuing, the memory holes MH are formed by performing anisotropic etching of the stacked body 2, the fourth semiconductor layer 134, the insulating film 2g, the third semiconductor layer 133, the second intermediate film 13c, the first sacrificial film 13b, the first intermediate film 13a, and the first semiconductor layer 131 in the cell region (Cell).

Continuing as shown in FIG. 38A to FIG. 38D, the diameters of the memory holes MH are enlarged at the portions corresponding to the first semiconductor part 13 (e.g., the first sacrificial film 13b and the third semiconductor layer 133) by performing isotropic etching of the fourth semiconductor layer 134, the insulating film 2g, the third semiconductor layer 133, the second intermediate film 13c, the first sacrificial film 13b, the first intermediate film 13a, and the first semiconductor layer 131 via the memory holes MH. In the isotropic etching process as well, it is sufficient to use, for example, an etchant including choline as the etchant.

Then, as shown in FIG. 39A to FIG. 39D, the memory film 220 is formed inside the memory holes MH. The memory film 220 includes silicon nitride and silicon oxide. Continuing, the semiconductor body 210 is formed on the memory film 220. The semiconductor body 210 includes, for example, undoped silicon or p-type doped silicon. Continuing, the core layer 230 is formed on the semiconductor body 210. The core layer 230 includes, for example, silicon oxide. Thereby, the memory holes MH are filled with the semiconductor body 210, the memory film 220, and the core layer 230.

Although descriptions of the following processes are omitted, the semiconductor device 100b may be manufactured according to a manufacturing method similar to that of the first embodiment, e.g., the manufacturing method described with reference to FIG. 23A to FIG. 32D. Thus, it is possible to manufacture the semiconductor device 100b.

Third Embodiment (Semiconductor Device)

Figure 40:
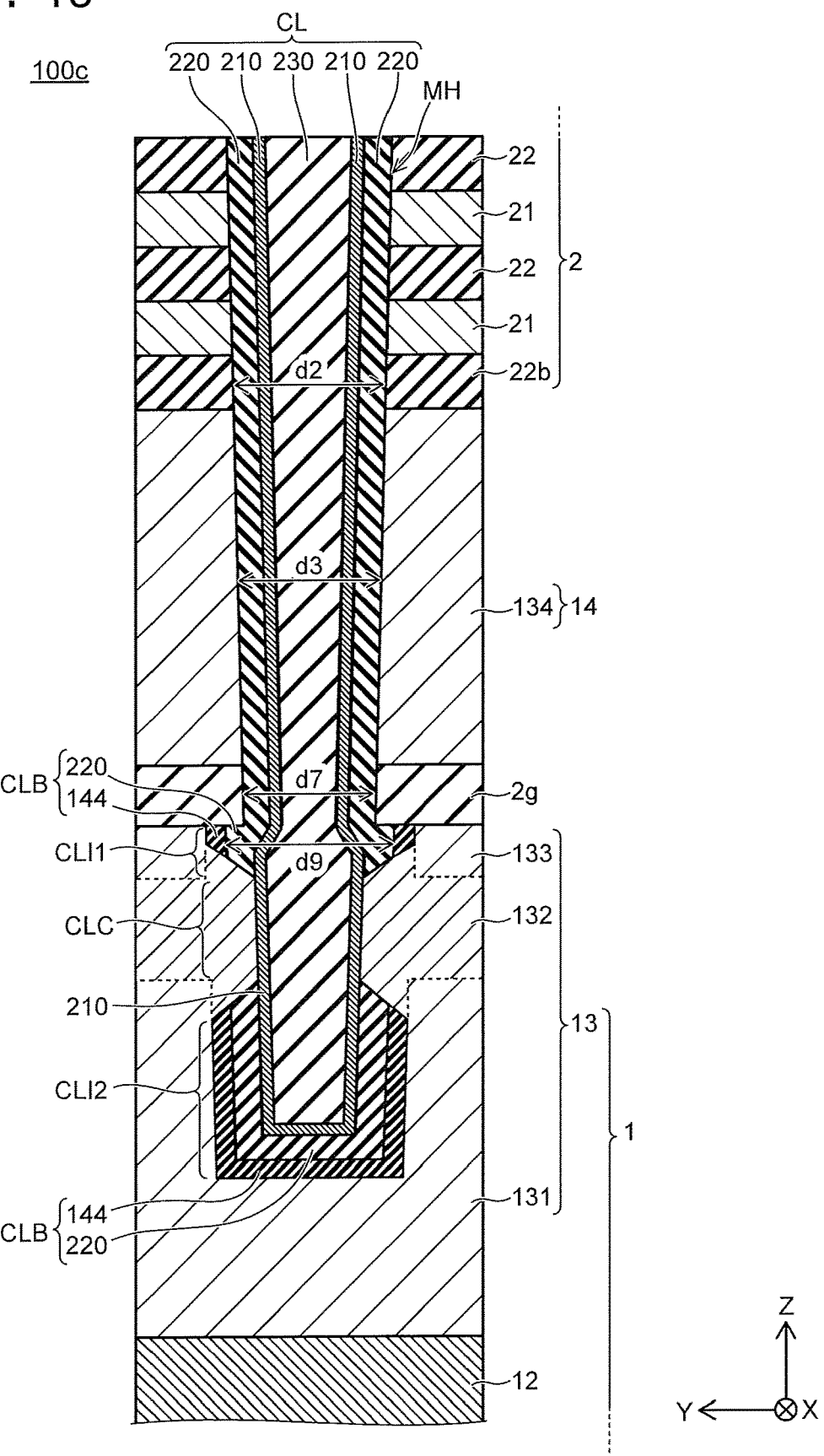
FIG. 40 is a schematic cross-sectional view illustrating an enlargement of the first columnar part, the first semiconductor part, and the second semiconductor part of a semiconductor device according to the third embodiment.

FIG. 40 is a schematic cross-sectional view illustrating an enlargement of the first columnar part CL, the first semiconductor part 13, and the second semiconductor part 14 of a semiconductor device 100c according to the third embodiment. The cross section shown in FIG. 40 corresponds to the cross section shown in FIG. 6.

In the semiconductor device 100c according to the third embodiment as shown in FIG. 40, the first semiconductor part 13 includes a first semiconductor region (e.g., the first to third semiconductor layers 131 to 133). The first semiconductor region includes, for example, a portion having the n-type conductivity. For example, the first and second semiconductor layers 131 and 132 each include n-type silicon; and the third semiconductor layer 133 includes undoped silicon. Or, the first to third semiconductor layers 131 to 133 each include n-type silicon.

The first columnar part CL includes a bottom portion provided in the interior of the first semiconductor part 13. An insulating film 144 is provided between the first semiconductor part 13 and the semiconductor body 210 of the first columnar part CL of the bottom portion in addition to the memory film 220. The insulating film 144 is provided to surround the bottom portion of the first columnar part CL. A contact portion CLC where a portion of the semiconductor body 210 is exposed is provided by selectively removing portions of the insulating film 144 and the memory film 220. The second semiconductor layer 132 contacts the semiconductor body 210 at the contact portion CLC.

In the semiconductor device 100c, the first columnar part CL includes an insulating body CLB positioned between the first semiconductor part 13 and the semiconductor body 210. The insulating body CLB includes an insulating portion ail and an insulating portion CLI2. The insulating portion CLI1 is positioned between the insulating film 2g and the contact portion CLC. The insulating portion CLI2 is positioned between the first conductive film 12 and the contact portion CLC. The insulating body CLB includes the insulating film 144 and a portion of the memory film 220. The second semiconductor layer 132 is provided to surround the semiconductor body 210 between the insulating portion CLI1 and the insulating portion CLI2, and contacts the outer perimeter of the semiconductor body 210. For example, at the insulating portion CLI1, the thickness of the insulating body CLB in the X-axis direction and the Y-axis direction is thicker than the film thickness in the X-axis direction and the Y-axis direction of the memory film 220 inside the stacked body 2.

In the semiconductor device 100c, the diameter of the first columnar part CL inside the stacked body 2 is smaller than the diameter of the first columnar part CL inside the first semiconductor part 13. Specifically, the second diameter d2 of the first columnar part CL at a portion surrounded with the insulating layer 22 in the stacked body 2 is smaller than a ninth diameter d9 of the first columnar part CL at a portion surrounded with the first semiconductor part 13 other than the contact portion CLC. Similarly to the first and second embodiments, for example, the second diameter d2 is a diameter of the first columnar part CL at a portion surrounded with the insulating layer 22b most proximal to the first semiconductor part 13. The ninth diameter d9 is a diameter of the bottom portion of the first columnar part CL positioned inside the first semiconductor part 13 most proximal to the stacked body 2. For example, the ninth diameter d9 is a diameter of the first columnar part CL at a portion surrounded with the third semiconductor layer 133.

As shown in FIG. 40, for example, in the case where the second semiconductor part 14 is provided between the stacked body 2 and the first semiconductor part 13, the seventh diameter d7 of the first columnar part CL is smaller than the ninth diameter d9. Similarly to the first and second embodiments, the seventh diameter d7 is a diameter of the first columnar part CL at a portion surrounded with the insulating film 2g.

In the semiconductor device 100c, the ninth diameter d9 of the first columnar part CL is larger than the second diameter d2 or the seventh diameter d7. Therefore, similarly to the first and second embodiments, when forming the second semiconductor layer 132 by replacing the sacrificial film, a diameter of the first columnar part CL that is thick enough to suppress the collapse of the stacked body 2 can remain at the contact location (the contact portion CLC) between the second semiconductor layer 132 and the semiconductor body 210. According to the semiconductor device 100c, similarly to the first and second embodiments, the collapse of the stacked body 2 can be suppressed, e.g., in the manufacturing processes.

(Manufacturing Method)

A typical example of the method for manufacturing the semiconductor device 100c will now be described.

Figure 41:
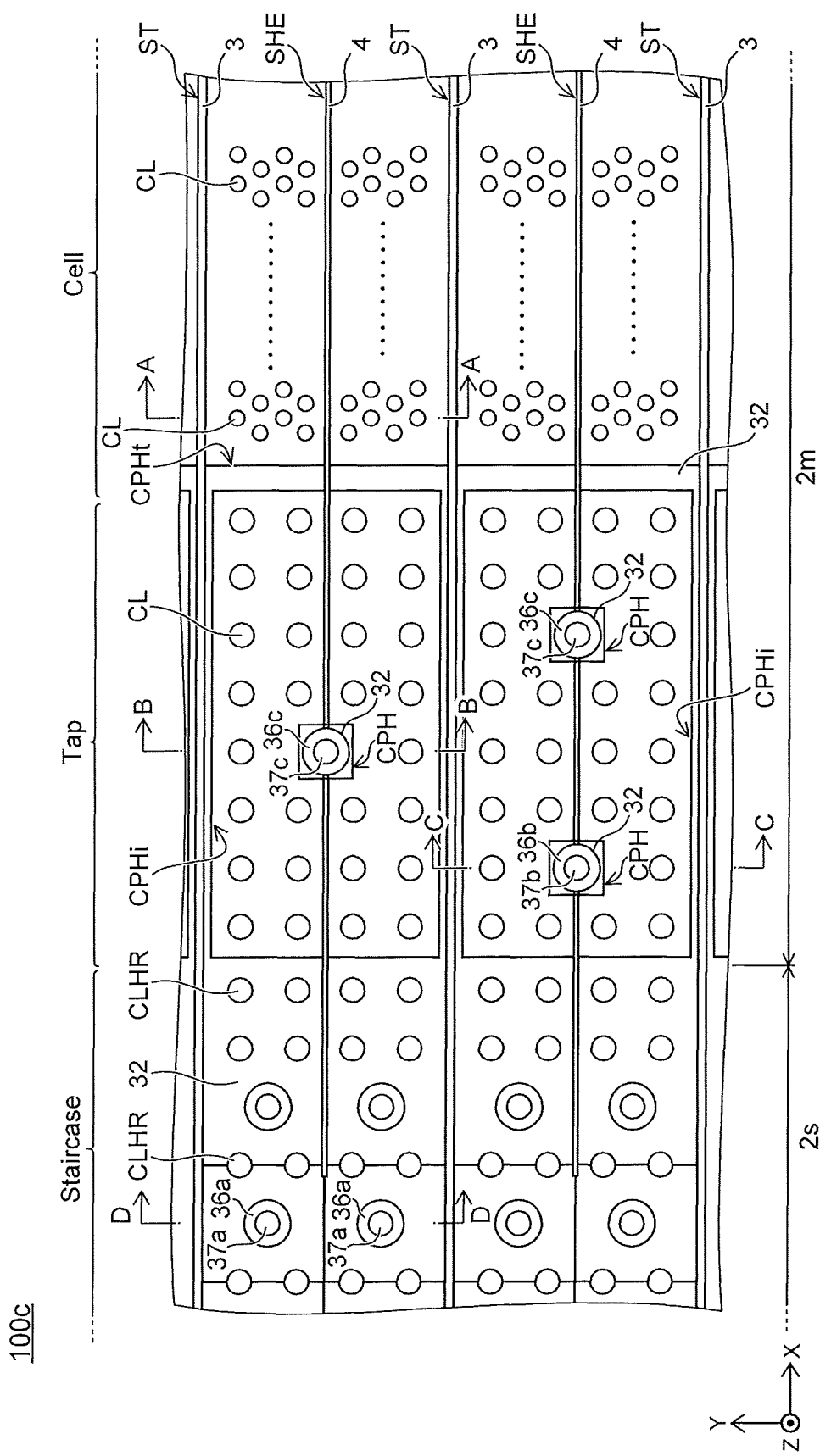
FIG. 41 is a schematic plan view illustrating the semiconductor device according to the third embodiment.
Figure 42A:
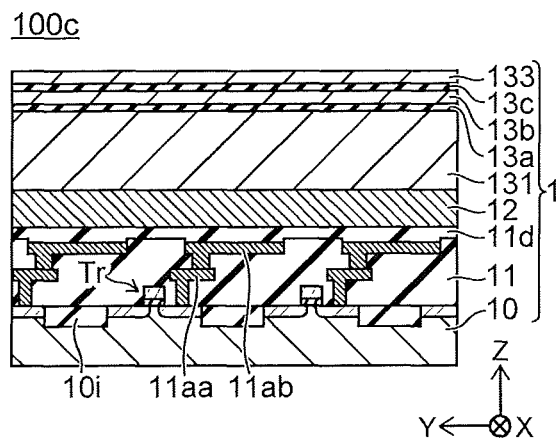
FIGS. 42A to 48D and FIGS. 49 to 56 are schematic cross-sectional views illustrating sequential processes, which show a method for manufacturing the semiconductor device according to the third embodiment.
Figure 42B:
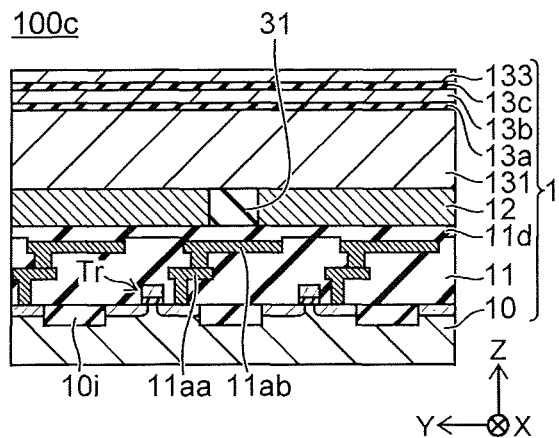
Figure 42C:
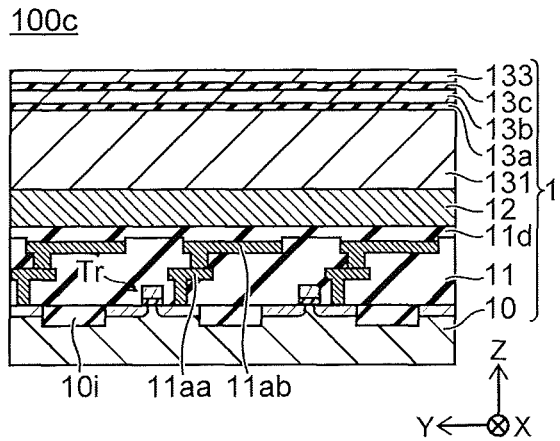
Figure 42D:
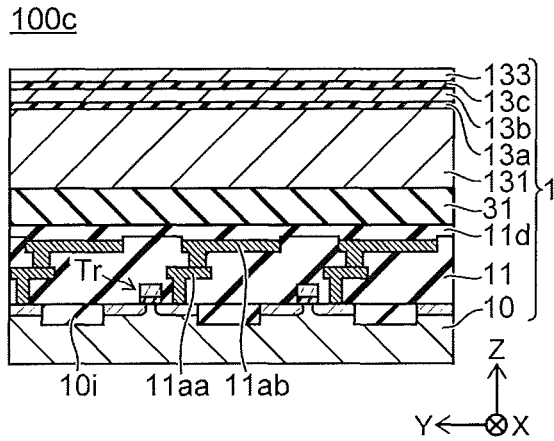
Figure 43A:
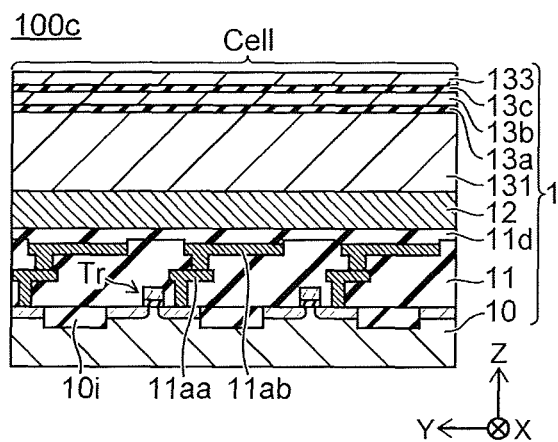
Figure 43B:
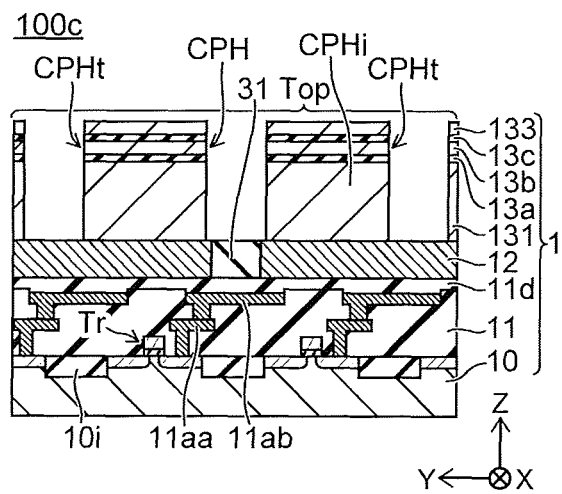
Figure 43C:
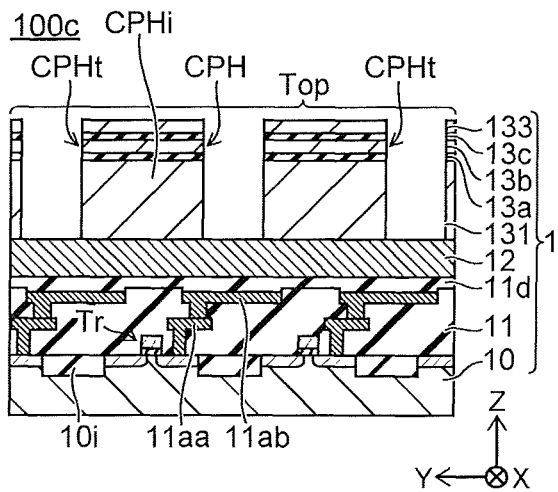
Figure 43D:
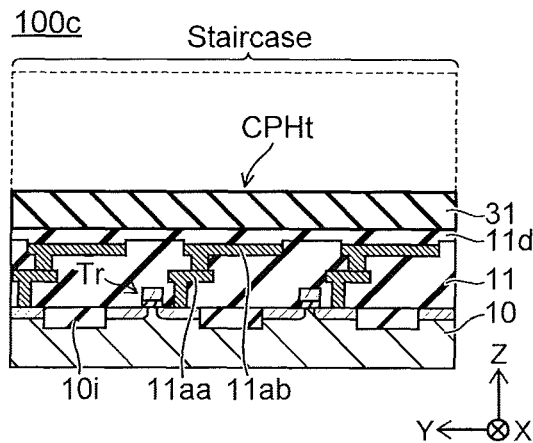
Figure 44A:
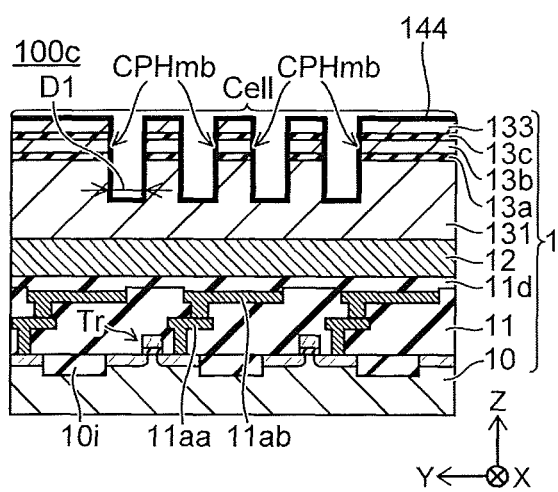
Figure 44B:
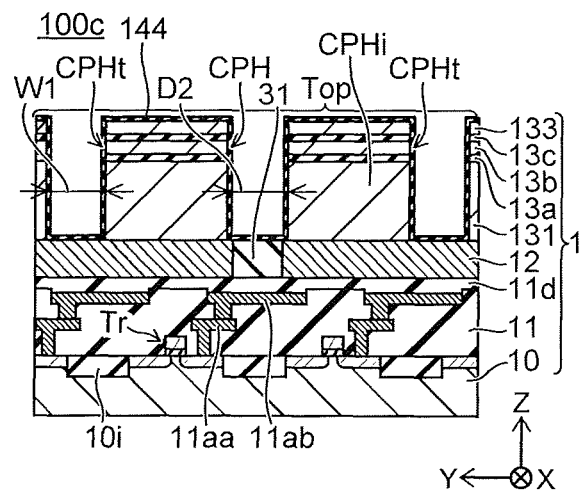
Figure 44C:
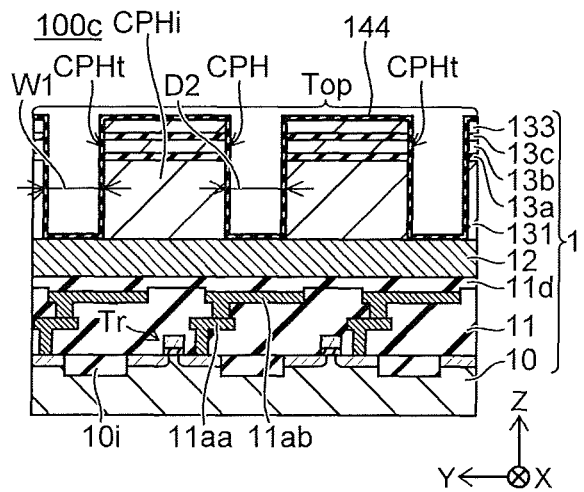
Figure 44D:
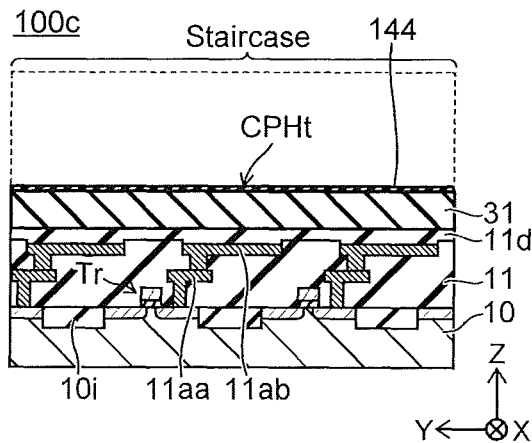
Figure 45A:
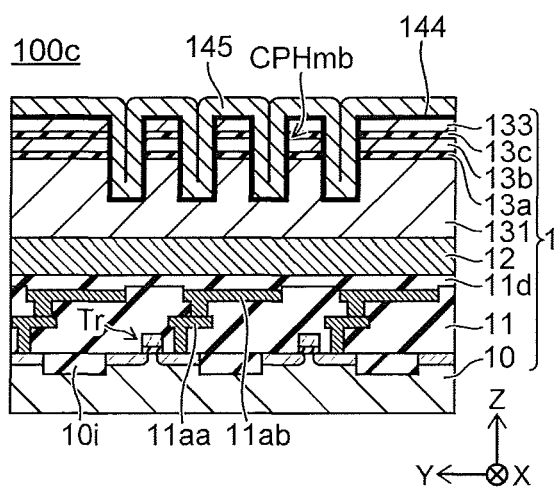
Figure 45B:
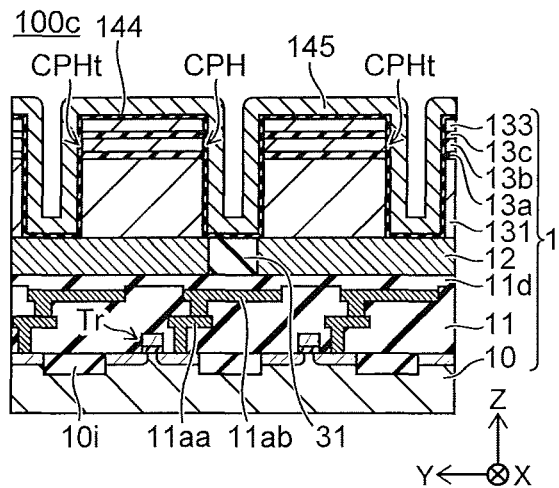
Figure 45C:
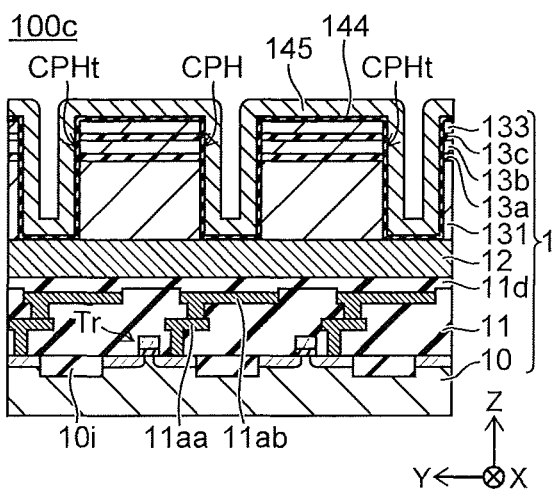
Figure 45D:
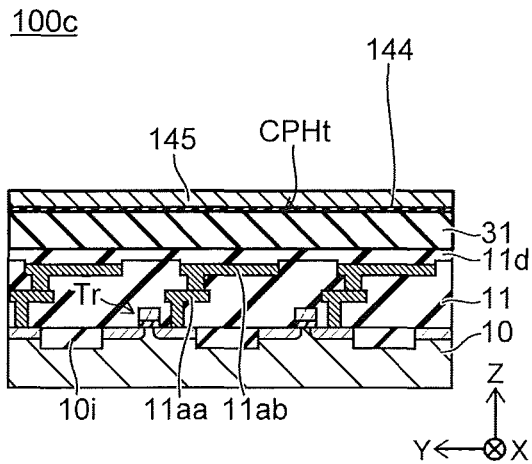
Figure 46A:
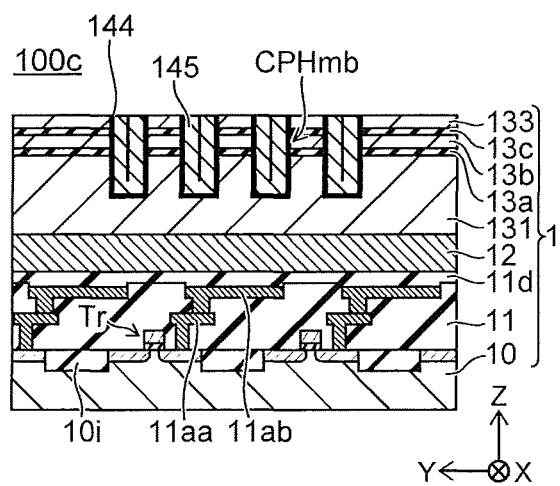
Figure 46B:
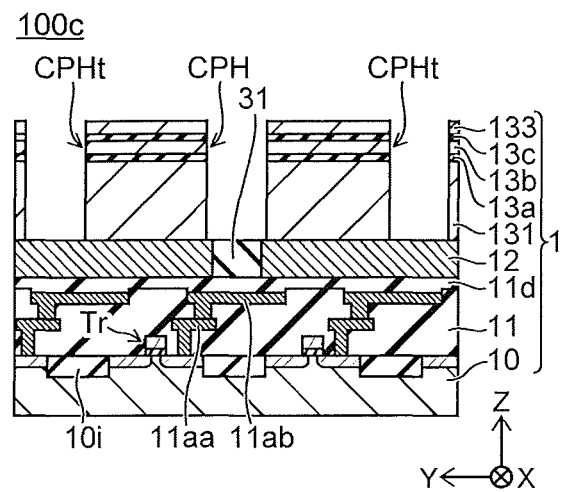
Figure 46C:
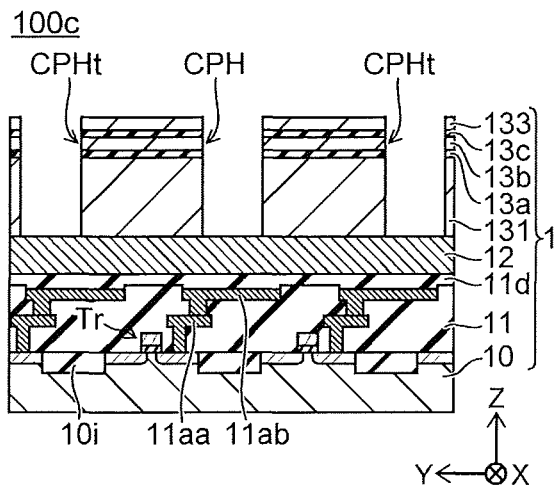
Figure 46D:
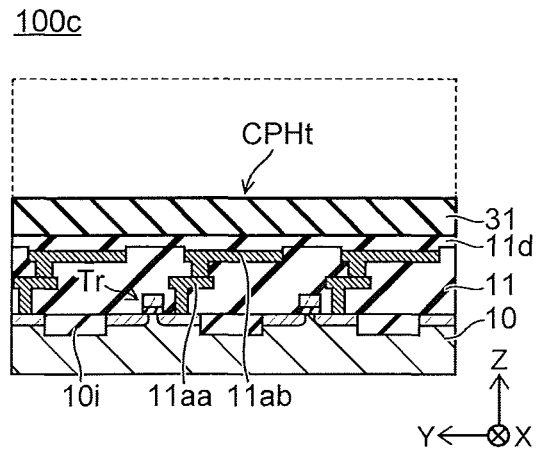
Figure 47A:
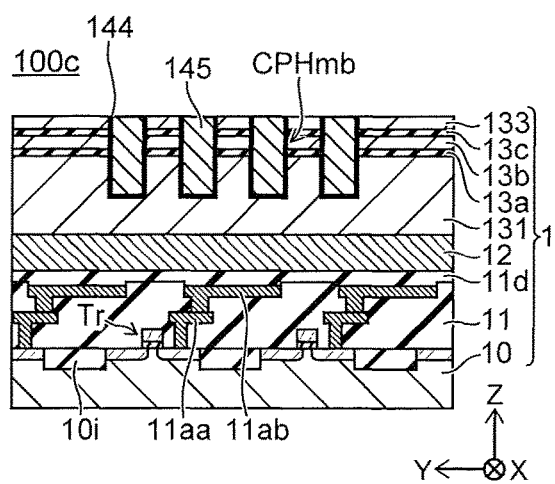
Figure 47B:
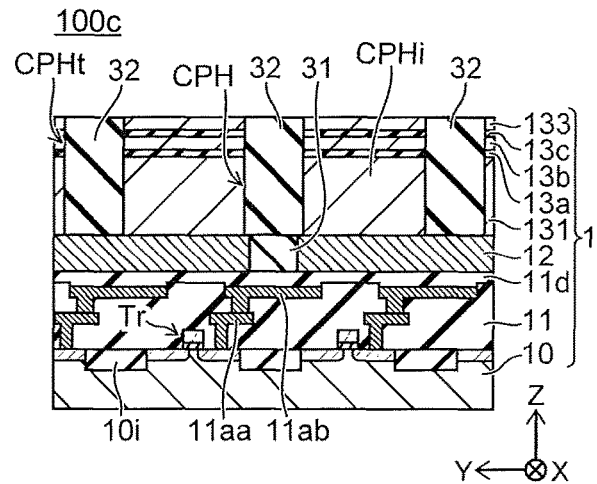
Figure 47C:
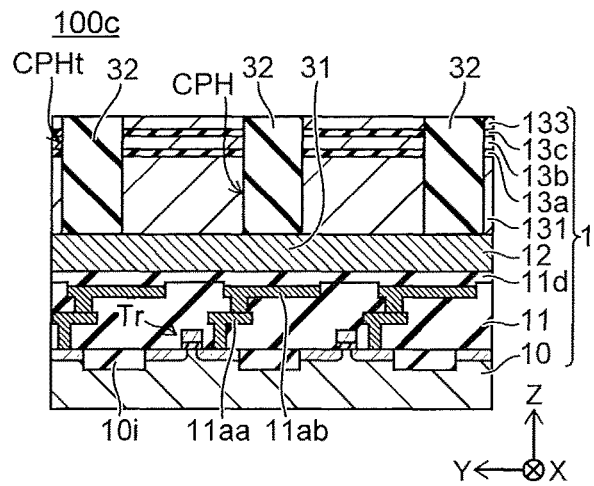
Figure 47D:
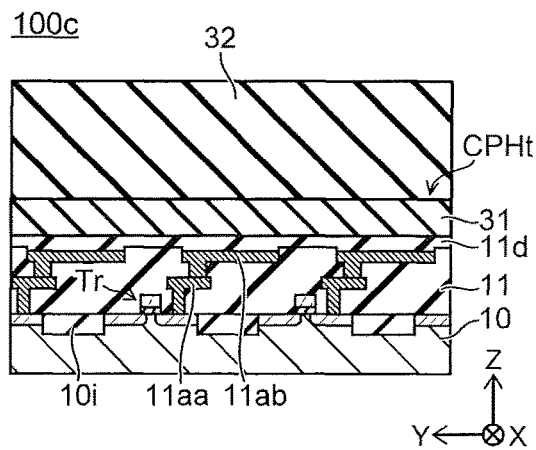
Figure 48A:
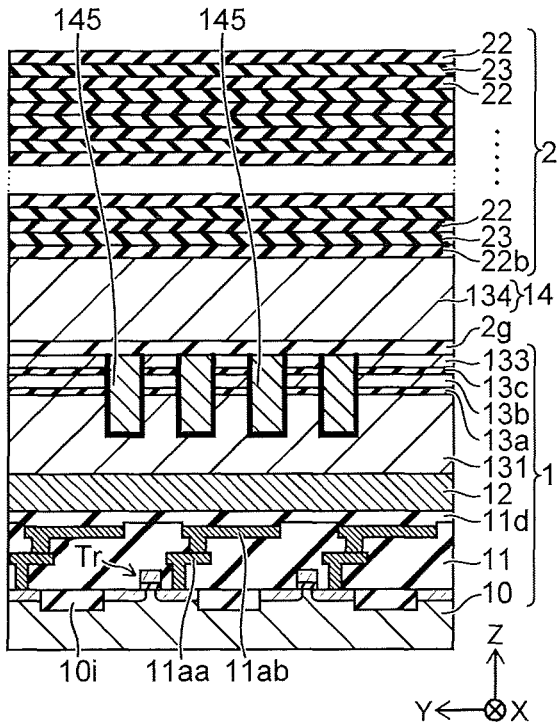
Figure 48B:
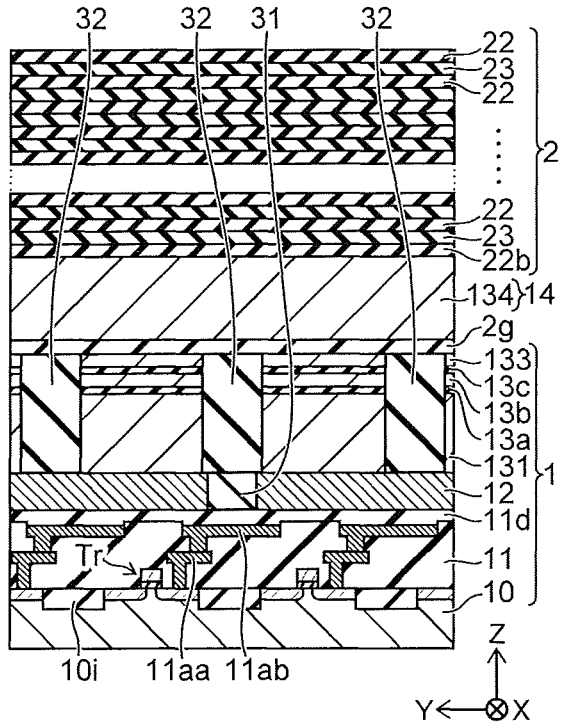
Figure 48C:
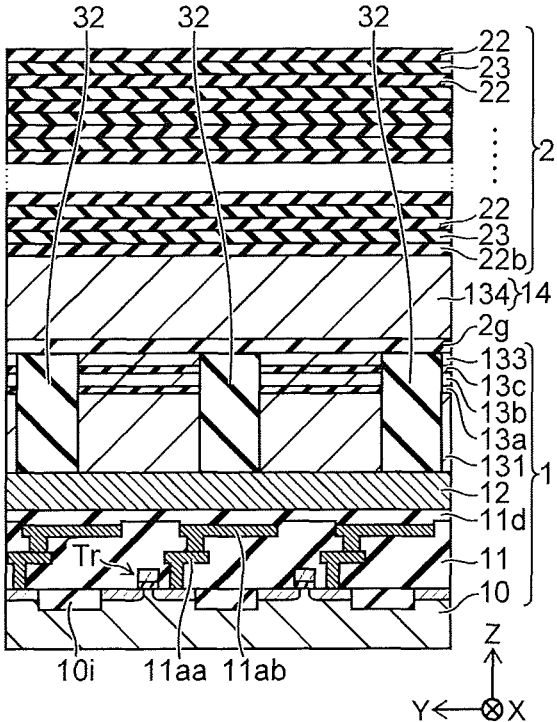
Figure 48D:
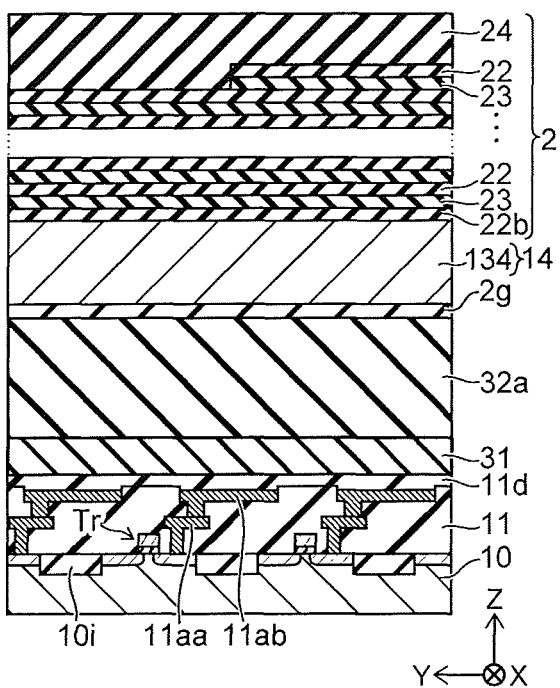

FIG. 41 is a schematic plan view illustrating the semiconductor device 100c according to the third embodiment. FIG. 42A to FIG. 48D and FIG. 49 to FIG. 56 are schematic cross-sectional views sequentially illustrating the processes, which show the method for manufacturing the semiconductor device 100c according to the third embodiment. The plan view shown in FIG. 41 corresponds to the plan view shown in FIG. 3. The cross sections shown in FIG. 42A to FIG. 48A and FIG. 49 to FIG. 56 are along line A-A shown in FIG. 41, The cross sections shown in FIG. 42B to FIG. 48B are along line B-B shown in FIG. 41. The cross sections shown in FIG. 42C to FIG. 48C are along line C-C shown in FIG. 41. The cross sections shown in FIG. 42D to FIG. 48D are along line D-D shown in FIG. 41.

As shown in FIG. 42A to FIG. 42D, similarly to the first embodiment, for example, according to the manufacturing method described with reference to FIG. 11A to FIG. 13D, the third semiconductor layer 133 is formed on the second intermediate film 13c; and, for example, the basic structure of the base body 1 when manufacturing is obtained.

Then, as shown in FIG. 43A to FIG. 43D, the third semiconductor layer 133, the second intermediate film 13c, the first sacrificial film 13b, the first intermediate film 13a, and the first semiconductor layer 131 are etched; and these films are patterned into a designed pattern. In the embodiment, openings CPHt and CPH are formed by the patterning. The openings CPHt have line patterns along the X-axis direction and the Y-axis direction. Although only one opening CPHt is shown in FIG. 41, actually, the openings CPHt multiply exist. The openings CPHt that have the line patterns have, for example, multiple island portions CPHi in the tap region (Tap). The island portions CPHi are arranged in a column configuration along the Y-axis direction (see FIG. 41). For example, the island portions CPHi are formed in each region between the deep slit ST and the deep slit ST. The openings CPH are multiply provided and have an isolated hole pattern. The openings CPH are formed respectively inside the island portions CPHi.

Continuing as shown in FIG. 44A to FIG. 44D, base openings CPHmb are formed by etching the third semiconductor layer 133, the second intermediate film 13c, the first sacrificial film 13b, the first intermediate film 13a, and the first semiconductor layer 131 in the cell region (Cell). The base openings CPHmb have an isolated hole pattern and are formed partway through the first semiconductor layer 131. For example, a hole opening diameter D1 of the base opening CPHmb is formed to be narrower than, for example, an opening width W1 along the Y-axis direction of the opening CPHt facing the island portion CPHi and narrower than, for example, a hole opening diameter D2 of the opening CPH. Although not particularly illustrated, the opening diameter 131 is set to be narrower than the opening width in the X-axis direction of the opening CPHt along the island portion CPHi. The insulating film 144 is formed to cover the inner surfaces of the base openings CPHmb, the openings CPHt, and the openings CPH. The insulating film 144 is, for example, a silicon oxide film.

Then, as shown in FIG. 45A to FIG. 45D, a sacrificial film 145 is formed to fill the base openings CPHmb. For example, an amorphous silicon film is formed on the structure body shown in FIG. 44A to FIG. 44D as the sacrificial film 145. The sacrificial film 145 is formed to have a thickness that plugs the base openings CPHmb but leaves a space inside the openings CPH and CPHt.

Continuing as shown in FIG. 46A to FIG. 46D, for example, the sacrificial film 145 is removed by isotropic etching. Thereby, the sacrificial film 145 remains inside the base openings CPHmb while being removed from inside the openings CPH and CPHt. Further, the insulating film 144 is removed, which is exposed by removing the sacrificial film 145.

Then, as shown in FIG. 47A to FIG. 47D, a silicon oxide film is formed by depositing an insulator, e.g., silicon oxide, on the structure body shown in FIG. 46A to FIG. 46D, Continuing, the silicon oxide is caused to remain inside the openings CPH and CPHt by planarizing the silicon oxide film by using, for example, chemical mechanical polishing, etc. Thereby, the insulating film 32 is formed inside the openings CPH and CPHt. The insulating film 32 that is formed in the tap region (Tap) surrounds the island portions CPHi. Thereby, the first sacrificial film 13b can be caused to remain inside the tap region (Tap) when removing the first sacrificial film 13b. Therefore, for example, even in the case where the second columnar parts CLHR are stopped partway through the second semiconductor part 14, the collapse of the stacked body 2 can be suppressed.

Then, as shown in FIG. 48A to FIG. 48D, the insulating film 2g is formed on the third semiconductor layer 133, the insulating film 32, and the sacrificial film 145, Continuing, the insulating layers 22 and the second sacrificial films 23 are stacked alternately after forming the fourth semiconductor layer 134 on the insulating film 2g, Thereby, for example, similarly to the manufacturing method described with reference to FIG. 15A to FIG. 15D, the basic structure of the stacked body 2 when manufacturing that is positioned in the Z-axis direction with respect to the first semiconductor part 13 is obtained.

The insulating layers 22 and the second sacrificial films 23 are patterned into a staircase configuration in the staircase portion 2s. Thereby, the staircase region (Staircase) is obtained in the staircase portion 2s. Continuing, the insulating film 24 is formed by burying the recess formed in the staircase region with an insulator.

Then, the holes HR are formed by performing anisotropic etching of the stacked body 2 and the fourth semiconductor layer 134 in the tap region (Tap) and the staircase region (Staircase). In the embodiment, the holes HR are formed partway through the fourth semiconductor layer 134 from the upper end of the stacked body 2. Continuing, the third insulators 5 are formed by filling the interiors of the holes HR with an insulator. Thereby, the second columnar parts CLHR are formed (see FIG. 17A to FIG. 19D).

Figure 49:
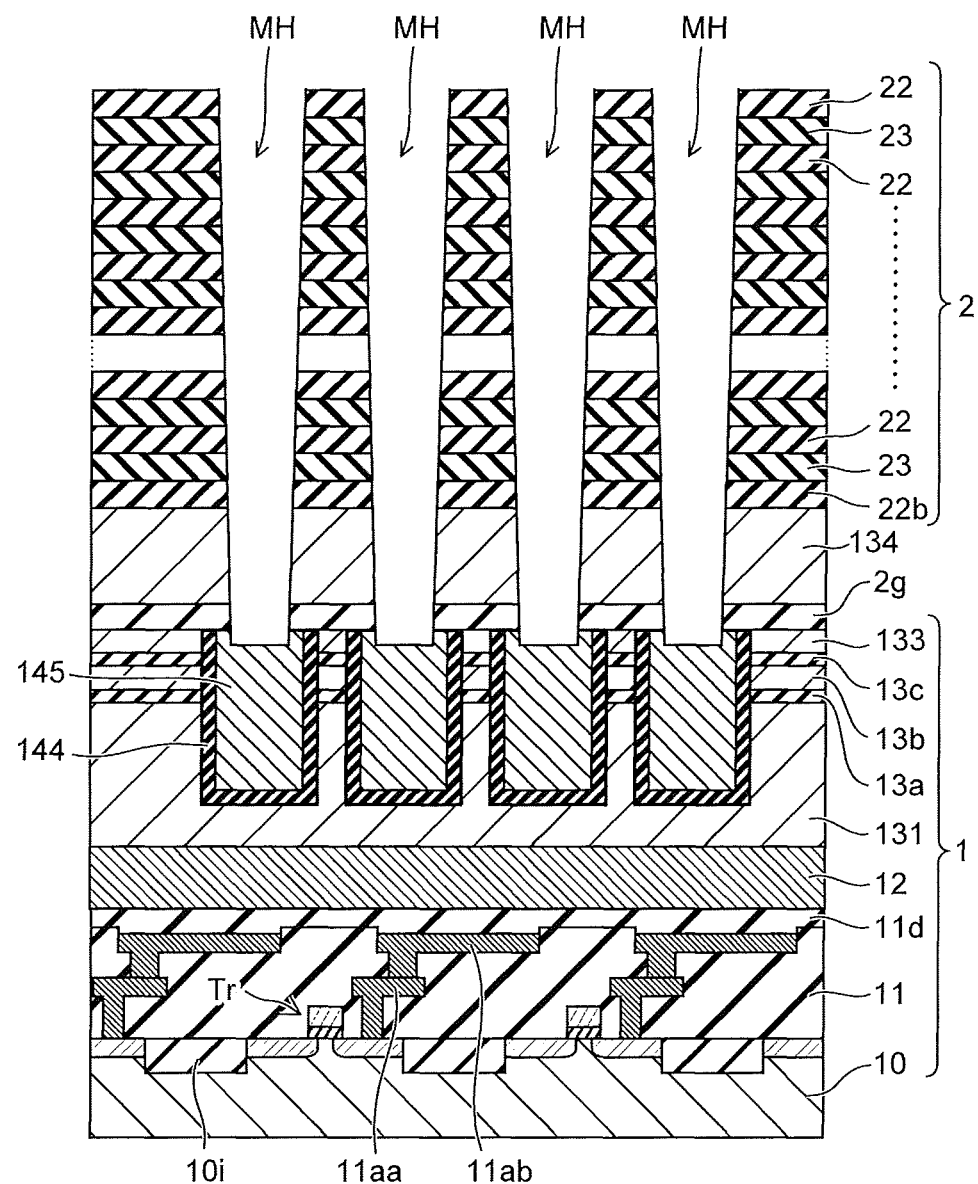

Continuing as shown in FIG. 49, the memory holes MH are formed by performing anisotropic etching of the stacked body 2, the fourth semiconductor layer 134, and the insulating film 2g in the cell region (Cell). The memory holes NIH are formed to reach the sacrificial film 145.

Figure 50:
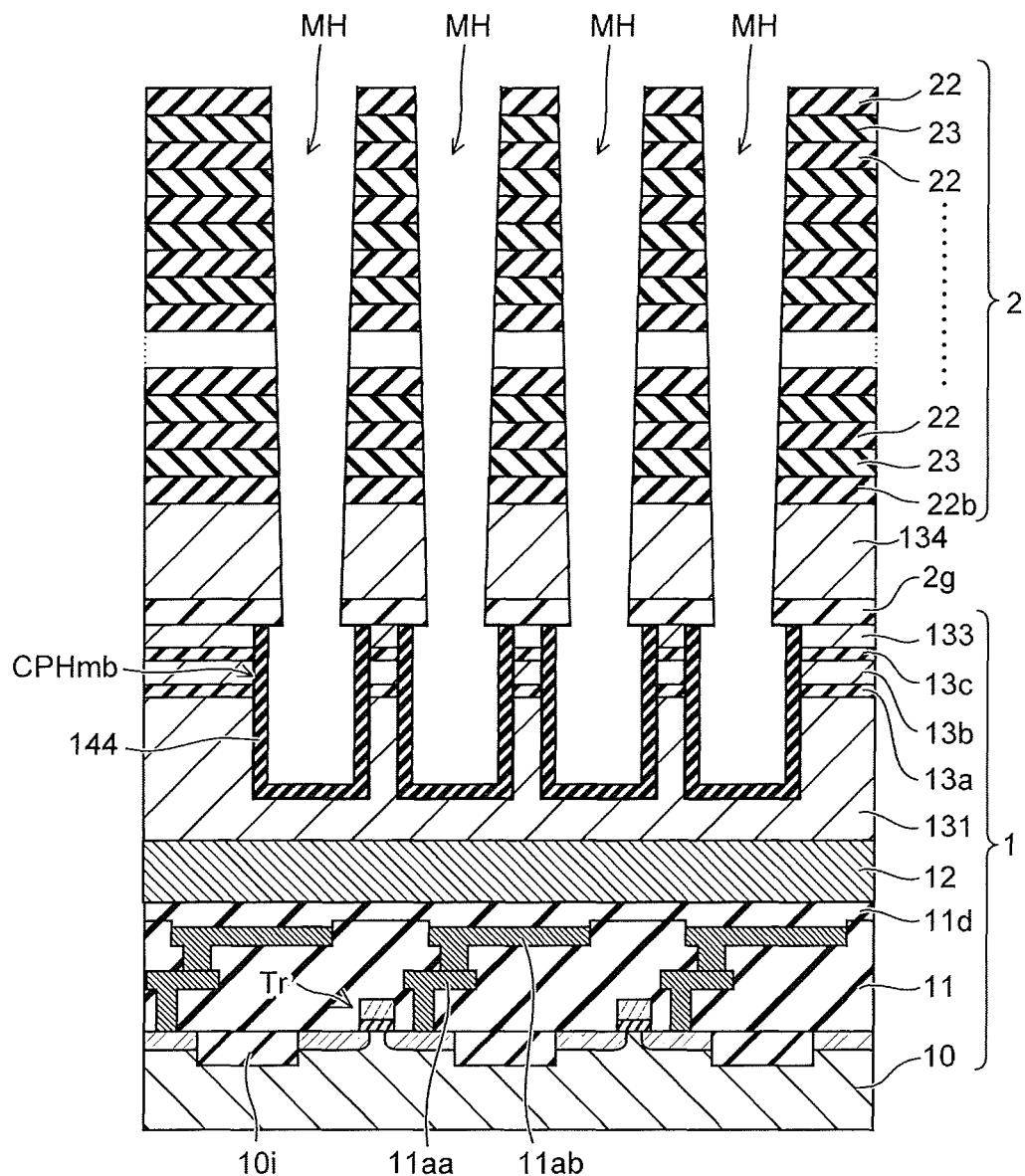

As shown in FIG. 50, the sacrificial film 145 is selectively removed via the memory holes MH. For example, the sacrificial film 145 is removed by supplying, via the memory holes MH, an etchant having selectivity with respect to the stacked body 2, the fourth semiconductor layer 134, and the insulating film 2g.

Figure 51:
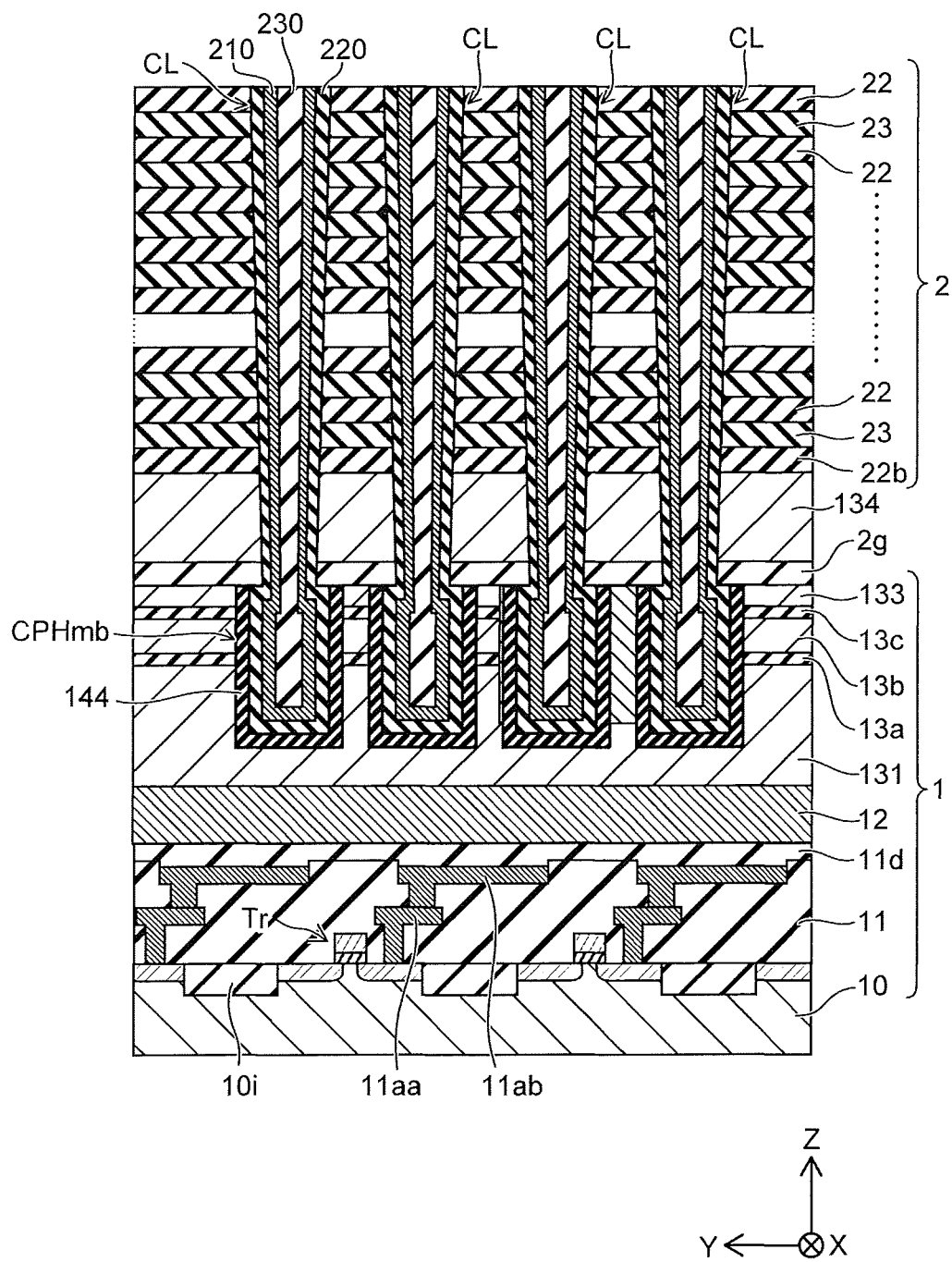

As shown in FIG. 51, the memory film 220 is formed inside the memory holes MH and inside the space where the sacrificial film 145 is removed. The memory film 220 includes silicon nitride and silicon oxide. Continuing, the semiconductor body 210 is formed on the memory film 220. The semiconductor body 210 includes, for example, undoped silicon or p-type doped silicon. Continuing, the core layer 230 is formed on the semiconductor body 210.

Thereby, the memory holes NIH and the space where the sacrificial film 145 is removed are filled with the semiconductor body 210, the memory film 220, and the core layer 230.

Figure 52:
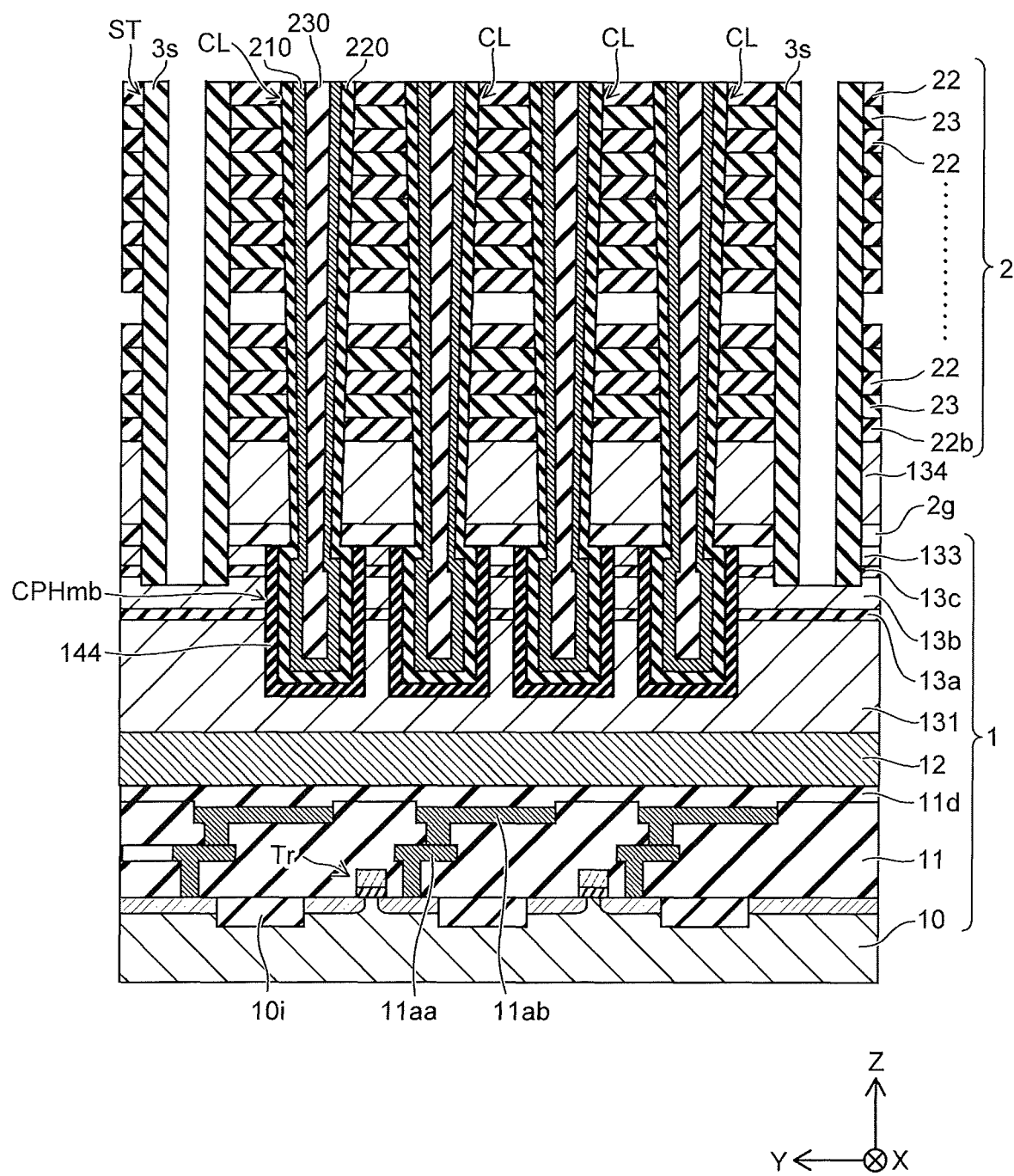

Then, as shown in FIG. 52, the deep slits ST are formed by performing anisotropic etching of the stacked body 2, the fourth semiconductor layer 134, the insulating film 2g, the third semiconductor layer 133, the second intermediate film 13c, and the first sacrificial film 13b. The deep slits ST are formed partway through the first sacrificial film 13b from the upper end of the stacked body 2. Continuing, the first stopper film 3s is formed on the side walls of the deep slits ST. The first stopper film 3s includes, for example, silicon nitride.

Figure 53:
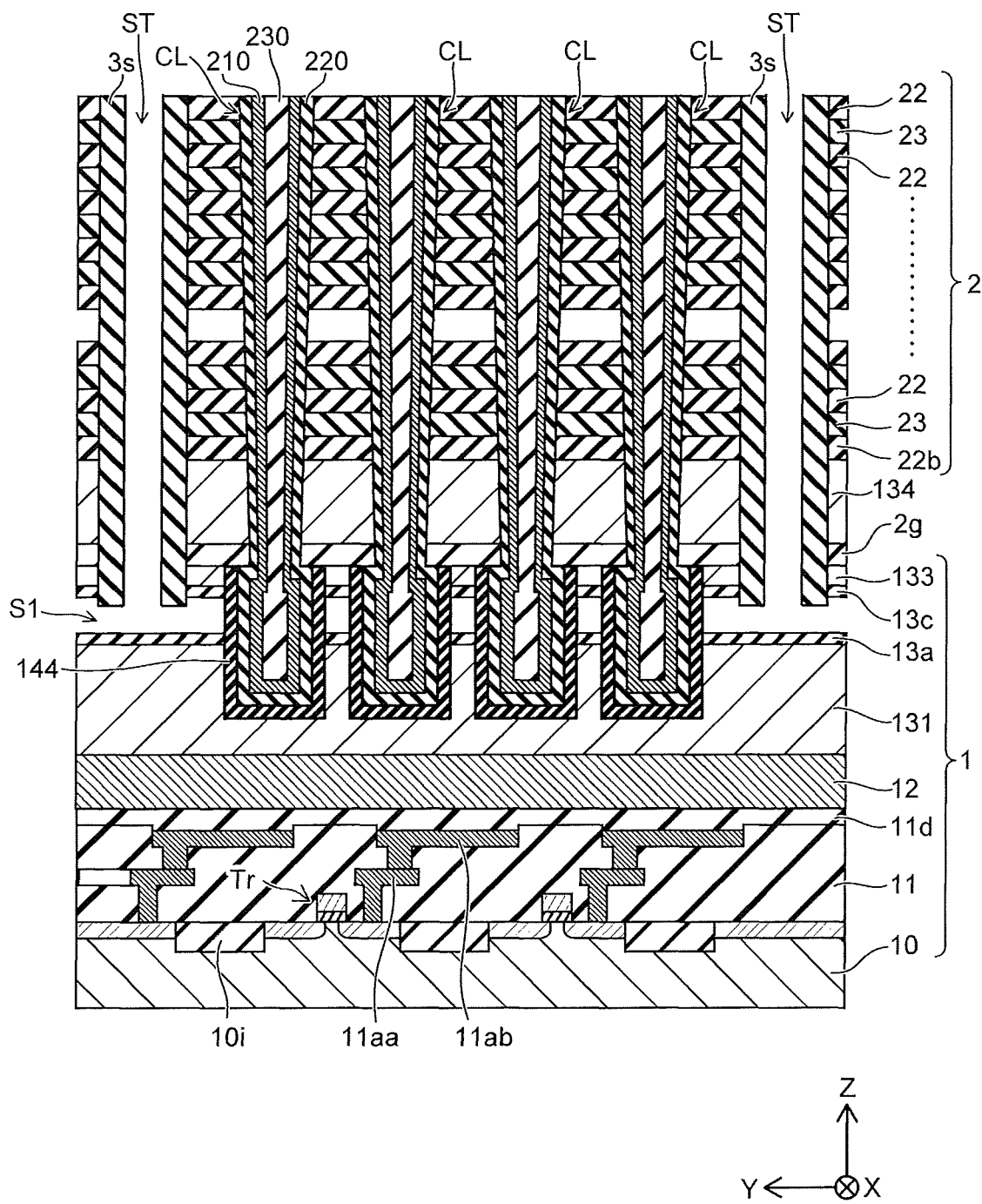

Continuing as shown in FIG. 53, the first sacrificial film 13b is removed by performing isotropic etching of the first sacrificial film 13b via the deep slits ST. For example, an etchant that can etch n-type doped silicon or undoped silicon quickly compared to silicon oxide and silicon nitride is selected for the isotropic etching process. Thereby, the first space S1 is formed between the first intermediate film 13a and the second intermediate film 13c.

Figure 54:
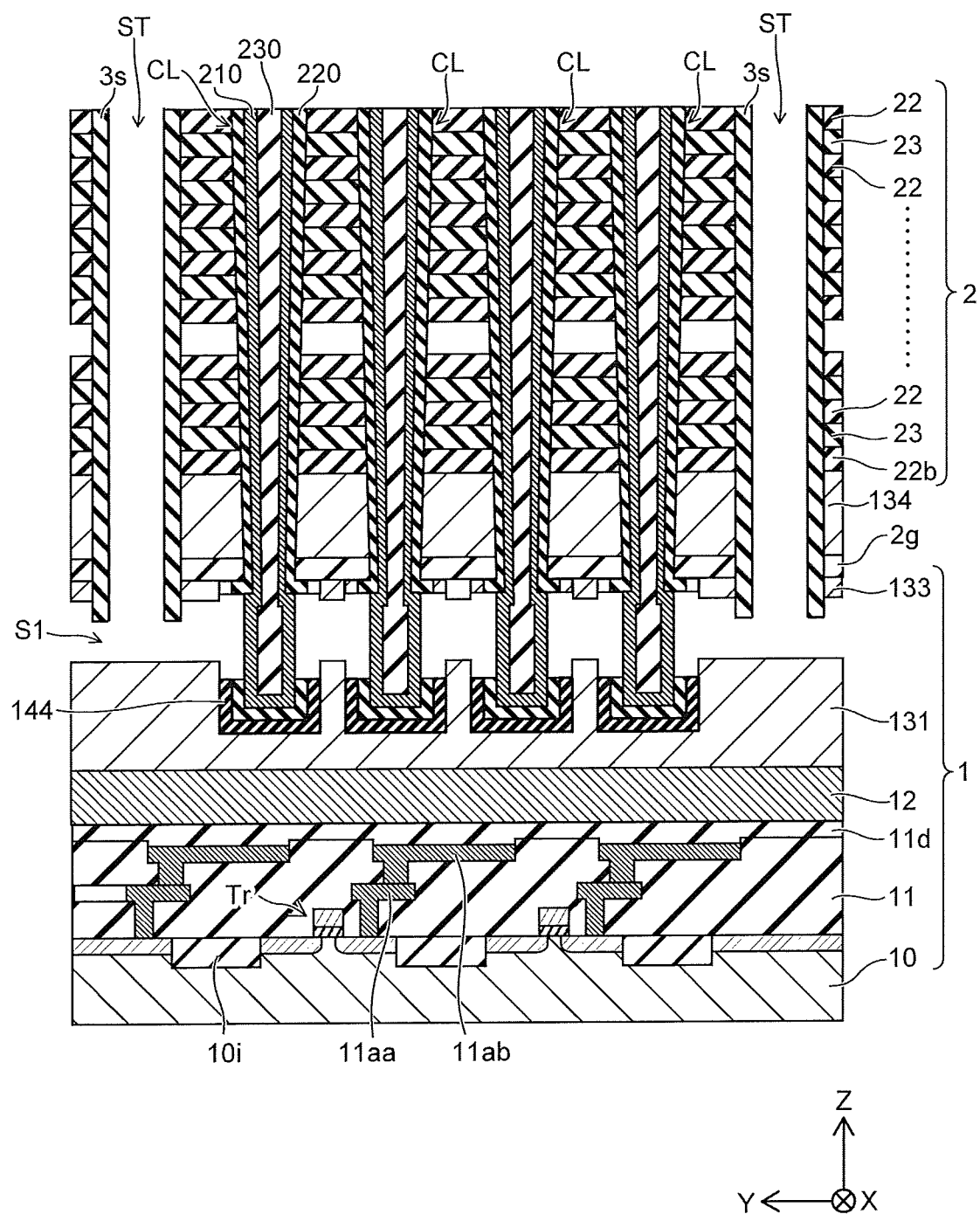

Then, as shown in FIG. 54, the first and second intermediate films 13a and 13c are removed via the deep slits ST. Further, the semiconductor body 210 is exposed in the first space S1 by removing a portion of the insulating film 144 and a portion of the memory film 220.

Figure 55:
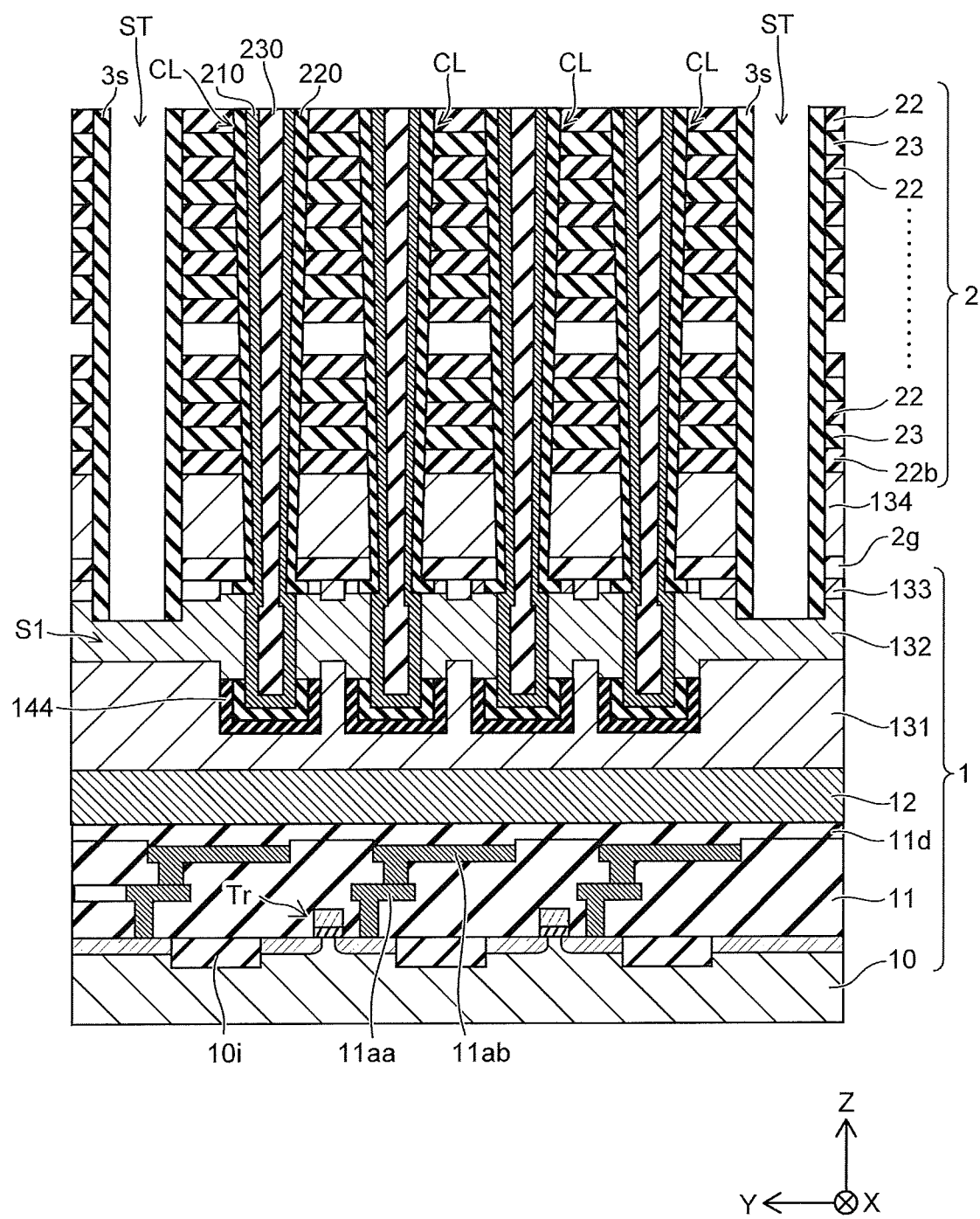

Continuing as shown in FIG. 55, the second semiconductor layer 132 is formed by filling the interior of the first space S1 with a semiconductor via the deep slits ST. The second semiconductor layer 132 is, for example, n-type doped silicon. Thereby, for example, a contact portion is obtained between the second semiconductor layer 132 and the side wall of the semiconductor body 210.

Figure 56:
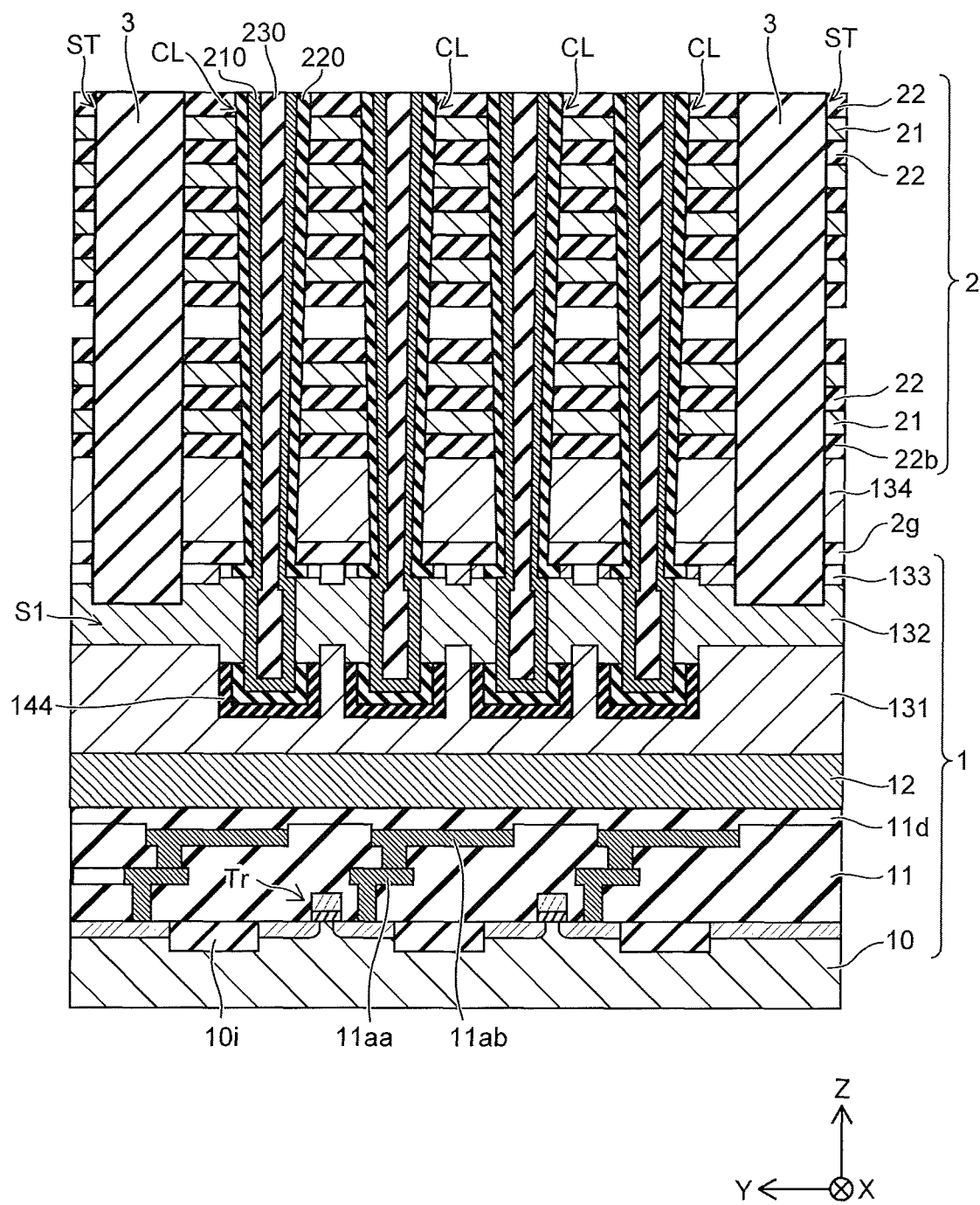

Then, as shown in FIG. 56, the second sacrificial films 23 are replaced with the conductive layers 21. For example, the first stopper film 3s and the second sacrificial films 23 are removed by performing isotropic etching of the first stopper film 3s and the second sacrificial films 23 via the deep slits ST. Thereby, the second space S2 is formed between the insulating layers 22. Continuing, after forming the conductive layers 21 by filling the interior of the second space S2 with a conductor via the deep slits ST, the plate portions 3 are formed by filling the deep slits ST with an insulator (see FIG. 28A to FIG. 30D).

Figure 57A:
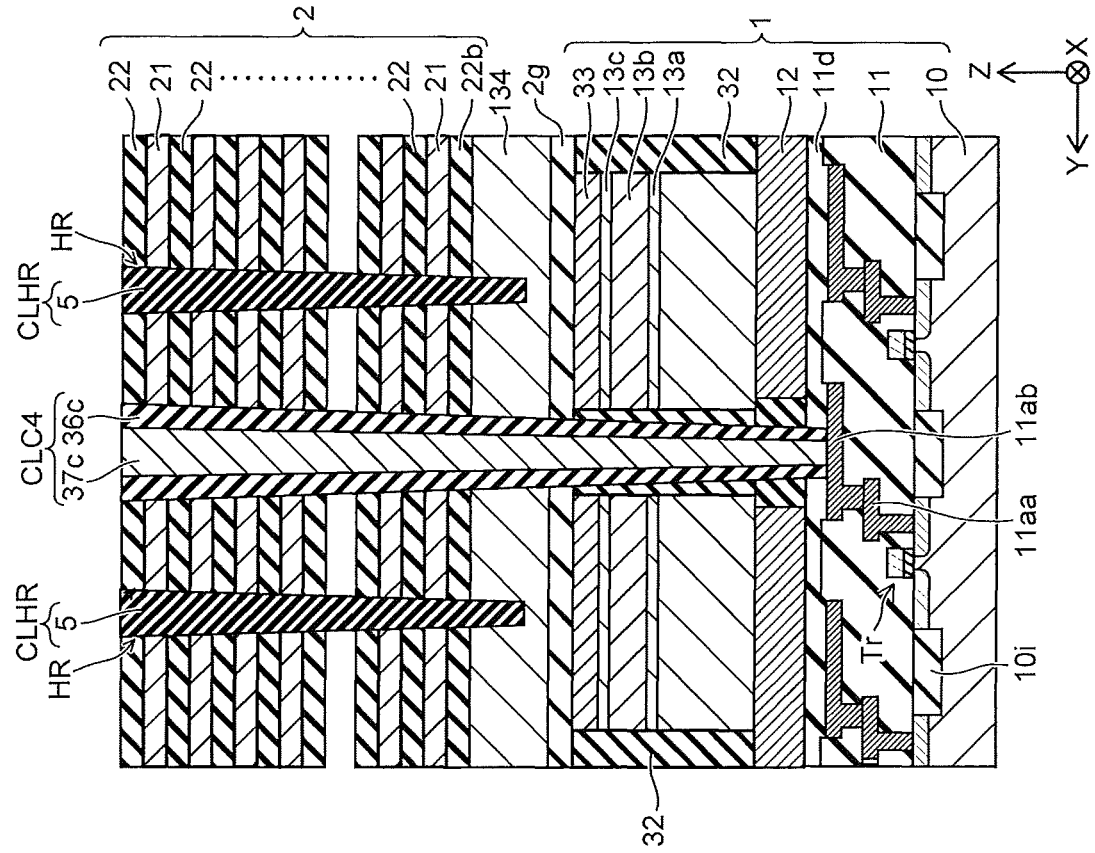
FIGS. 57A and 57B are schematic cross-sectional views illustrating a tap region of the semiconductor device according to the third embodiment.
Figure 57B:
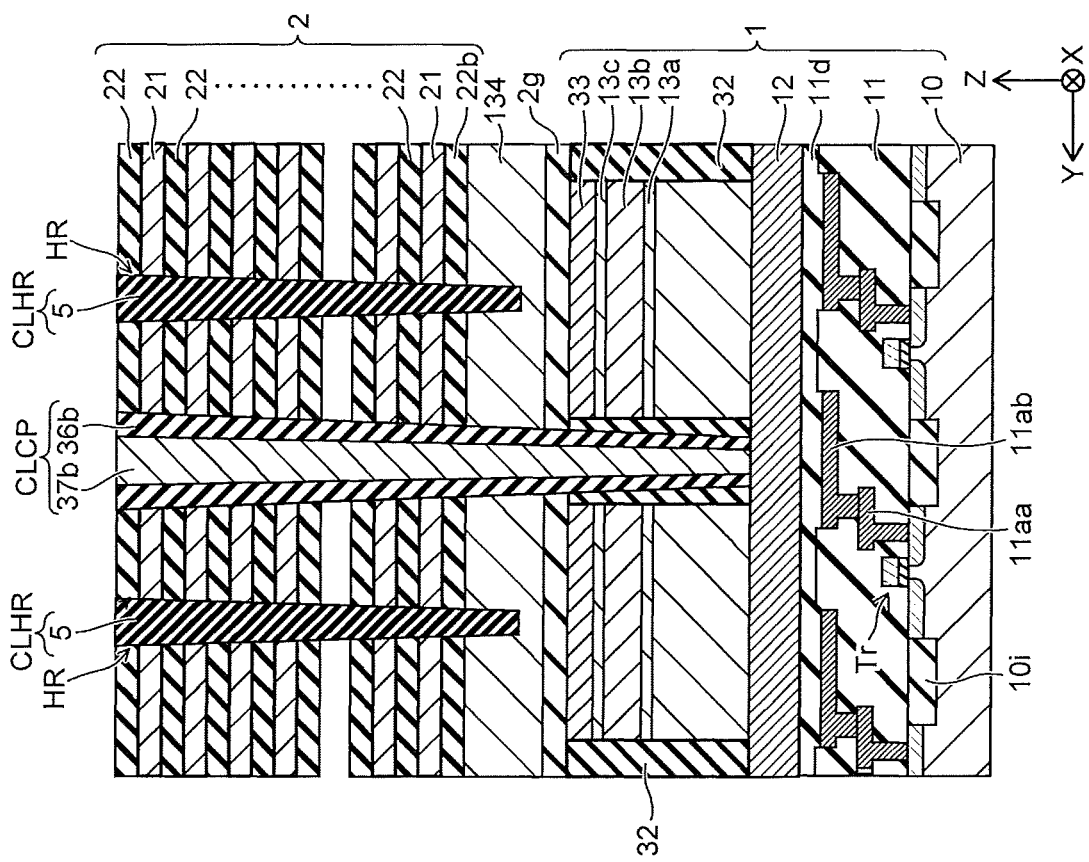

FIGS. 57A and 57B are schematic views showing cross sections along line B-B and line C-C in the tap region Tap. For example, the second columnar parts CLHR, the fourth columnar parts CLCP, and the fifth columnar parts CLC4 are formed in the tap region (Tap). In the example, the second columnar parts CLHR are formed to have lengths that reach the fourth semiconductor layer 134 from the upper surface of the stacked body 2.

As shown in FIG. 57A, the fourth columnar part CLCP is formed to have a length that reaches the first conductive film 12 from the upper surface of the stacked body 2. The fourth columnar part CLCP includes the insulator 36b and the interconnect 37b. The interconnect 37b extends in the Z-direction and electrically connects the first conductive film 12 to an upper layer interconnect (not illustrated). The insulator 36b is provided to surround the interconnect 37b and electrically insulate the interconnect 37b from the conductive layers 21.

As shown in FIG. 57B, the fifth columnar part CLC4 has a length that reaches the interconnect 11ab from the upper surface of the stacked body 2. The fifth columnar part CLC4 includes the insulator 36c and the interconnect 37c. The interconnect 37c electrically connects an upper layer interconnect (not illustrated) to the interconnect 11ab positioned at a level lower than the first conductive film 12. The insulator 36c is provided to surround the interconnect 37c and electrically insulate the interconnect 37c from the conductive layers 21.

In the embodiment, the first intermediate film 13a, the first sacrificial film 13b, and the second intermediate film 13c remain in the tap region (Tap) surrounded with the insulating film 32. In other words, the tap region (Tap) supports the stacked body 2 and performs the role of preventing the collapse of the stacked body 2 in the process of removing the first sacrificial film 13b (see FIG. 53) and the process of removing the first intermediate film 13a and the second intermediate film 13c (see FIG. 54).

Although descriptions of the following processes are omitted, the semiconductor device 100c is manufactured according to a manufacturing method similar to that of the semiconductor device 100a according to the first embodiment, e.g., the manufacturing method described with reference to FIG. 31A to FIG. 32D. Thus, it is possible to manufacture the semiconductor device 100c.

Fourth Embodiment (Semiconductor Device)

Figure 58:
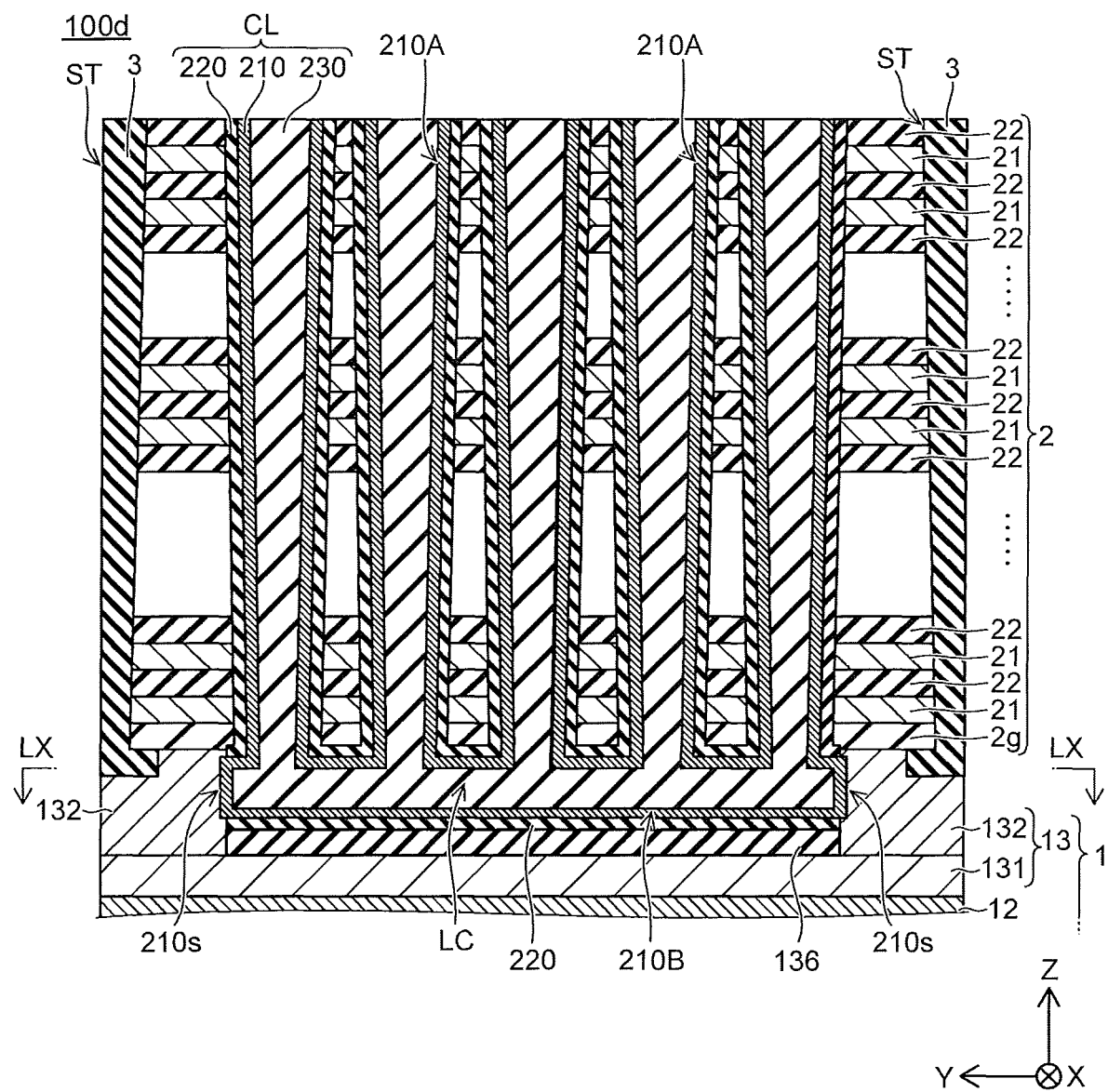
FIG. 58 is a schematic cross-sectional view illustrating a semiconductor device according to a fourth embodiment.
Figure 59A:
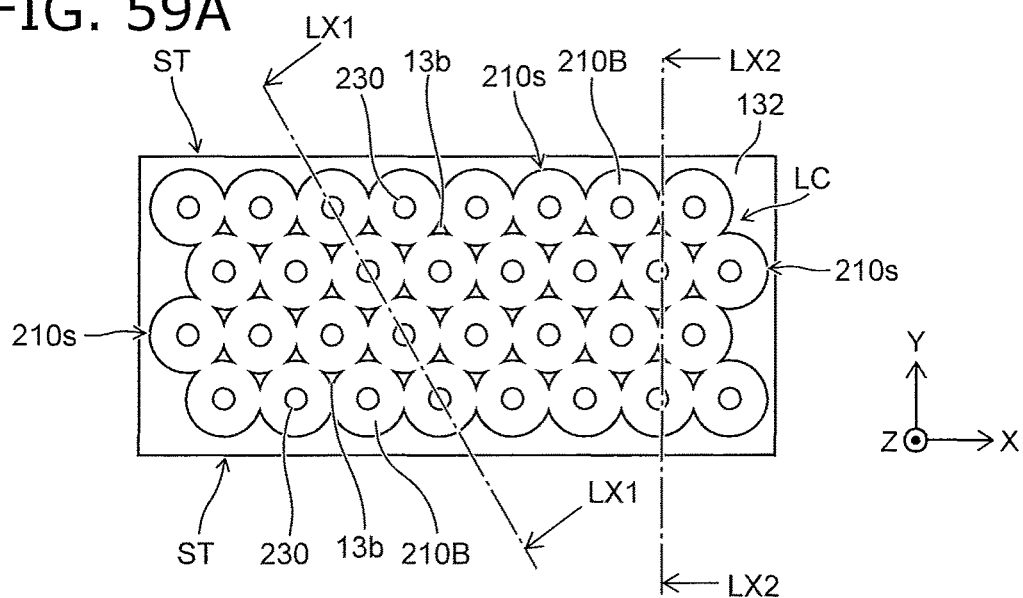
FIG. 59A is a schematic view showing a cross section along line LX-LX in FIG. 58.
Figure 59B:
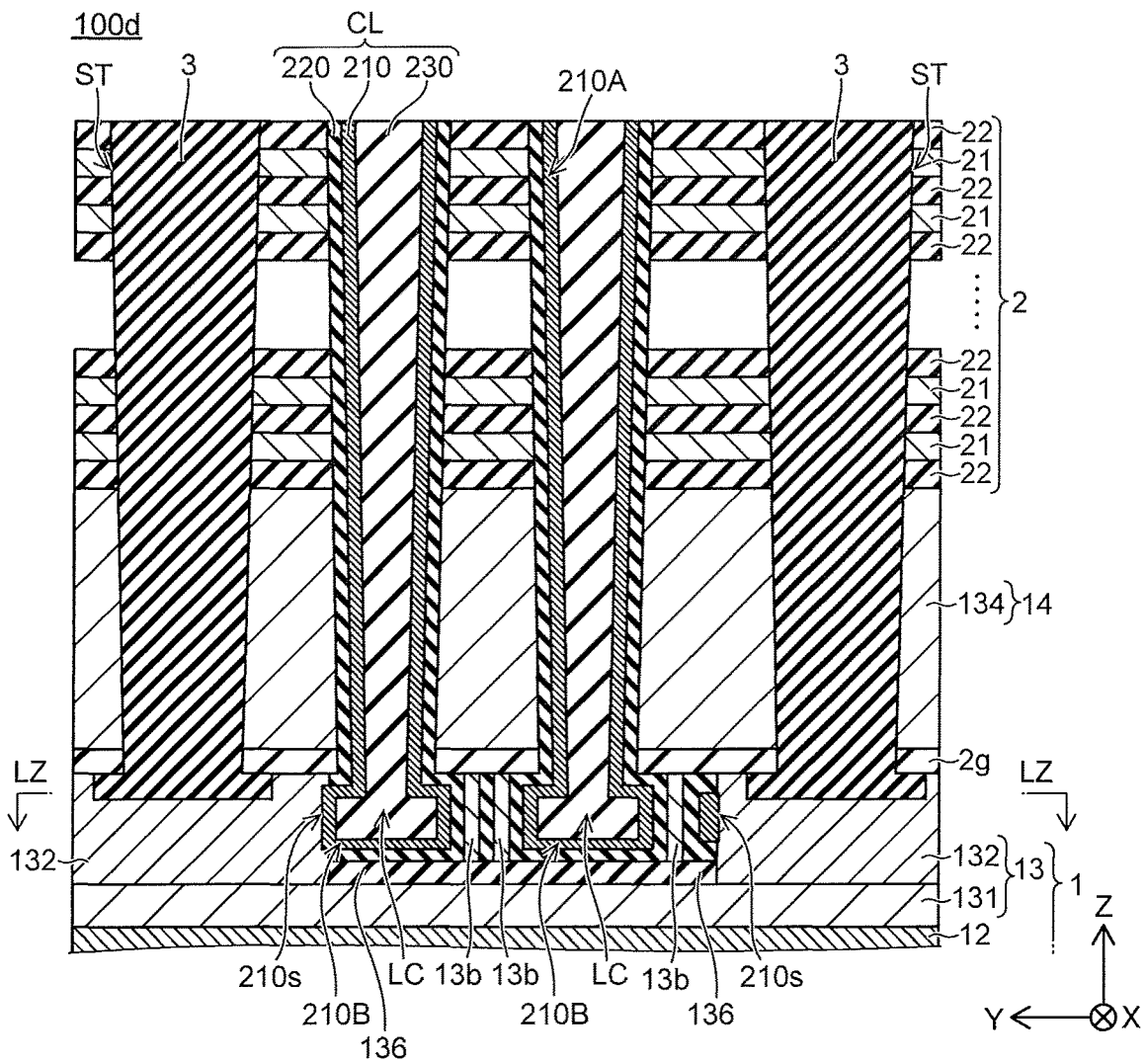
FIG. 59B is a schematic cross-sectional view along line LX2-LX2 in FIG. 59A.

FIG. 58 is a schematic cross-sectional view illustrating a semiconductor device 100d according to a fourth embodiment. FIG. 59A is a schematic view showing a cross section along line LX-LX in FIG. 58. FIG. 58 is a schematic view showing a cross section along line LX1-LX1 in FIG. 59A. FIG. 59B is a schematic cross-sectional view along line LX2-LX2 in FIG. 59A. The schematic plan view shown in FIG. 59A shows a portion of the cell region (Cell).

As shown in FIG. 58 and FIG. 59B, the semiconductor device 100d according to the fourth embodiment includes the base body 1, the stacked body 2, the plate portions 3, and the multiple first columnar parts CL similarly to the semiconductor device 100a. Although the base body 1 of the semiconductor device 100d includes the substrate 10, the first insulating film 11, the first conductive film 12, and the first semiconductor part 13, the substrate 10 and the first insulating film 11 are not illustrated in FIG. 58 and FIG. 59B, Although the semiconductor device 100d also includes the multiple second columnar parts CLHR, the multiple second columnar parts CLHR are not illustrated in FIG. 58 and FIG. 59B.

As shown in FIG. 58, the first semiconductor part 13 of the semiconductor device 100d includes the first semiconductor layer 131 and the second semiconductor layer 132. The first semiconductor layer 131 and the second semiconductor layer 132 are, for example, n-type doped silicon layers. The first semiconductor layer 131 is provided on the first conductive film 12; and the second semiconductor layer 132 is provided on the first semiconductor layer 131.

The multiple first columnar parts CL each extend through the stacked body 2 from the upper end of the stacked body 2 along the Z-axis direction and are provided inside the stacked body 2 and inside the first semiconductor part 13. Also, the multiple first columnar parts CL are integrated as one body with a bottom portion LC positioned inside the second semiconductor layer 132 and spreading along in-plane (X-Y plane) direction of the substrate under the multiple first columnar parts CL. An insulative intermediate film 136 is further provided between the first semiconductor layer 131 and the bottom portion LC positioned inside the second semiconductor layer 132.

The multiple first columnar parts CL include the semiconductor body 210, the memory film 220, and the core layer 230. The semiconductor body 210 extends along the Z-axis direction through the multiple first columnar parts CL and includes channel portions 210A used to form the channels of the memory strings, and an extension portion 210B provided inside the bottom portion LC and spreading along the in-plane direction of the substrate under the multiple first columnar parts CL. For the semiconductor body 210 inside the multiple first columnar parts CL, the extension portion 210B is formed continuously to be shared by the multiple channel portions 210A and to electrically connect the multiple channel portions 210A to each other. The portions of the memory film 220 and the core layer 230 inside the multiple first columnar parts CL also are formed continuously to share the portion provided at the bottom portion LC. The memory film 220 includes a portion positioned between the intermediate film 136 and the bottom surface of the semiconductor body 210 positioned inside the bottom portion LC.

In the semiconductor device 100d, the semiconductor bodies 210 of the multiple first columnar parts CL are electrically connected to the second semiconductor layer 132 via the extension portion 210B provided inside the bottom portion LC under the multiple first columnar parts CL. The extension portion 210B of the semiconductor body 210 that is provided inside the bottom portion LC includes a side surface portion 210s that is not covered with the memory film 220 at an outer perimeter portion spreading in the X-Y planar direction. The extension portion 210B of the semiconductor body 210 contacts the second semiconductor layer 132 adjacent in the X-Y planar direction at the side surface portion 210s. The conductivity type of the extension portion 210B of the semiconductor body 210 is, for example, the p-type. For example, the second semiconductor layer 132 and the extension portion 210B of the semiconductor body 210 that are in contact at the side surface portion 210s are electrically connected to each other by forming a p-n junction.

As shown in FIG. 59A, the bottom portion LC that extends under the multiple first columnar parts CL has a configuration in which the bottom portions of the semiconductor bodies 210, which have substantially circular cross sections, are multiply connected to each other in the X-Y plane. In other words, the extension portion 210B of the semiconductor body 210 has a configuration in which substantially circular patterns are connected to each other when viewed from above; and the side surface portion 210s at substantially the entire circumference of the outer perimeter portion is connected to the second semiconductor layer 132. Also, a portion of the first sacrificial film 13b remains between the substantially circular patterns.

Although the extension portions 210B of the semiconductor bodies 210 appear to be separated from each other in the cross section shown in FIG. 59B, the extension portions 210B of the semiconductor bodies 210 are linked at a not-illustrated portion. Also, a portion of the first sacrificial film 13b remains between the extension portions 210B. In this cross section as well, the side surface portion 210s of the extension portion 210B is connected to the second semiconductor layer 132.

According to the semiconductor device 100d, the second semiconductor layer 132 is connected to the common portion of the semiconductor bodies 210 provided inside the bottom portion LC under the multiple first columnar parts CL. Thereby, the operations of the semiconductor device 100d can be stabilized. For example, a p-n junction is formed at the side surface portion 210s of the semiconductor body 210 contacting the second semiconductor layer 132; and a GIDL current (Gate Induced Drain Leakage current) can be generated when erasing the data stored in the memory cells MC.

For example, in a structure in which the second semiconductor layer 132 is connected separately to each of the bottom portions of the multiple first columnar parts CL, unless the connection portions between the second semiconductor layer 132 and the semiconductor bodies 210 are formed uniformly for the first columnar parts CL, diverse values of the GIDL current are supplied to the first columnar parts CL; and there is the case where the data erase cannot be performed simultaneously in the memory cells MC positioned along the first columnar parts CL.

In contrast, in the semiconductor device 100d, the GIDL current that is generated at the side surface portion 210s of the extension portion 210B of the semiconductor body 210 is supplied substantially uniformly to the semiconductor bodies 210 of the first columnar parts CL sharing the extension portion 210B. Therefore, it is possible to substantially uniformly supply the holes for the data erase to the memory cells MC arranged along each of the first columnar parts CL. Thereby, in the semiconductor device 100d, for example, the fluctuation of the data erasing characteristics is suppressed; and it is possible to realize a faster erase operation.

(Manufacturing Method)

A typical example of the method for manufacturing the semiconductor device 100d will now be described.

FIG. 60A to FIG. 60I are schematic cross-sectional views sequentially illustrating the manufacturing processes of the semiconductor device 100d. FIG. 60A to FIG. 60I are partial cross-sectional views showing a cross section along line LX1-LX1 in FIG. 59A.

As shown in FIG. 60A, the first sacrificial film 13b is formed on the first semiconductor layer 131 with the intermediate film 136 interposed. The insulating layers 22 and the second sacrificial films 23 are stacked alternately on the insulating film 2g after forming the insulating film 2g on the first sacrificial film 13b. For example, silicon oxide is selected as the intermediate film 136. For example, undoped silicon is selected as the first sacrificial film 13b. The insulating film 2g includes a material having resistance to the etching conditions of the processes of FIG. 60C, FIG. 60F, FIG. 60G, and FIG. 60I described below. For example, a metal oxide such as zinc oxide (ZnO) or the like is an example of such a material.

As shown in FIG. 60B, the memory holes MH are formed by performing anisotropic etching of the second sacrificial films 23, the insulating layers 22, and the insulating film 2g. For example, the memory holes MH have depths that reach the first sacrificial film 13b.

As shown in FIG. 60C, the bottom portions of the memory holes MH are caused to communicate with each other by performing isotropic etching of the first sacrificial film 13b via the memory holes MH. For example, an etchant including choline is used as the etchant of the isotropic etching process.

As shown in FIG. 60D, the memory film 220 is formed inside the memory holes MH. The memory film 220 includes silicon nitride and silicon oxide. Continuing, the semiconductor body 210 is formed on the memory film 220. The semiconductor body includes, for example, p-type doped silicon. Continuing, the core layer 230 is formed on the semiconductor body 210. The core layer 230 includes, for example, silicon oxide. Thereby, the memory holes NIH are filled with the semiconductor body 210, the memory film 220, and the core layer 230, The semiconductor body 210, the memory film 220, and the core layer 230 fill the portion where the bottom portions of the memory holes MH communicate with each other at the level of the first sacrificial film 13b.

As shown in FIG. 60E, the deep slits ST are formed by performing anisotropic etching of the second sacrificial films 23, the insulating layers 22, and the insulating film 2g.

As shown in FIG. 60F, the first sacrificial film 13b is removed via the deep slits ST.

As shown in FIG. 60G, the memory film 220 is removed via the deep slits ST. Thereby, the side surface portion 210s of the semiconductor body 210 is exposed. The intermediate film 136 also is etched when removing the memory film 220; and an upper surface portion 131u of the first semiconductor layer 131 is exposed.

As shown in FIG. 60H, the second semiconductor layer 132 is formed via the deep slits ST. The second semiconductor layer 132 is, for example, n-type silicon. The second semiconductor layer 132 is formed to cover the side surface portion 210s of the semiconductor body 210 and the upper surface portion 131u of the first semiconductor layer 131.

As shown in FIG. 60I, after replacing the second sacrificial films 23 with the conductive layers 21 via the deep slits ST, the plate portions 3 are formed by filling the deep slits ST with an insulator.

Although descriptions of the following processes are omitted, the semiconductor device 100d is manufactured according to a manufacturing method similar to that of the first embodiment, e.g., the manufacturing method described with reference to FIG. 31A to FIG. 32D. Thus, it is possible to manufacture the semiconductor device 100d.

In the semiconductor device 100d according to the embodiment, the multiple first columnar parts CL share the bottom portion LC, Thereby, for example, the strength of the portion supporting the stacked body 2 can be high after the first sacrificial film 13b is removed in the process shown in FIG. 60F and FIG. 60G, As a result, the collapse of the stacked body 2 can be avoided in the manufacturing processes of the semiconductor device 100d.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention,

What is claimed is:

1. A nonvolatile semiconductor memory device comprising:
    an underlying insulating layer provided above a substrate;
    a source layer provided above the underlying insulating layer, the source layer including a conductive part and a semiconductor part above the conductive part;
    a stacked body provided above the source layer, the stacked body including a plurality of first electrode layers and a plurality of first insulating layers interposed between two of the first electrode layers adjacent in a stacking direction respectively; and
    a first columnar part piercing through the stacked body in the stacking direction, a lower end portion of the first columnar part being electrically connected to the source layer,
    the first columnar part having a first width in a first direction perpendicular to the stacking direction inside the semiconductor part and a second width in the first direction inside a lowermost first insulating layer of the first insulating layers, the first width being larger than the second width.

2. The device according to claim 1, wherein the semiconductor part includes a first semiconductor layer, a second semiconductor layer on the first semiconductor layer and a third semiconductor layer on the second semiconductor layer, and the first columnar part includes a semiconductor channel layer extending in the stacking direction through the stacked body and contacting the second semiconductor layer.

3. The device according to claim 2, wherein the first columnar part has the first width in the first direction inside the third semiconductor layer of the semiconductor part.

4. The device according to claim 2, wherein the first semiconductor layer includes an n-type semiconductor.

5. The device according to claim 1, wherein the semiconductor part includes silicon.

6. The device according to claim 1, wherein the conductive part includes tungsten.

7. The device according to claim 1, wherein the first width is enlarged relative to the second width on both sides in the first direction.

8. The device according to claim 1, wherein the first columnar part includes a semiconductor channel layer with a tubular configuration extending in the stacking direction and a core layer provided inside the semiconductor channel layer with the tubular configuration.

9. The device according to claim 8, wherein the first columnar part further includes an insulating film covering a sidewall of the semiconductor channel layer.

10. The device according to claim 1, wherein the first columnar part has a third width in the first direction inside a lowermost first electrode layer of the first electrode layers, the third width being less than the first width.

11. The device according to claim 10, wherein the first columnar part forms a source-side select transistor at a crossing portion with the lowermost first electrode layer.

12. The device according to claim 1, wherein the semiconductor channel layer has a tubular configuration and a core layer is provided inside the semiconductor channel layer having the tubular configuration.

13. The device according to claim 12, wherein the first columnar part further includes an insulating film covering a sidewall of the semiconductor channel layer.

14. A nonvolatile semiconductor memory device comprising:
    an underlying insulating layer provided above a substrate;
    a source layer provided above the underlying insulating layer, the source layer including a conductive part and a semiconductor part above the conductive part;
    a stacked body provided above the source layer, the stacked body including a plurality of first electrode layers and a plurality of first insulating layers interposed between two of the first electrode layers adjacent in a stacking direction respectively; and
    a first columnar part piercing through the stacked body in the stacking direction, the first columnar part including a semiconductor channel layer which extends in the stacking direction through the stacked body and of which a lower end portion is electrically connected to the source layer, the semiconductor part including a first semiconductor layer, a second semiconductor layer and a third semiconductor layer, the second semiconductor layer contacting the first semiconductor layer and the semiconductor channel layer, the third semiconductor layer contacting the second semiconductor layer, and the first columnar part having a first width in a first direction perpendicular to the stacking direction inside the third semiconductor layer and a second width in the first direction inside a lowermost first insulating layer of the first insulating layers, the first width being larger than the second width.

15. The device according to claim 14, wherein the first semiconductor layer includes an n-type semiconductor.

16. The device according to claim 14, wherein the first semiconductor layer, the second semiconductor layer and the third semiconductor layer include silicon.

17. The device according to claim 14, wherein the conductive part includes tungsten.

18. The device according to claim 14, wherein the first width is enlarged relative to the second width on both sides in the first direction.

19. The device according to claim 14, wherein the first columnar part has a third width in the first direction inside a lowermost first electrode layer of the first electrode layers, the third width being less than the first width.

20. The device according to claim 19, wherein the first columnar part forms a source-side select transistor at a crossing portion with the lowermost first electrode layer.

* * * * *